(12) United States Patent
Yamano et al.

(10) Patent No.: US 9,451,702 B2
(45) Date of Patent: Sep. 20, 2016

(54) CHIP EMBEDDED SUBSTRATE AND METHOD OF PRODUCING THE SAME

(71) Applicant: SHINKO ELECTRIC INDUSTRIES CO., LTD., Nagano-shi, Nagano (JP)

(72) Inventors: Takaharu Yamano, Nagano (JP); Hajime Iizuka, Nagano (JP); Hideaki Sakaguchi, Nagano (JP); Toshio Kobayashi, Nagano (JP); Tadashi Arai, Nagano (JP); Tsuyoshi Kobayashi, Nagano (JP); Tetsuya Koyama, Nagano (JP); Kiyoaki Iida, Nagano (JP); Tomoaki Mashima, Nagano (JP); Koichi Tanaka, Nagano (JP); Yuji Kunimoto, Nagano (JP); Takashi Yanagisawa, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 164 days.

(21) Appl. No.: 14/321,030

(22) Filed: Jul. 1, 2014

(65) Prior Publication Data

US 2014/0313681 A1 Oct. 23, 2014

Related U.S. Application Data

(60) Continuation of application No. 13/167,203, filed on Jun. 23, 2011, now Pat. No. 8,793,868, which is a division of application No. 11/815,580, filed as application No. PCT/JP2006/324764 on Dec. 12, 2006, now Pat. No. 7,989,707.

(30) Foreign Application Priority Data

Dec. 14, 2005 (JP) ................................ 2005-360519
Apr. 21, 2006 (JP) ................................ 2006-117618

(51) Int. Cl.
*H05K 1/18* (2006.01)
*H01L 21/683* (2006.01)
(Continued)

(52) U.S. Cl.
CPC ........... *H05K 1/185* (2013.01); *H01L 21/6835* (2013.01); *H01L 23/552* (2013.01);
(Continued)

(58) Field of Classification Search
USPC .......................... 361/816, 818; 174/377, 260
See application file for complete search history.

(56) References Cited

U.S. PATENT DOCUMENTS 6,188,127 B1 2/2001 Senba et al.
6,506,681 B2 1/2003 Grigg et al.
(Continued)

FOREIGN PATENT DOCUMENTS

JP 10-178271 A 6/1998
JP 11-145183 A 5/1999
(Continued)

OTHER PUBLICATIONS

USPTO NFOA dated Dec. 20, 2012 in connection with U.S. Appl. No. 13/167,203.
(Continued)

*Primary Examiner* — Andargie M Aychillhum
(74) *Attorney, Agent, or Firm* — Ladas & Parry LLP

(57) ABSTRACT

An electronic part embedded substrate is disclosed. The electronic part embedded substrate includes a first substrate, a second substrate, an electronic part, an electrically connecting member, and a sealing member. A method of producing an electronic part embedded substrate is also disclosed. The method includes mounting an electronic part onto a first substrate, laminating a second substrate on the first substrate through an electrically connecting member; and filling a space between the first substrate and the second substrate with a sealing member to seal the electronic part.

19 Claims, 81 Drawing Sheets

(51) Int. Cl.

| | | |
|---|---|---|
| *H01L 23/552* | (2006.01) | |
| *H01L 23/00* | (2006.01) | |
| *H01L 25/10* | (2006.01) | |
| *H01L 25/16* | (2006.01) | |
| *H01L 21/56* | (2006.01) | |
| *H01L 23/31* | (2006.01) | |
| *H01L 23/498* | (2006.01) | |
| *H01L 23/538* | (2006.01) | |
| *H05K 3/20* | (2006.01) | |
| *H05K 3/46* | (2006.01) | |

(52) U.S. Cl.
CPC .............. *H01L 24/81* (2013.01); *H01L 24/83* (2013.01); *H01L 24/97* (2013.01); *H01L 25/105* (2013.01); *H01L 25/16* (2013.01); *H01L 25/162* (2013.01); *H05K 1/186* (2013.01); *H01L 21/56* (2013.01); *H01L 21/563* (2013.01); *H01L 21/565* (2013.01); *H01L 23/3121* (2013.01); *H01L 23/3128* (2013.01); *H01L 23/49822* (2013.01); *H01L 23/49833* (2013.01); *H01L 23/5389* (2013.01); *H01L 24/48* (2013.01); *H01L 24/73* (2013.01); *H01L 24/85* (2013.01); *H01L 2221/68345* (2013.01); *H01L 2224/1134* (2013.01); *H01L 2224/13144* (2013.01); *H01L 2224/16145* (2013.01); *H01L 2224/16225* (2013.01); *H01L 2224/16237* (2013.01); *H01L 2224/32145* (2013.01); *H01L 2224/32225* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/81005* (2013.01); *H01L 2224/81193* (2013.01); *H01L 2224/81801* (2013.01); *H01L 2224/83101* (2013.01); *H01L 2224/83102* (2013.01); *H01L 2224/83192* (2013.01); *H01L 2224/85* (2013.01); *H01L 2224/92125* (2013.01); *H01L 2224/97* (2013.01); *H01L 2225/0651* (2013.01); *H01L 2225/06568* (2013.01); *H01L 2225/1023* (2013.01); *H01L 2225/1041* (2013.01); *H01L 2225/1058* (2013.01); *H01L 2924/01002* (2013.01); *H01L 2924/01004* (2013.01); *H01L 2924/014* (2013.01); *H01L 2924/01005* (2013.01); *H01L 2924/01006* (2013.01); *H01L 2924/01015* (2013.01); *H01L 2924/01019* (2013.01); *H01L 2924/01027* (2013.01); *H01L 2924/01029* (2013.01); *H01L 2924/01033* (2013.01); *H01L 2924/01075* (2013.01); *H01L 2924/01078* (2013.01); *H01L 2924/01079* (2013.01); *H01L 2924/01082* (2013.01); *H01L 2924/01087* (2013.01); *H01L 2924/07811* (2013.01); *H01L 2924/12042* (2013.01); *H01L 2924/1532* (2013.01); *H01L 2924/15192* (2013.01); *H01L 2924/15311* (2013.01); *H01L 2924/15331* (2013.01); *H01L 2924/181* (2013.01); *H01L 2924/19041* (2013.01); *H01L 2924/19042* (2013.01); *H01L 2924/19043* (2013.01); *H01L 2924/19104* (2013.01); *H01L 2924/19105* (2013.01); *H01L 2924/3025* (2013.01); *H01L 2924/3511* (2013.01); *H05K 3/20* (2013.01); *H05K 3/462* (2013.01); *H05K 3/4614* (2013.01); *H05K 3/4644* (2013.01); *H05K 2201/10007* (2013.01); *H05K 2201/10378* (2013.01); *H05K 2201/10674* (2013.01); *H05K 2201/10977* (2013.01); *Y10T 29/4913* (2015.01); *Y10T 29/49144* (2015.01); *Y10T 29/49146* (2015.01)

(56) References Cited

U.S. PATENT DOCUMENTS

| | | | |
|---|---|---|---|
| 6,987,314 | B1 | 1/2006 | Yoshida et al. |
| 7,049,528 | B2 | 5/2006 | Kariya et al. |
| 7,141,873 | B2 | 11/2006 | Aoyagi |
| 2001/0020546 | A1 | 9/2001 | Eldridge et al. |
| 2001/0026864 | A1 | 10/2001 | Mori et al. |
| 2002/0017721 | A1 | 2/2002 | Huang |
| 2002/0152610 | A1 | 10/2002 | Nishiyama et al. |
| 2002/0186342 | A1* | 12/2002 | Ozawa ............... G02F 1/133555 349/179 |
| 2003/0122240 | A1 | 7/2003 | Lin et al. |
| 2004/0075164 | A1 | 4/2004 | Pu et al. |
| 2004/0160752 | A1 | 8/2004 | Yamashita et al. |
| 2004/0178508 | A1 | 9/2004 | Nishimura et al. |
| 2004/0196682 | A1 | 10/2004 | Funaba et al. |
| 2004/0238857 | A1 | 12/2004 | Beroz et al. |
| 2005/0006745 | A1 | 1/2005 | Nishimura |
| 2005/0085034 | A1* | 4/2005 | Akiba ................... H01L 21/565 438/232 |
| 2005/0098885 | A1 | 5/2005 | Aoyagi |
| 2005/0247665 | A1* | 11/2005 | Oi ....................... H01L 21/4857 216/13 |
| 2006/0071330 | A1 | 4/2006 | Suminoe et al. |
| 2006/0125077 | A1 | 6/2006 | Akaike et al. |
| 2006/0151206 | A1 | 7/2006 | Maruyama et al. |

FOREIGN PATENT DOCUMENTS

| | | |
|---|---|---|
| JP | 11-345815 A | 12/1999 |
| JP | 2000-286380 A | 10/2000 |
| JP | 2001-007472 A | 1/2001 |
| JP | 2001-223231 A | 8/2001 |
| JP | 2001-267343 A | 9/2001 |
| JP | 2001-267490 A | 9/2001 |
| JP | 2003-209366 A | 7/2003 |
| JP | 2003-303913 A | 10/2003 |
| JP | 2003-347722 A | 12/2003 |
| JP | 2004-071858 A | 3/2004 |
| JP | 2004-128356 A | 4/2004 |
| JP | 2004-153023 A | 5/2004 |
| JP | 2004-274035 A | 9/2004 |
| JP | 2005-116932 A | 4/2005 |
| JP | 2005-150443 A | 6/2005 |
| JP | 2005-340469 A | 12/2005 |
| JP | 2006-312280 A | 11/2006 |
| WO | 97/01866 A1 | 1/1997 |
| WO | 2006052616 A1 | 5/2006 |
| WO | 2007/069606 A1 | 6/2007 |

OTHER PUBLICATIONS

USPTO RR mailed Aug. 17, 2010 in connection with U.S. Appl. No. 11/815,580.
USPTO RR mailed Sep. 29, 2010 in connection with U.S. Appl. No. 11/815,580.
USPTO NFOA mailed Nov. 24, 2010 in connection with U.S. Appl. No. 11/815,580.
USPTO NOA mailed Apr. 11, 2011 in connection with U.S. Appl. No. 11/815,580.
USPTO NOA mailed May 11, 2011 in connection with U.S. Appl. No. 11/815,580.
USPTO NOA mailed Jun. 7, 2011 in connection with U.S. Appl. No. 11/815,580.
Supplementary European Search Report dated Jul. 20, 2010; EP 06 83 4519.
Partial European Search Report dated May 3, 2011 Appln. No. 10193431.3-220-3/2290682.
USPTO FOA dated Jul. 18, 2013 in connection with U.S. Appl. No. 13/167,203.
USPTO NOA mailed Mar. 21, 2014 in connection with U.S. Appl. No. 13/167,203.

* cited by examiner

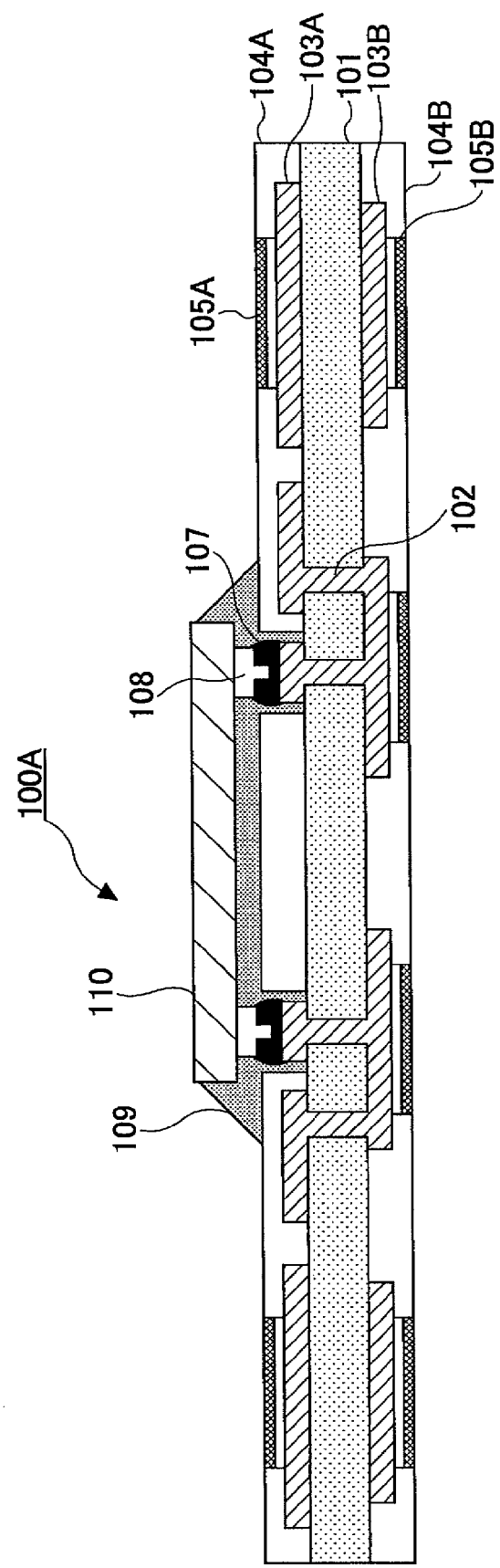

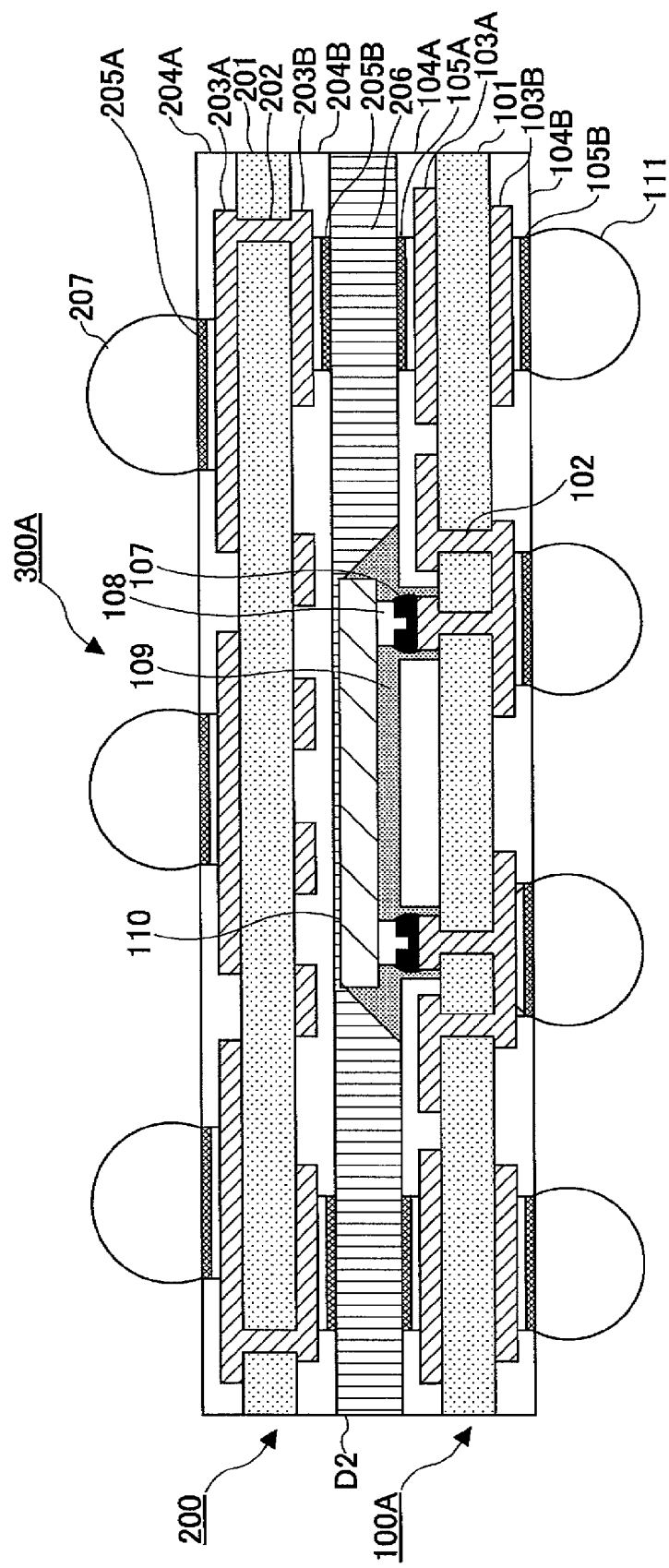

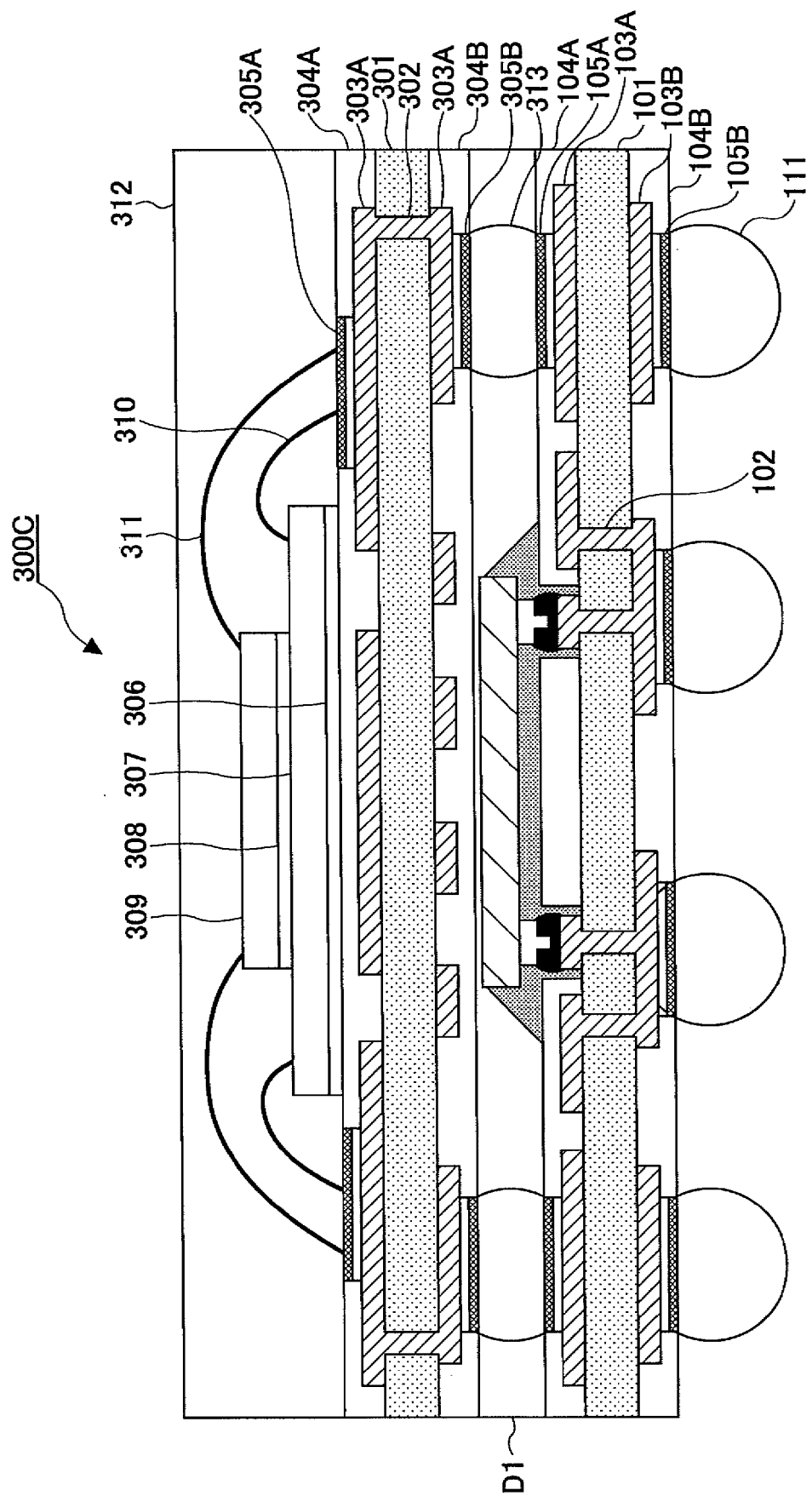

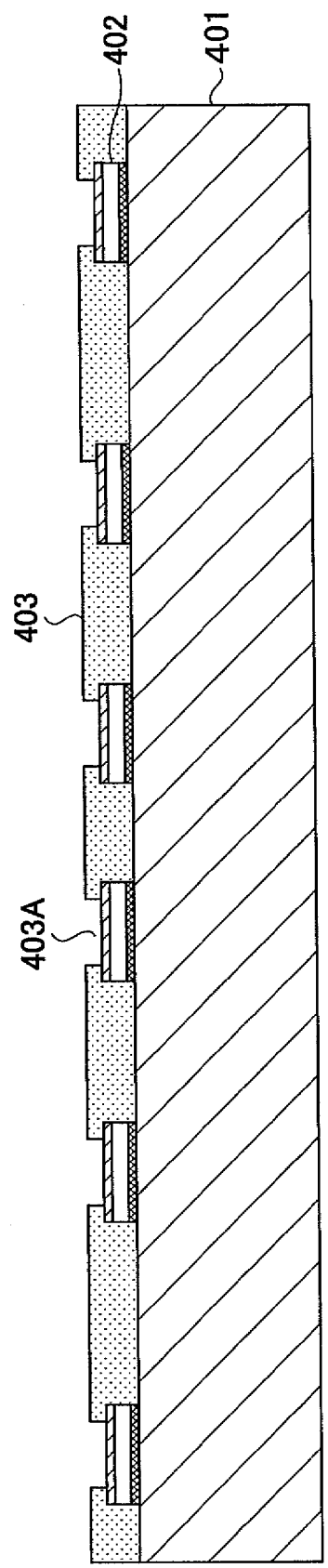

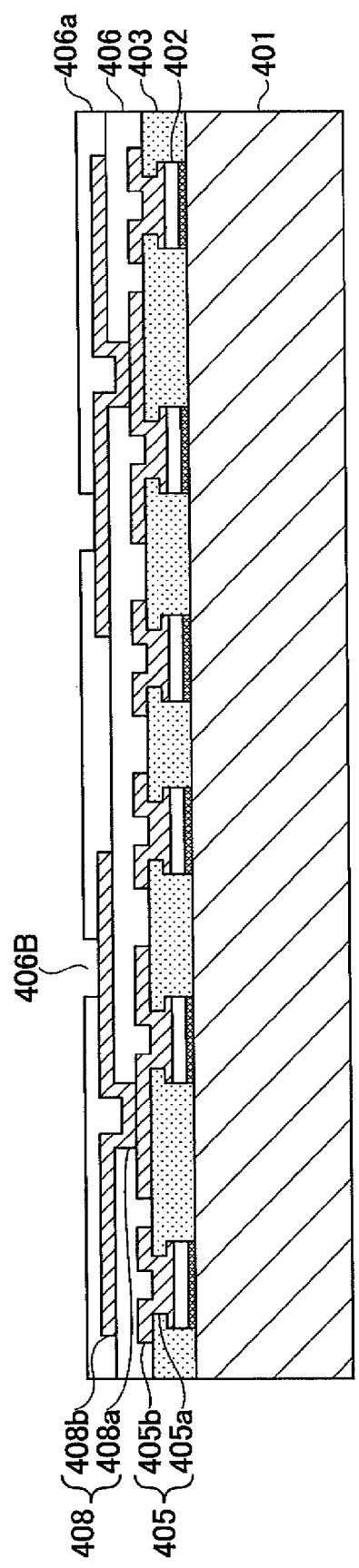

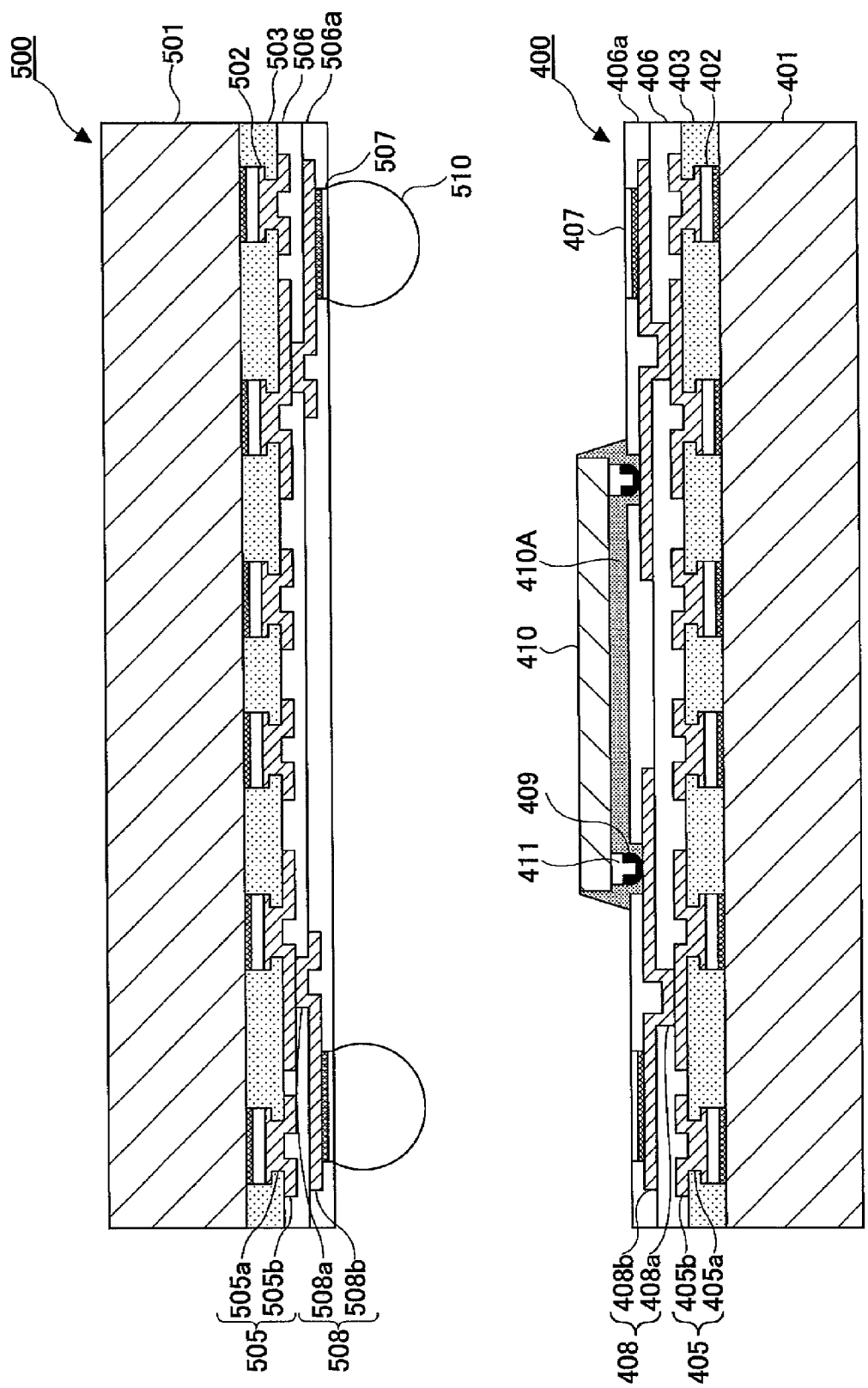

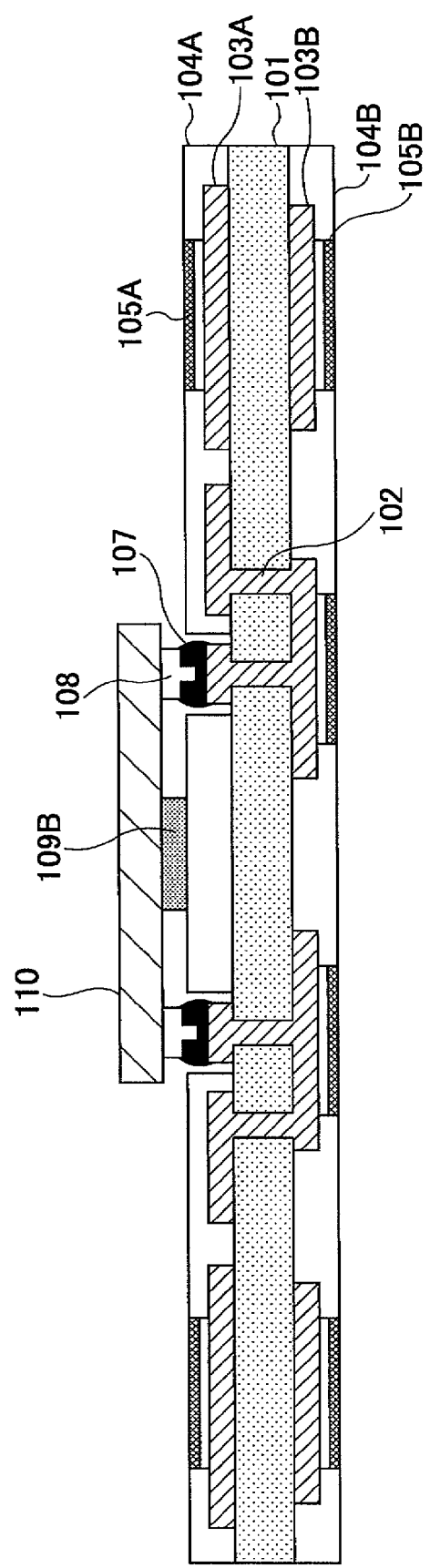

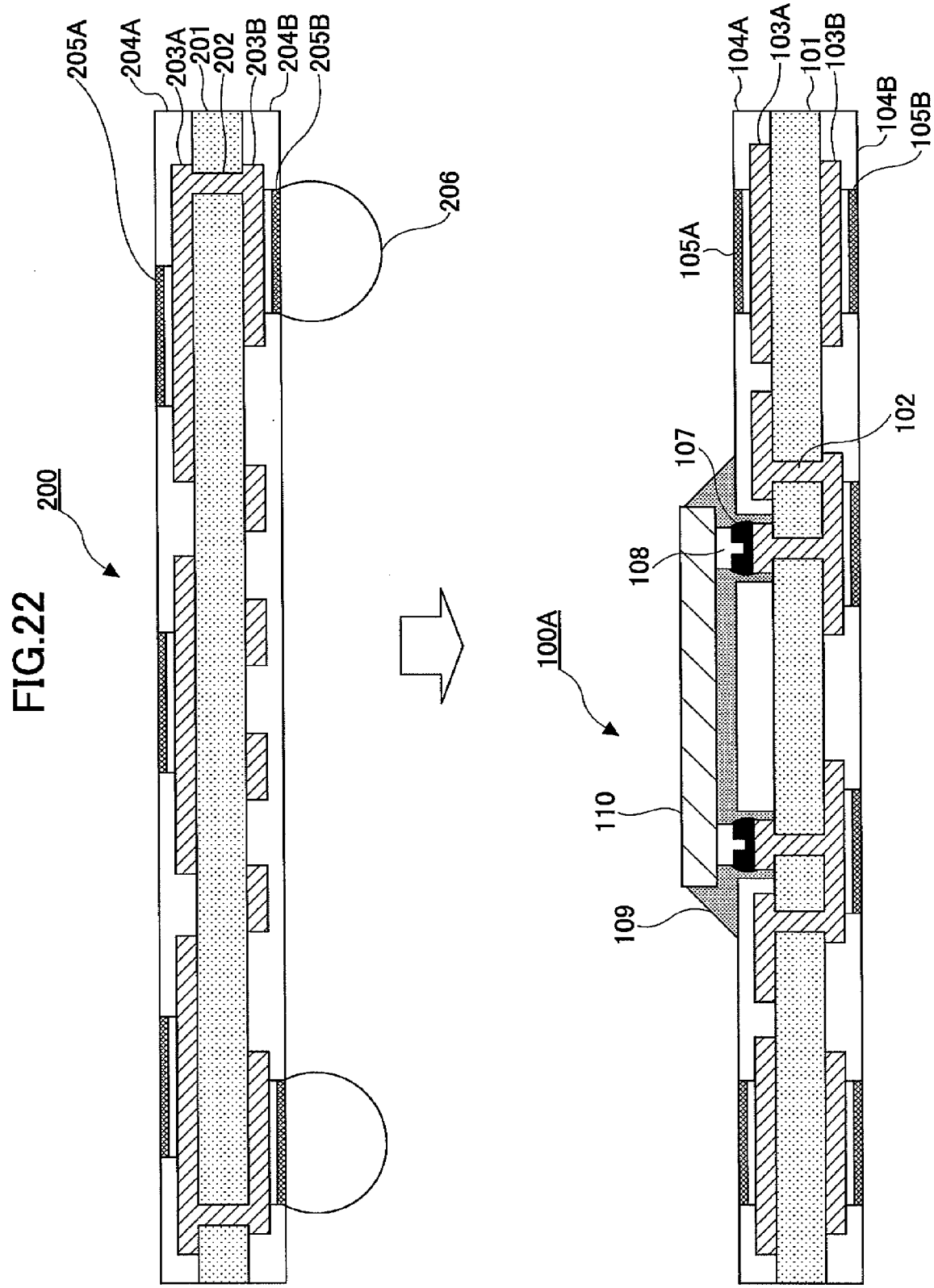

FIG.23
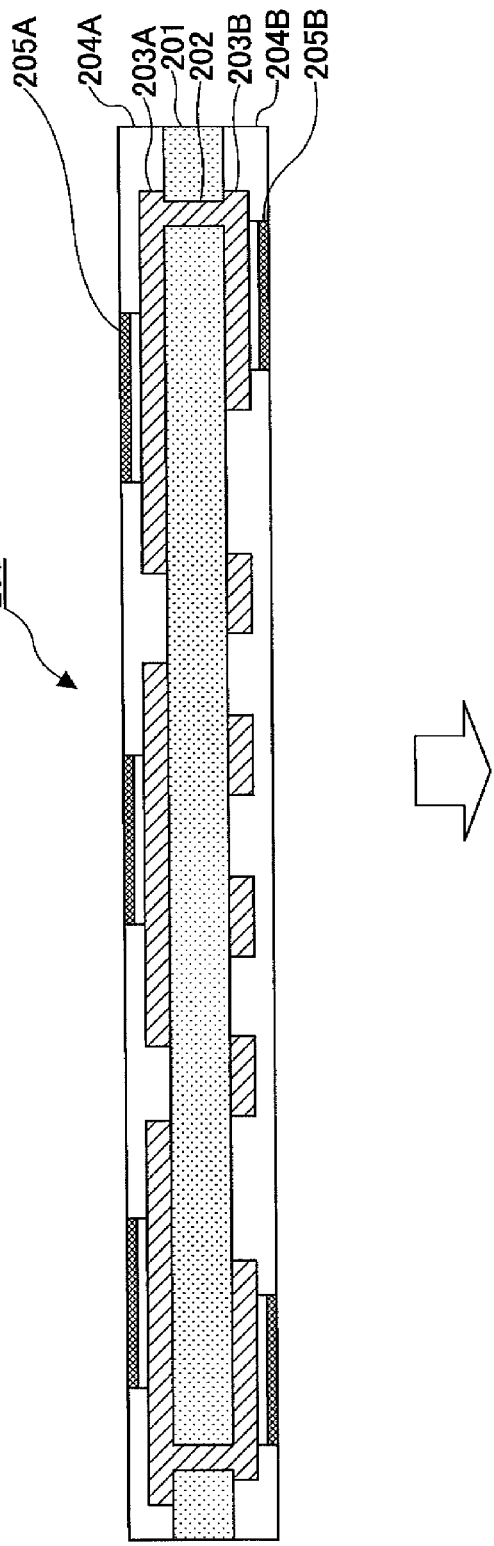
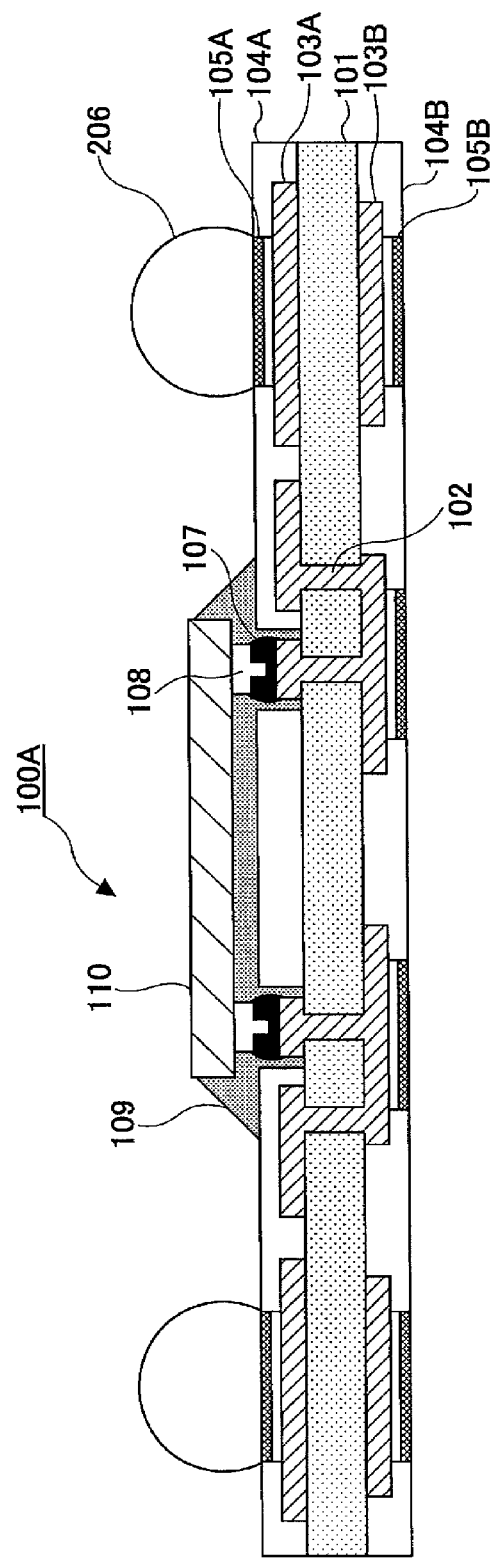

FIG.25
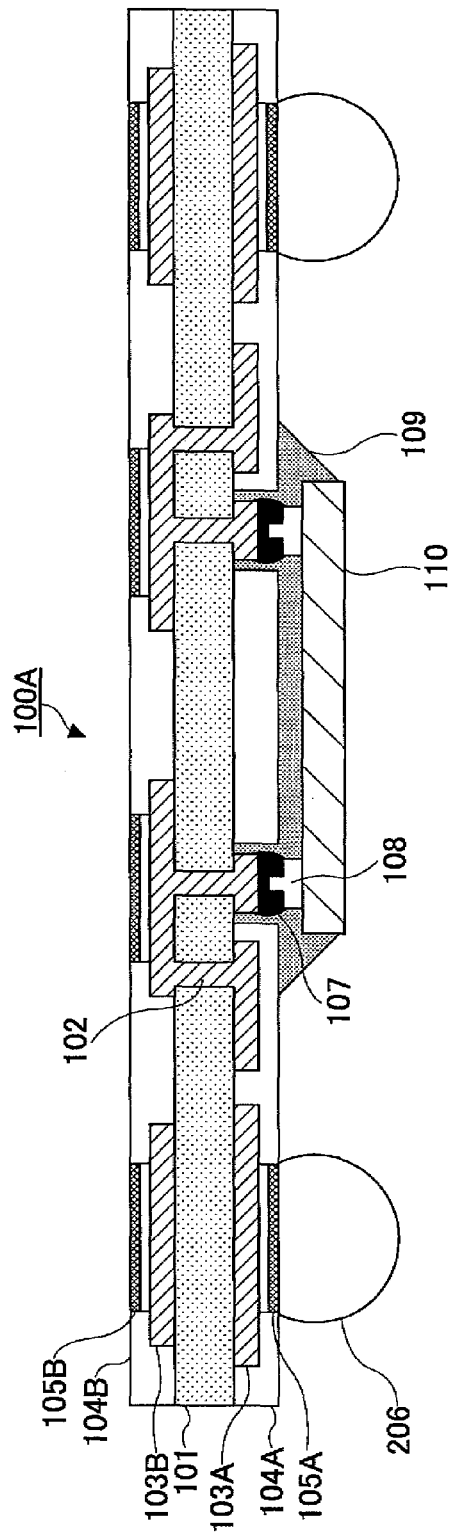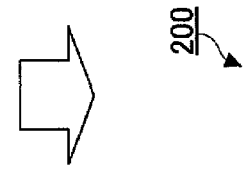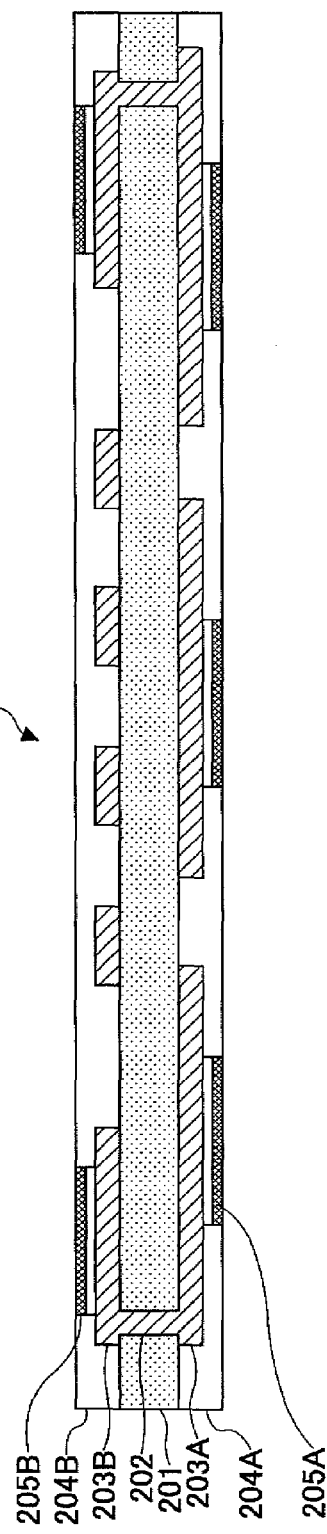

US 9,451,702 B2

CHIP EMBEDDED SUBSTRATE AND METHOD OF PRODUCING THE SAME

CROSS-REFERENCE TO RELATED APPLICATIONS

This application is a continuation application of and is claiming benefit of priority under 35 U.S.C. 120 to the patent application Ser. No. 13/167,203 filed on Jun. 23, 2011, which is divisional application of the patent application Ser. No. 11/815,580, filed on Aug. 6, 2007, which has effectively entered under 35 U.S.C. 371 (c) the national stage from the PCT Application PCT/JP2006/324764, which claims the benefit of priorities of Japanese Patent Application No. 2005-360519 filed on Dec. 14, 2005 and Japanese Patent Application No. 2006-117618 filed on Apr. 21, 2006, where the entire contents of all applications which are incorporated herein by reference.

TECHNICAL FIELD

The present invention relates to a chip embedded substrate having a semiconductor chip embedded.

BACKGROUND ART

Currently, electronic appliances using semiconductor devices, such as semiconductor chips, are highly sophisticated. In addition, high density mounting of the semiconductor chips onto a substrate, downsizing of the substrate on which the semiconductor chips are mounted, and a smaller footprint of the substrate are being required.

In view of the above, a substrate in which the semiconductor chips are embedded, or a so-called chip embedded substrate, and various configurations for embedding the semiconductor chips in the substrate have been proposed. Additionally, along with progress in miniaturization of electric lines of the semiconductor chips, the wiring of the chip embedded substrate is also required to be miniaturized and multilayered.

However, as the wiring structure of the chip embedded substrate becomes miniaturized and multilayered, it takes a longer time to produce the chip embedded substrate, which may bring about a disadvantage of lower production efficiency. In addition, the miniaturized and multilayered wiring structure may cause lower production yields. Especially, since expensive semiconductor chips are embedded in the chip embedded substrate, lower production yields of the chip embedded substrates may lead to a waste of many, expensive semiconductor chips.

Patent-related document 1 (Japanese Patent Application Laid-Open Publication No. 2003-347722) discloses a method of stacking substrates on which semiconductor chips are mounted. However, the invention disclosed by this document merely relates to a method of stacking substrates. The document does not disclose or suggest any measures to address the lower production yields caused when the wiring structure of the chip embedded substrate is miniaturized and multilayered.

[Patent-related document 1] Japanese Patent Application Laid-Open Publication No, 2003-347722

DISCLOSURE OF INVENTION

Problem to be Solved by the Invention

The present invention has been made to solve the above problems by providing a novel, useful chip embedded substrate and a method of producing the same.

Specifically, the present invention is to provide a chip embedded substrate that enables high production yields and high reliability in electrical connection of the semiconductor chips to the multilayered wirings, and a method of producing the same.

Means for Solving the Problem

According to a first aspect of the present invention, the above problem is solved by a method of producing a chip embedded substrate that comprises a first step of mounting a semiconductor chip on a first substrate on which a first wiring is formed; and a second step of joining the first substrate with a second substrate on which a second wiring is formed. In the second step, the semiconductor chip is encapsulated between the first substrate and the second substrate; and electrical connection is made between the first wiring and the second wiring so as to form multilayered wirings connected to the semiconductor chip.

According to a second aspect of the present invention, the above problem is solved by a chip embedded substrate that comprises a first substrate on which a first wiring is formed and a semiconductor chip is mounted so as to be connected to the first wiring; and a second substrate on which a second wiring is formed, the second substrate being joined with the first substrate. In this chip embedded substrate, the semiconductor chip is encapsulated between the first substrate and the second substrate; and an encapsulating connection layer that connects the first wiring and the second wiring is formed between the first substrate and the second substrate so as to form multilayered wirings connected to the semiconductor chip.

Advantage of the Invention

According to the present invention, a chip embedded substrate that enables high production yields and high reliability in electrical connection of the semiconductor chips to the multilayered wirings, and a production method of producing the same can be provided.

BRIEF DESCRIPTION OF DRAWINGS

FIG. 1C illustrates another process step of the production method of the chip embedded substrate according to the first example of the present invention;

FIG. 2B illustrates anther process step of the production method of the chip embedded substrate according to the second example of the present invention;

FIG. 4C illustrates another process step of the production method of the chip embedded substrate according to the fourth example;

FIG. 5C illustrates another process step of the production method of the chip embedded substrate according to the fifth example;

FIG. 5J illustrates another process step of the production method of the chip embedded substrate according to the fifth example;

FIG. 5O illustrates another process step of the production method of the chip embedded substrate according to the fifth example;

FIG. 6A illustrates one process step of a production method of a chip embedded substrate according to a sixth example of the present invention;

FIG. 21B illustrates another process step of the production method of the chip embedded substrate according to the eighteenth example;

FIG. 22 illustrates one process step of a wiring substrate joining method;

FIG. 23 illustrates another process step of the wiring substrate joining method;

FIG. 25 illustrates another process step of the wiring substrate joining method;

Figure 1A:
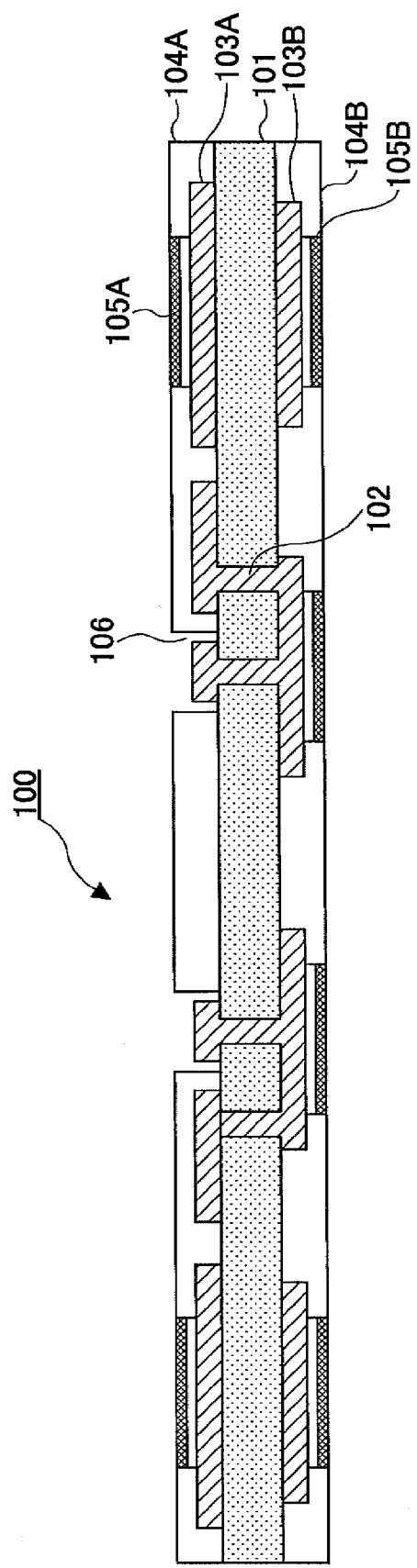
FIG. 1A illustrates one process step of a production method of a chip embedded substrate according to a first example of the present invention.

LIST OF REFERENCE SYMBOLS 100, 100A, 200, 400, 500, 800, 900: substrate
300, 300A, 300B, 300C, 300D, 300E, 300F, 300G, 300H, 300I, 300J, 300K, 300L, 300M, 300N: chip embedded substrate
101, 201, 301: core substrate
102, 202, 302: via plug
103A, 103B, 203A, 203B, 303A, 303B: patterned wiring
104A, 104B, 204A, 204B, 304A, 304B: solder resist layer;
105A, 105B, 205A, 205B, 305A, 305B: connection layer;
106: opening
107, 407, 409, 507, 509: bump
108, 411, 511: underfill
110, 307, 309, 410, 510: semiconductor chip
111, 206, 207, 313, 413, 510: solder ball
401, 501: supporting substrate
402, 502: connection layer
403, 503: insulation layer
405, 408, 505, 508: wiring portion
405$a$, 408$a$, 505$a$, 508$a$: via plug
405$b$, 408$b$, 505$b$, 508$b$: patterned wiring
412, 512: solder resist layer
SP1, SP2: spacer
PS1, PS2, PS3, PS4: post
AD1, AD2, AD3: connection layer
BP1, BP2, BP3: bump

BEST MODE FOR CARRYING OUT THE INVENTION

A production method of producing a chip embedded substrate according to an embodiment of the present invention includes a first process of mounting a semiconductor chip in a first substrate on which a first wiring is formed, and a second process of joining a second substrate on which a second wiring is formed and the first substrate. In the second process, the semiconductor chip is encapsulated between the first substrate and the second substrate and the first wiring and the second wiring are electrically connected to each other, thereby forming multilayered wirings connected to the semiconductor chip.

In a conventional chip embedded substrate, since semiconductor chips are connected and a multilayered wiring structure having a semiconductor chip embedded is formed, for example, by a build-up method, when the number of wiring layers are increased or the wiring is miniaturized, disadvantages of lower reliability in electrical connection and lower production yields are caused. This may lead to an inevitable waste of many substrates having expensive semiconductor chips embedded.

On the other hand, in the production method of producing the chip embedded substrate according to the present invention, the multilayered wiring structure to which the semiconductor chip is connected is formed by joining (or stacking) plural substrates on which the wiring is formed. In this case, the first wiring and the second wiring form the multilayered wiring structure. Therefore, the multilayered wiring structure, even if miniaturized, becomes more reliable and the production yields are improved.

An electronic part embedded substrate according to another embodiment of the present invention comprises a first substrate; a second substrate provided on the first substrate; an electronic part provided between the first substrate and the second substrate; an electrically connecting member configured to electrically connect the first substrate to the second substrate; and a sealing member configured to fill a space between the first substrate and the second substrate to seal the electronic part, wherein the second substrate includes an outermost insulation layer that forms a front surface of the electronic part embedded substrate and an outer connection part embedded in the outermost insulation layer, a front surface of the outer connection part is exposed from a front surface of the outermost insulation layer, a side surface and a back surface of the outer connection part are covered by the outermost insulation layer, a via hole is provided on the back surface of the outer connection part so as to expose the back surface of the outer connection part on the back surface of the outermost insulation layer, a wiring portion is provided on the back surface of the outer connection part so that the wiring portion is connected with the back surface of the outer connection part through the via hole, and the wiring portion is connected with another wiring portion included in the first substrate through the electrically connecting member.

In another embodiment of the present invention, the electrically connecting member includes a conductive post.

In another embodiment of the present invention, the electrically connecting member further includes a solder.

In another embodiment of the present invention, the electrically connecting member includes a solder ball.

In another embodiment of the present invention, the electrically connecting member includes a solder ball, which houses a spacer.

In another embodiment of the present invention, the electrically connecting member includes a bump, which is formed of a bonding wire.

In another embodiment of the present invention, the sealing member is made of an anisotropic conductive material and the electrically connecting member is made of the same anisotropic conductive material.

In another embodiment of the present invention, another insulation layer and the wiring portion are laminated to form multiple layers on the back surface of the outermost insulation layer of the second substrate.

In another embodiment of the present invention, the first substrate includes another outermost insulation layer that forms a back surface of the electronic part embedded substrate and another outer connection part embedded in the another outermost insulation layer, a back surface of the another outer connection part is exposed from a back surface of the another outermost insulation layer, a side surface and a front surface of the another outer connection part are covered by the another outermost insulation layer, another via hole is provided on the front surface of the another outer connection part so as to expose the front surface of the another outer connection part on the front surface of the another outermost insulation layer, another wiring portion is provided on the front surface of the another outer connection part so that the another wiring portion is connected with the front surface of the another outer connection part through the via hole, and the another wiring portion is connected with the wiring portion included in the second substrate through the electrically connecting member.

In another embodiment of the present invention, another insulation layer and the another wiring portion are laminated to form multiple layers on the front surface of the another outermost insulation layer of the first substrate.

A method of producing an electronic part embedded substrate according to another embodiment of the present invention comprises mounting an electronic part onto a first substrate; laminating a second substrate on the first substrate through an electrically connecting member; and filling a space between the first substrate and the second substrate with a sealing member to seal the electronic part, wherein the second substrate is formed on a supporting member, and the supporting member is removed from the second substrate after the filling the space between the first substrate and the second substrate with a sealing member.

In another embodiment of the present invention, the electrically connecting member includes a conductive post.

In another embodiment of the present invention, the electrically connecting member further includes a solder.

In another embodiment of the present invention, the electrically connecting member includes a solder ball.

In another embodiment of the present invention, the electrically connecting member includes a solder ball, which houses a spacer.

In another embodiment of the present invention, the electrically connecting member includes a bump, which is formed of a bonding wire.

In another embodiment of the present invention, the sealing member is made of an anisotropic conductive material and the electrically connecting member is made of the same anisotropic conductive material.

In another embodiment of the present invention, the second substrate is formed by laminating an insulation layer and a wiring portion to form multiple layers on the supporting member.

In another embodiment of the present invention, the first substrate is formed on another supporting member, and the another supporting member is removed from the first substrate after the filling the space between the first substrate and the second substrate with the sealing member.

In another embodiment of the present invention, the first substrate is formed by laminating an insulation layer and a wiring portion to form multiple layers on the another supporting member.

Referring to the accompanying drawings, the production methods according to specific examples of the present invention will be described.

EXAMPLE 1

FIGS. 1A through 1F illustrate process steps of a production method of a chip embedded substrate according to a first example of the present invention. In the drawings, the same reference marks are given to portions described before and repetition of description may be eliminated.

In a process step shown in FIG. 1A, via plugs 102 formed of, for example, copper are made so as to pass through a core substrate 101 formed of, for example, a prepreg (a material made by impregnating epoxy resin or the like with fibrous glass). In addition, patterned wirings 103A are formed of, for example, copper on a first surface of the core substrate 101, and patterned wirings 103B are formed of, for example, copper on a second surface of the core substrate 101. On the first surface is mounted a semiconductor chip in a later process step.

Some of the patterned wirings 103A and the patterned wirings 103B are connected to each other through the via plugs 102.

On the first surface of the core substrate 101, solder resist layers 104A are formed. On portions of the patterned wirings 103A which are exposed through the solder resist layer 104A, connection layers 105A are formed of, for example, Ni/Au (an Au top layer and a Ni bottom layer formed on the patterned wirings 103A) or the like. By the way, the connection layers 105A are not formed in openings 106 that are used to mount the semiconductor chip in a later process step.

Similarly, a solder resist layer 104B is formed on the second surface of the core substrate 101. On portions of the patterned wirings 103B which are exposed through the solder resist layer 104B, connection layers 105B are formed of, for example, Ni/Au (an Au top layer and a Ni bottom layer formed on the patterned wirings 103B) or the like. Then, a wiring substrate 100 in which the semiconductor chip is mounted is obtained.

Figure 1B:
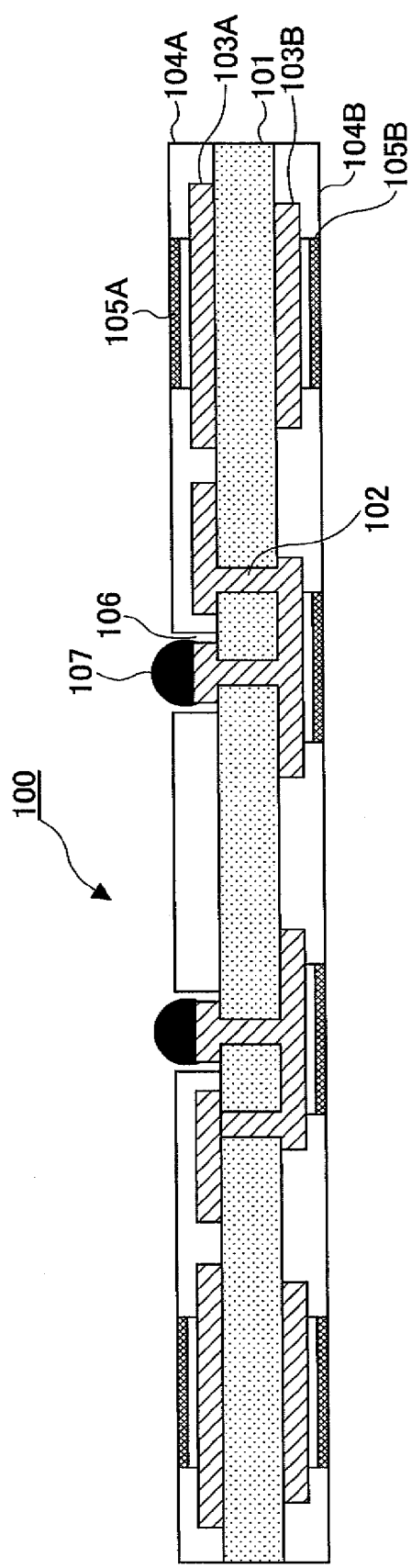
FIG. 1B illustrates another process step of the production method of the chip embedded substrate according to the first example of the present invention.

Next, in a process step shown in FIG. 1B, on portions of the patterned wirings 103A which are exposed through the openings 106, connection layers 107 made of, for example, a solder are formed by an electroplating process.

Next, in a process step shown in FIG. 1C, flip-chip mounting is carried out so that a semiconductor chip 110, in which bumps 108 (for example, bumps formed using a bonding wire made of Au or the like by a wire bonding process) are formed, is connected to the patterned wirings 103A via the connection layers 107. Then, an underfill (an underfilling resin) 109 is supplied between the semiconductor chip 110 and the wiring substrate 100.

In this manner, the wiring substrate 100A composed by mounting the semiconductor chip 110 on the wiring substrate 100 is obtained. By the way, other electronic parts (for example, a capacitor, a resistor, an inductor, or the like) can be mounted, in place of the semiconductor chip, onto the patterned wirings 103A. Additionally, a chip size package (CSP) made by forming a re-wiring on a semiconductor chip may be mounted.

Figure 1D:
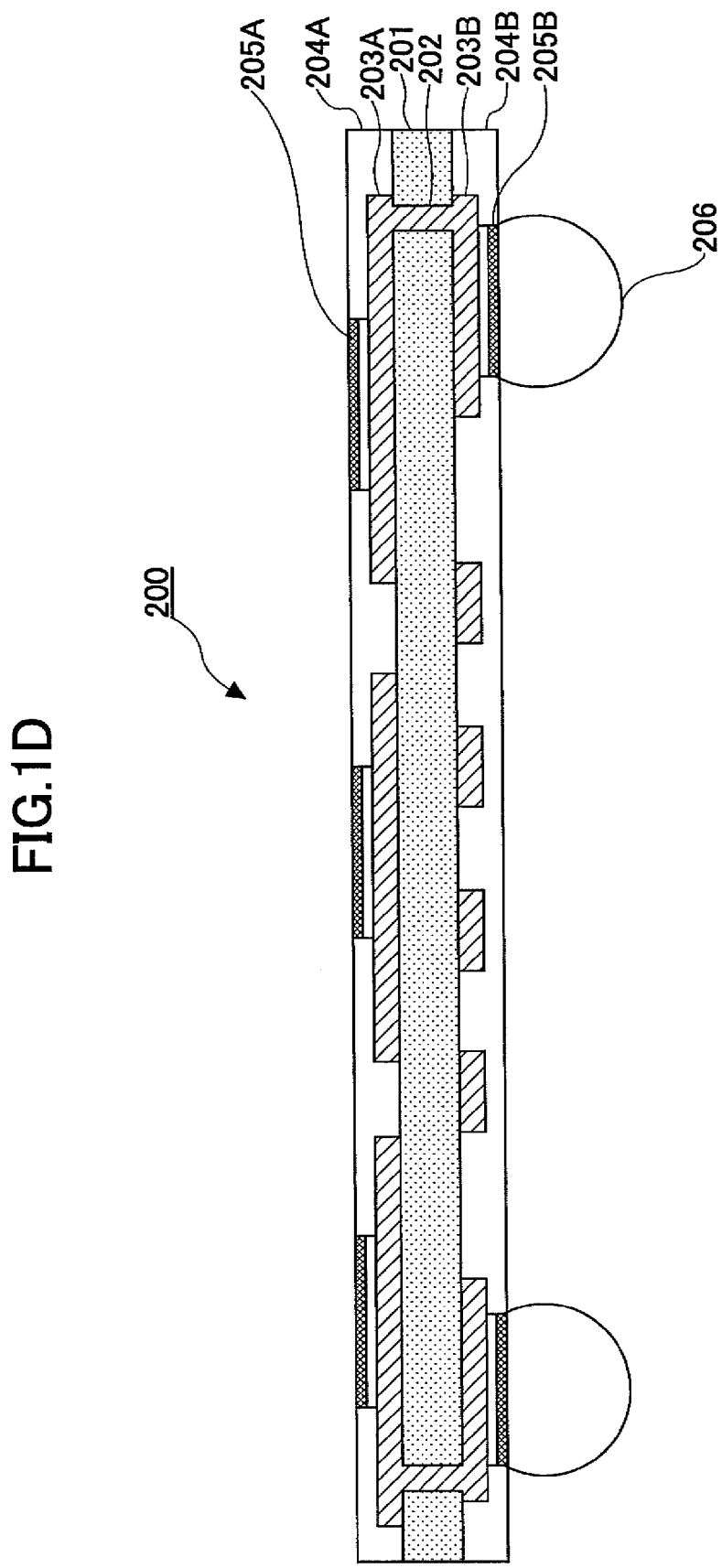
FIG. 1D illustrates another process step of the production method of the chip embedded substrate according to the first example of the present invention.

Next, in a process step shown in FIG. 1D, in the same manner as the wiring substrate 100 is obtained, a wiring substrate 200 that is to be joined (stacked) on the wiring substrate 100A is made. In this case, via plugs 202 formed of, for example, copper are made so as to pass through a core substrate 201. Then, patterned wirings 203A are formed of, for example, copper on a first surface of the core substrate 201 and patterned wirings 203B are formed of, for example, copper on a second surface of the core substrate 201. The second surface of the core substrate 201 is to face the semiconductor chip 110.

Some of the patterned wirings 203A and the patterned wirings 203B are connected to each other through the via plugs 202.

In addition, on the first surface of the core substrate 201, a solder resist layer 204A is formed. On portions of the patterned wirings 203A, the portions being exposed through the solder resist layer 204A, connection layers 205A made of, for example, Ni/Au (an Au top layer and a Ni bottom layer formed on the patterned wirings 203A) or the like are formed. Similarly, on the second surface of the core substrate 201, a solder resist layer 204B is formed. On portions of the patterned wirings 203B, the portions being exposed through the solder resist layer 204B, connection layers 205B made of, for example, Ni/Au (an Au top layer and a Ni bottom layer formed on the patterned wirings 203B) or the like are formed. Moreover, solder balls 206 are formed on the connection layers 205B. Thus, the wiring substrate 200 which is to be joined with the wiring substrate 100A is obtained.

Figure 1E:
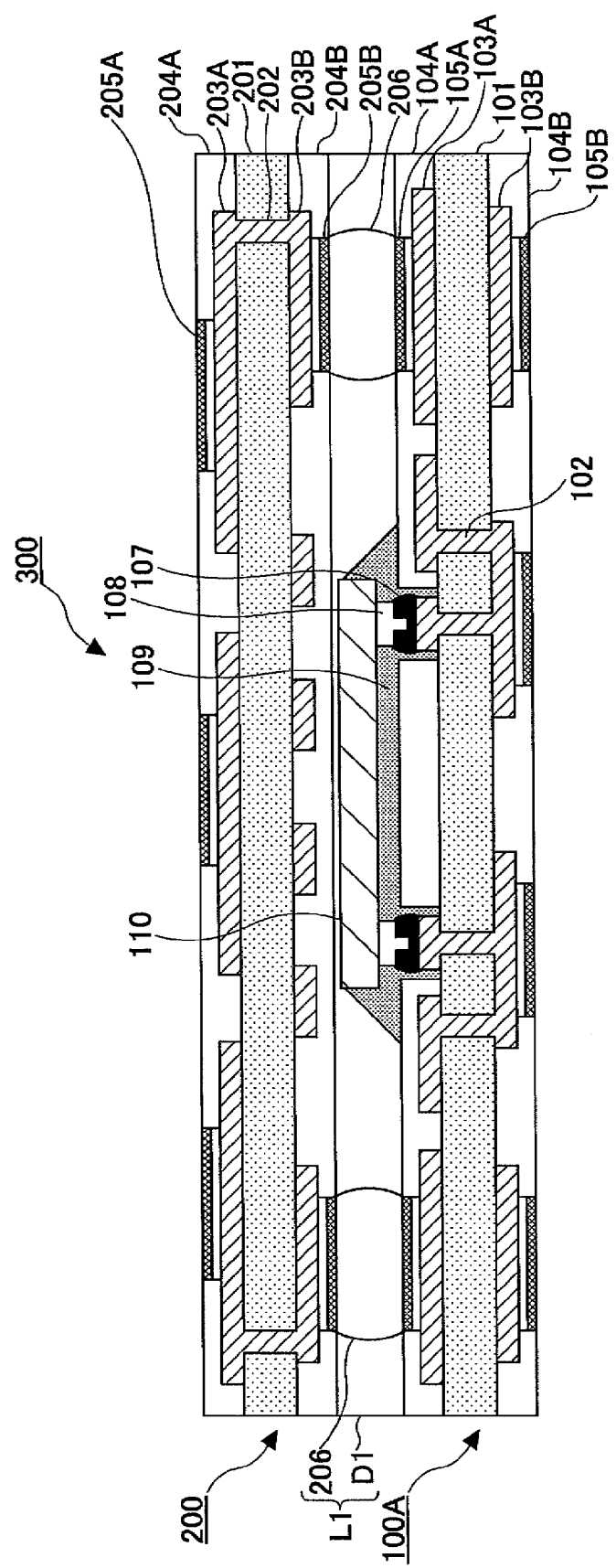
FIG. 1E illustrates another process step of the production method of the chip embedded substrate according to the first example of the present invention.

Next, in a process step shown in FIG. 1E, the wiring substrate 100A and the wiring substrate 200 are joined (stacked).

In this case, between the wiring substrate 200 and the wiring substrate 100A, the semiconductor chip 110 is encapsulated and an encapsulating connection layer L1 for connecting the wirings of the wiring substrate 200 and the wirings of the wiring substrate 100 is formed. The encapsulating connection layer L1 is composed of an insulation layer D1 made of a build-up resin formed of, for example, a laminate, and an electrical connection member (for example, the solder ball 206) formed in the insulation layer D1. In this case, the solder balls 206 connected to the patterned wirings 203B via the connection layers 205B are electrically connected to the patterned wirings 103A through the connection layers 105A.

By the way, when the wiring substrate 200 and the wiring substrate 100A are joined, a first method or a second method in the following can be employed.

First, the first method is carried out as follows: The wiring substrate 200 is stacked and pressed down on the wiring substrate 100A with a thermosetting film of a build-up resin (not hardened at this stage) placed between the substrates 200, 100A. Due to such pressing, the solder balls (electrical connection members) 206 are forced through the thermosetting film of the build-up resin to contact the connection layers 105A of the wiring substrate 100A. Then, heat is applied to the wiring substrates 100A, 200 that are kept being pressed, so that the solder balls 206 are melted to be electrically connected to connection layers 105A. Additionally, the build-up resin is hardened by heat applied thereto and becomes the insulation layer D1.

The second method is carried out as follows: First, the wiring substrate 200 is stacked on the wiring substrate 100A. Then, heat is applied to melt the solder balls (electrical connection members) 206 so as to be connected to the connection layers 105A. Next, liquid resin is supplied between the wiring substrate 100A and the wiring substrate 200 and hardened so as to become the insulation layer D1.

By the way, the wiring substrates can be joined with each other by other methods, for example, a method described later.

Figure 1F:
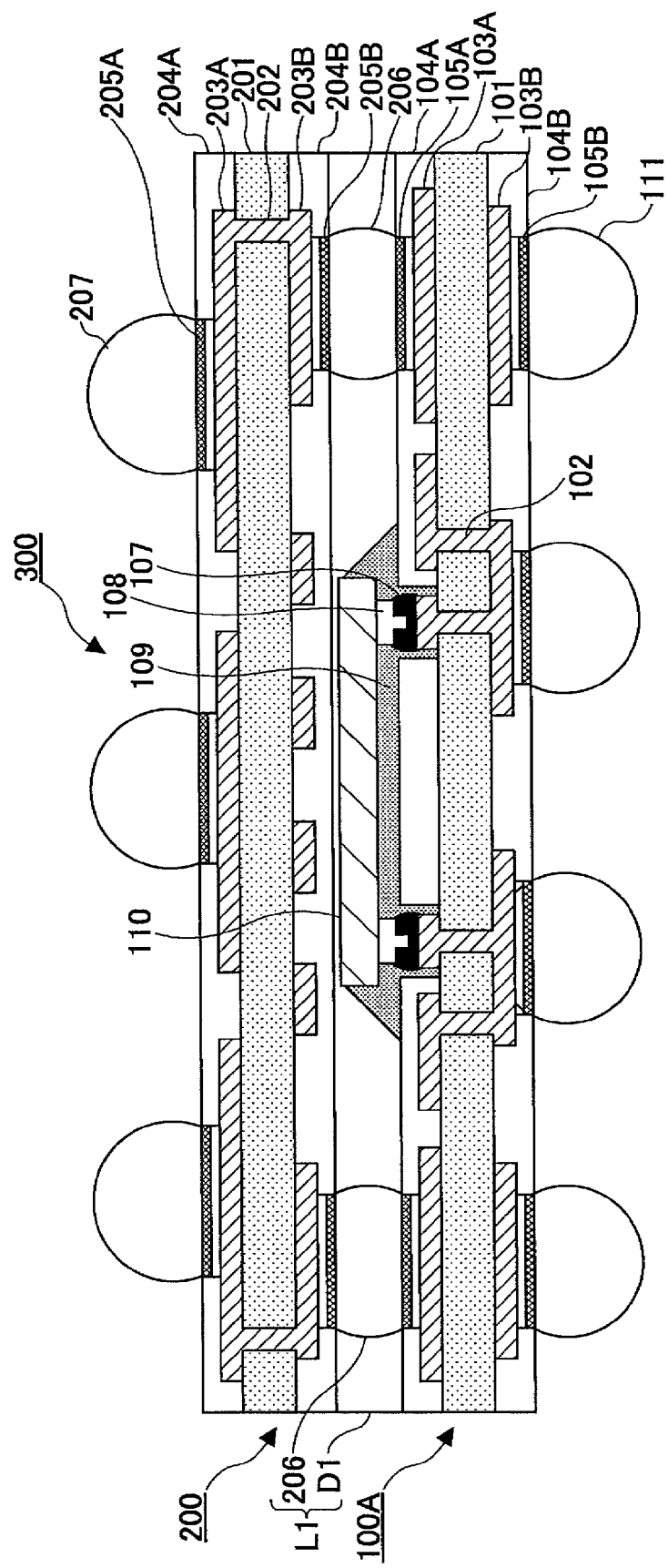
FIG. 1F illustrates another process step of the production method of the chip embedded substrate according to the first example of the present invention.

In a process step shown in FIG. 1F, solder balls (exterior connection terminals) 111, 207 are formed on the connection layers 105B, 205A, respectively. Thus, a chip embedded substrate 300 is obtained.

When the chip embedded substrate 300 according to this example is produced, the multilayered wiring structure connected to the semiconductor chip 110 is formed by joining the plural substrates (the wiring substrates 100A, 200) on which the wirings (the patterned wirings 103A, 103B, 203A, 203B) are formed. Therefore, this production method can provide more reliable chip embedded substrates at improved production yields, when compared with the build-up method. Moreover, since the wiring substrate 100 with the semiconductor chip mounted thereon is prepared separately from the wiring substrate 200, inspection can be carried out for individual substrates, which enables failure detection after the chip is mounted. Therefore, the number of expensive semiconductor chips that are discarded can be reduced.

In addition, since the chip embedded substrate having the multilayered wiring structure is produced by joining the wiring substrates, there is provided an advantage in that plural substrates are individually stocked. Furthermore, design change can be easily made for each of the plural substrates and specification change in the semiconductor chip can be flexibly addressed. Namely, further advantages in production are provided.

Furthermore, the encapsulating connection layer L1 is composed of the insulation layer D1 made of, for example, the build-up resin, and the electrical connection members (electric conductive materials), such as the solder balls 206. The encapsulating connection layer L1 protects and insulates the semiconductor chip 110. In addition, the encapsulating connection layer L1 joins the substrates 100A, 200 together and electrically connects the wiring patterns of the substrate 100A and the substrate 200. Therefore, mechanical strength of the substrates 100A, 200 is ensured and the semiconductor chip 110 is protected and insulated, thereby improving reliability of the multilayered wirings to which the semiconductor chip is connected.

By the way, the encapsulating connection layer L1 is not limited to a combination of the build-up resin and the solder balls but can be configured in various ways, as described below.

EXAMPLE 2

Figure 2A:
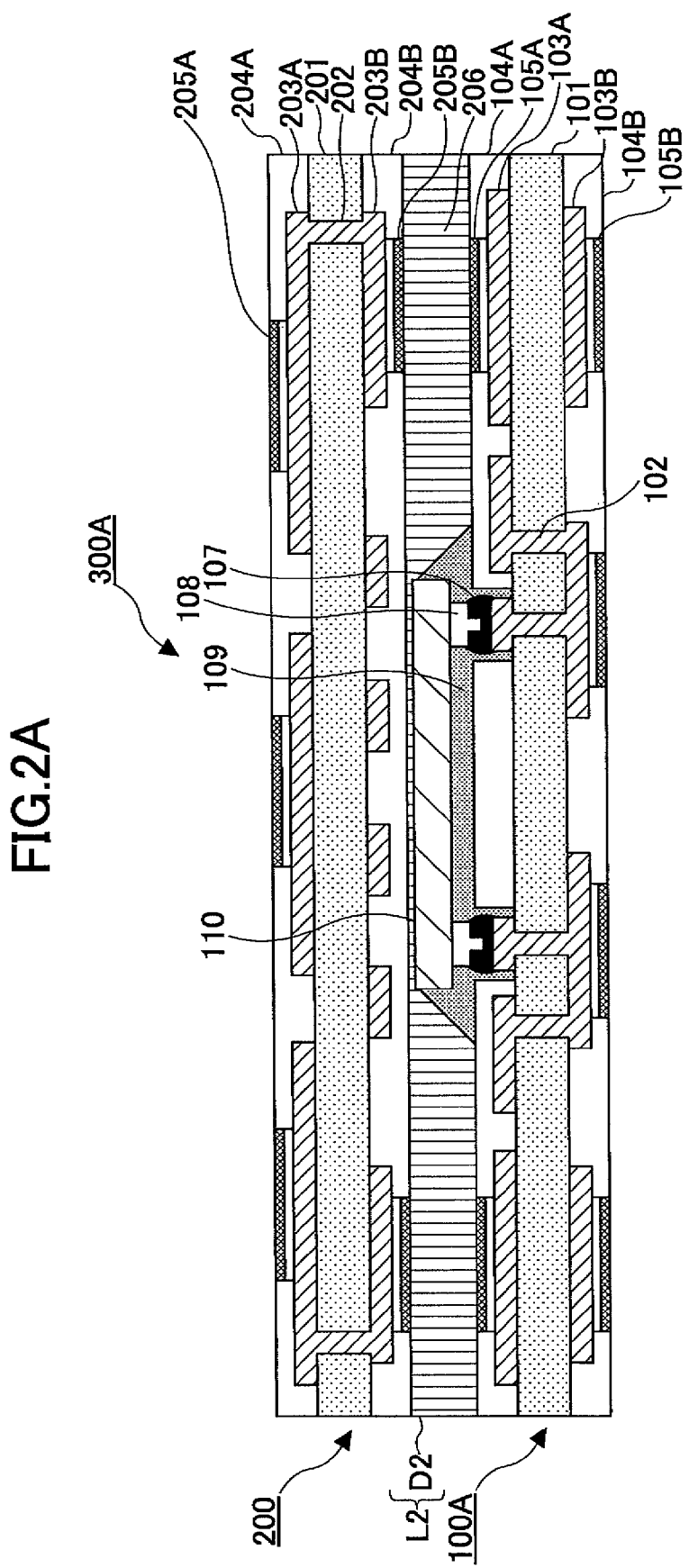
FIG. 2A illustrates one process step of a production method of a chip embedded substrate according to a second example of the present invention.

FIGS. 2A and 2B illustrate process steps of a production method of a chip embedded substrate according to a second example of the present invention.

First, process steps corresponding to the process steps of the first example shown in FIGS. 1A through 1D are carried out before arriving at a process step shown in FIG. 2A. However, in the process step corresponding to the process step shown in FIG. 1D, the solder balls 206 are not formed in the second example. Then, the process step shown in FIG. 2A, which corresponds to the process step shown in FIG. 1E, and the subsequent process steps are carried out.

Referring to FIG. 2A, an encapsulating connection layer L2, which corresponds to the encapsulating connection layer L1, is formed between the wiring substrate 200 and the wiring substrate 100A. The encapsulating connection layer L2 is formed of a connection layer D2 made of, for example, an anisotropic conductive material. As examples of the anisotropic conductive material, there are an anisotropic conductive film (ACF), an anisotropic conductive paste (ACP) and the like. The anisotropic conductive material has functions as an encapsulating material which encapsulates the semiconductor chip and as an electrical connection member which connects the wiring patterns formed on corresponding wiring substrates which are to be joined.

In the above process step, the wiring substrate 200 and the wiring substrate 100A are joined, for example, by a third method or a fourth method described below.

The third method can be carried out as follows. First, the wiring substrate 200 is stacked on and pressed down on the wiring substrate 100A with a thermosetting anisotropic conductive film (not hardened at this stage) placed between the two substrates 100A, 200. Then, heat is applied to the substrates 100A, 200 while the substrates 100A, 200 are pressed against each other, thereby hardening the anisotropic conductive film into the connection layer D2.

The fourth method can be carried out as follows. First, an anisotropic conductive paste is applied onto the wiring substrate 200 or the wiring substrate 100A. Then, the wiring substrate 200 and the wiring substrate 100A are stacked and pressed onto each other. Next, heat is applied to the substrates 200, 100A, thereby hardening the anisotropic conductive paste into the connection layer D2.

By the way, the wiring substrates can be joined with each other by other methods, for example, a method described later.

Next, in a process step shown in FIG. 2B, the solder balls 111, 207 are formed on the connection layers 105B, 205A, respectively, in the same manner as the process step shown in FIG. 1F. Thus, a chip embedded substrate 300A is obtained.

In the above configuration, the encapsulating connection layer L2 serves to protect and insulate the semiconductor chip 110, and join the substrates 100A, 200, thereby ensuring sufficient mechanical strength. In addition, the encapsulating connection layer L2 electrically connects the patterned wirings 203B of the wiring substrate 200 and the patterned wirings 103A of the wiring substrate 100 (the connection layer 205B and the connection layer 105A).

In other words, the chip embedded substrate 300A according to this example can be configured without a solder ball for encapsulation and connection, which facilitates production of the chip embedded substrate 300A. In addition, the chip embedded substrate 300A has an advantage of a simple configuration. By the way, a method of forming the encapsulating connection layer L2 is not limited to the aforementioned method using the anisotropic conductive film. Instead of the anisotropic conductive film, an anisotropic conductive adhesive including an anisotropic conductive paste, an anisotropic conductive ink or the like may be used to form the encapsulating connection layer L2.

As stated above, various materials and structures can be employed for the encapsulating connection layer. For example, the encapsulating connection layer L1 in the first example, which is made of a combination of the insulating layer D1 and the solder balls 206, can have other conductive structures, such as via plugs, instead of the solder balls 206. Even in this case, electrical connection between the two substrates can be reliable and production of the chip embedded substrate can be facilitated.

EXAMPLE 3

Figure 3:
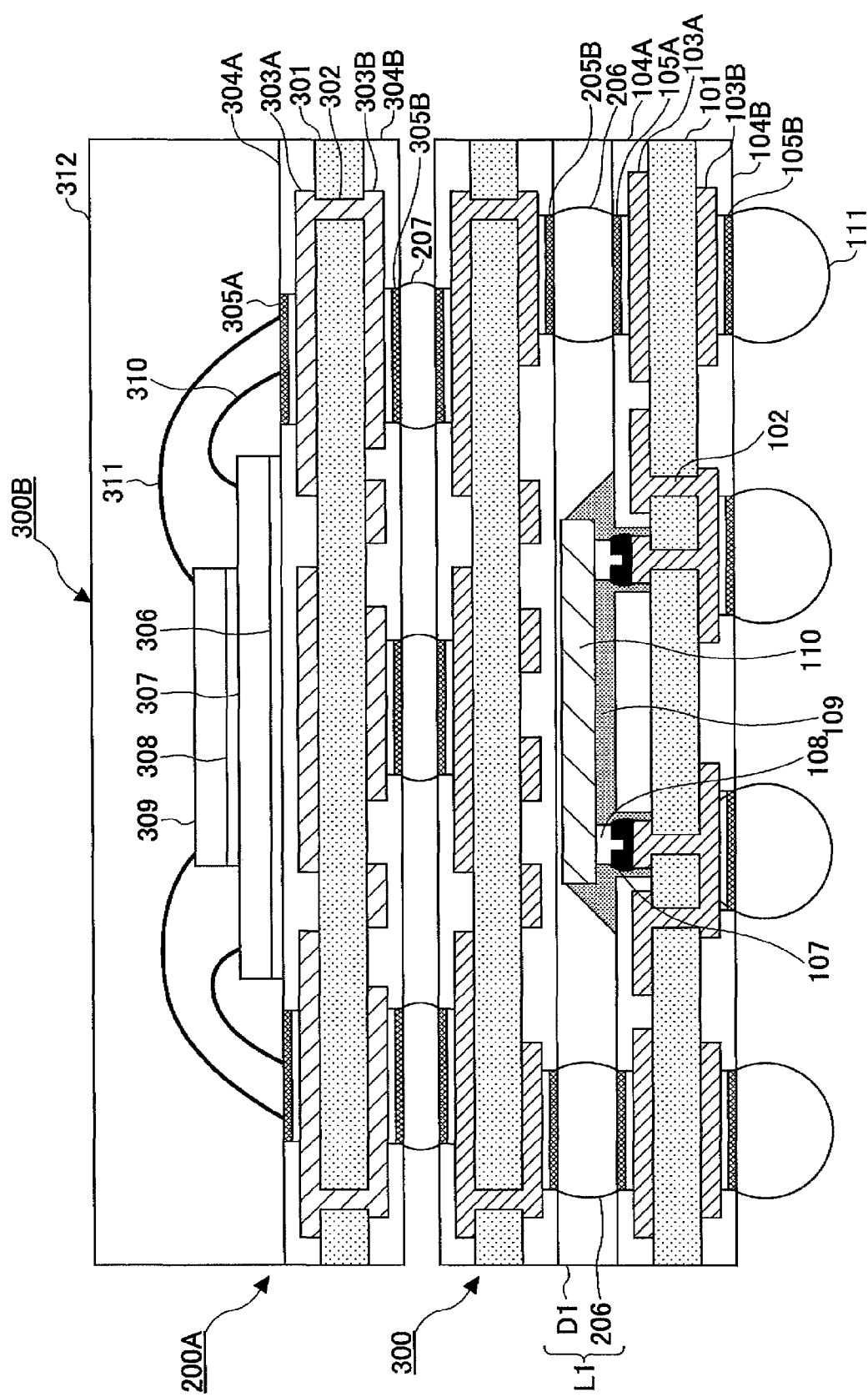
FIG. 3 illustrates a chip embedded substrate according to a third example.

FIG. 3 illustrates an alteration of the chip embedded substrate 300 according to the first example. Referring to FIG. 3, a chip embedded substrate 300B according to the third example is obtained by stacking (joining) a wiring substrate 200A on the chip embedded substrate 300 after the process step shown in FIG. 1F of the first example.

The wiring substrate 200A is formed in the same manner as the wiring substrate 200. In this case, a core substrate 301, via plugs 302, patterned wirings 303A, 303B, solder resist layers 304A, 304B, connection layers 305A, 305B of the wiring substrate 200A correspond to the core substrate 201, the via plugs 202, the patterned wirings 203A, 203B, the solder resist layers 204A, 204B, and the connection layer 205A, 205B, respectively, and are made in the same manner using the same corresponding materials.

Above the solder resist layer 304A of the wiring substrate 200A, a semiconductor chip 307 and a semiconductor chip 309 are mounted. Specifically, the semiconductor chip 307 is disposed above the solder resist layer 304A via a setting film 306. The semiconductor chip 309 is disposed above the semiconductor chip 307 via a setting film 308.

In addition, the semiconductor chips 307, 309 are electrically connected to the patterned wirings 303A (the connection layers 305A) by wirings 310, 311. Moreover, an insulation layer 312 is formed of a molding resin that encapsulates the semiconductor chips 307, 309 and the wirings 310, 311.

As stated, the chip embedded substrate according to the examples of the present invention can be formed of not only two substrates but also three or more substrates.

EXAMPLE 4

The substrates that are stacked on (joined with) one another and the stacking order can be changed in various ways. For example, FIGS. 4A through 4C illustrate process steps of a production method of a chip embedded substrate according to a fourth example.

First, process steps corresponding to the process steps of the first example shown in FIGS. 1A through 1C are carried out. Then, instead of the process step shown in FIG. 10 and the subsequent process steps, a process step shown in FIG. 4A and the subsequent process steps are carried out.

Figure 4A:
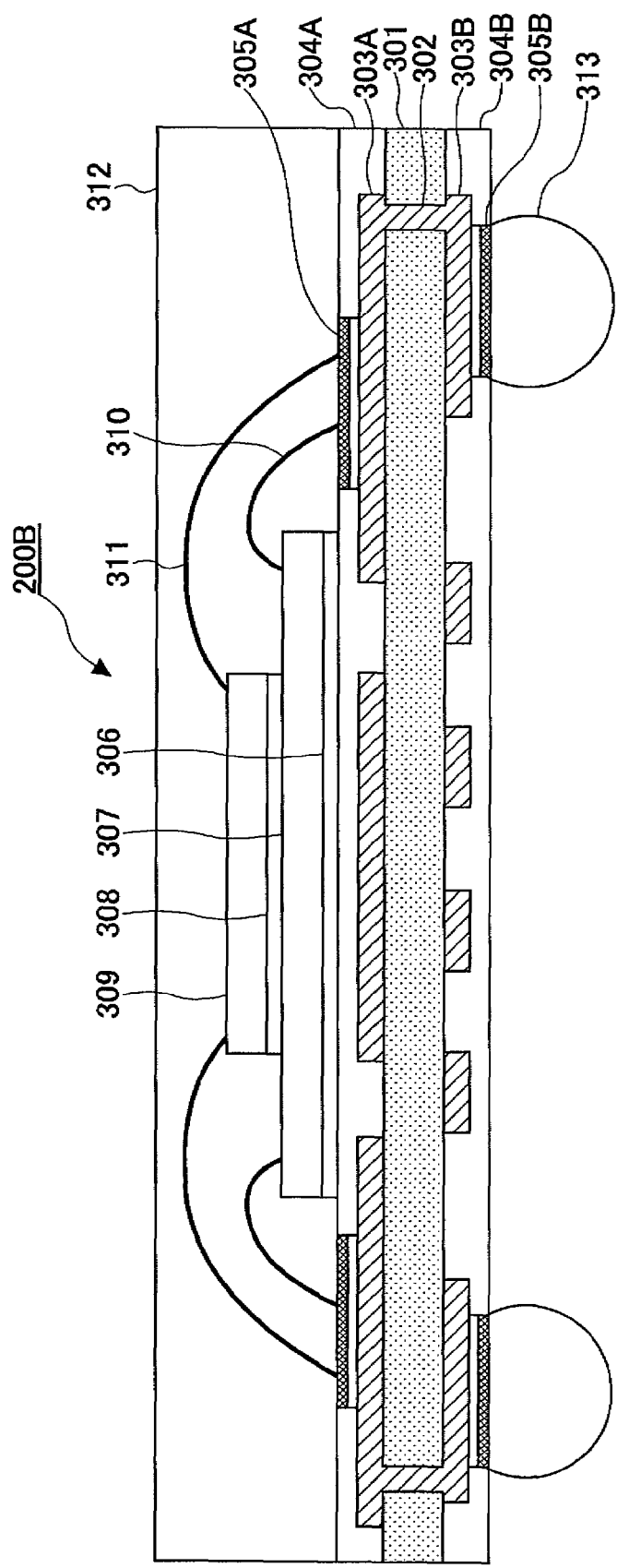
FIG. 4A illustrates one process step of a production method of a chip embedded substrate according to a fourth example.

In the process step shown in FIG. 4A, a wiring substrate 200B, which corresponds to the wiring substrate 200 in the first example, is formed. Specifically, the wiring substrate 200B is formed by encapsulating the semiconductor chips 307, 309 on the solder resist layer 304A in the wiring substrate 200A of the third example using the insulation layer 312 made of a molding resin. In addition, solder balls 313 are formed on the connection layers 305B.

Figure 4B:
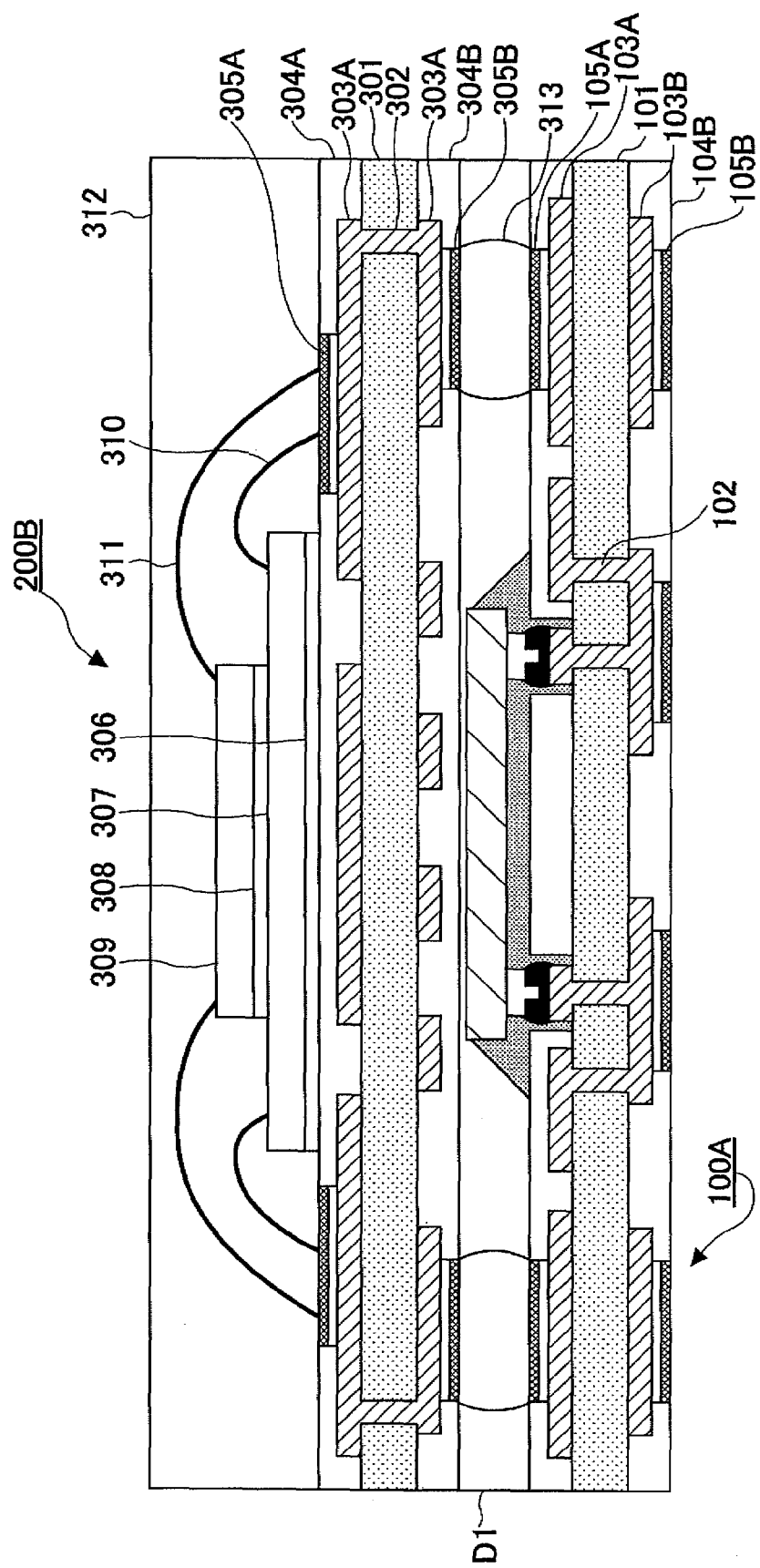
FIG. 4B illustrates another process step of the production method of the chip embedded substrate according to the fourth example.

Next, in a process step shown in FIG. 4B, the wiring substrate 100A and the wiring substrate 200B are joined (stacked) together in the same manner as the process step shown in FIG. 1E.

In this case, the encapsulating connection layer L1, which has already been described, is formed between the wiring substrate 200B and the wiring substrate 100A. The encapsulating connection layer L1 protects and insulates the semiconductor chip, and joins the wiring substrates 100A, 200B. In addition, the encapsulating connection layer L1 electrically connects the patterned wirings of the wiring substrates 100A, 200B.

Next, in a process step shown in FIG. 4O, the solder balls 111 are formed on the connection layers 105B. Thus, a chip embedded substrate 300C is obtained.

As stated above, the wiring substrates that are stacked in the examples of the present invention can be variously changed in terms of their configuration and the stacking order.

EXAMPLE 5

Examples according to the present invention are not limited to the aforementioned chip embedded substrates obtained by joining so-called print circuit boards (the wiring substrates 100, 100A, 200, 200A, 200B or the like) but may be applied to chip embedded substrates obtained by joining substrates formed by the build-up method (referred to as built-up substrates hereinafter), or joining built-up substrates and print circuit boards.

When substrates to be stacked include a built-up substrate, an advantage is exhibited in that it is facilitated that the multilayered wirings connected to the semiconductor chips are miniaturized and multilayered. In addition, when the substrates to be stacked include a built-up substrate, or when built-up substrates are stacked into a chip embedded substrate, the production yields can be improved and a number of semiconductor chips are prevented from being discarded, compared with chip embedded substrates produced by forming all the multilayered wirings connected to the semiconductor chip embedded therein based on the build-up method.

In other words, it becomes possible to produce miniaturized and multilayered chip embedded substrates, while improving improve the production yields, by combining the print circuit boards, which are better in production yields and highly reliable, and the built-up substrates, which are advantageous in miniaturizing and multiplying layers.

In addition, since some layers can be individually formed by the build-up method, when required, production yields can be improved and thus the number of discarded semiconductor chips can be reduced, compared with the chip embedded substrates formed all the way by the build-up method. In the following, an example of such a production method is described.

Figure 5A:
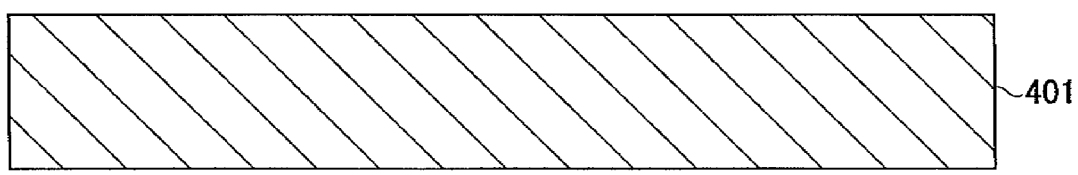
FIG. 5A illustrates one process step of a production method of a chip embedded substrate according to a fifth example.
Figure 5B:
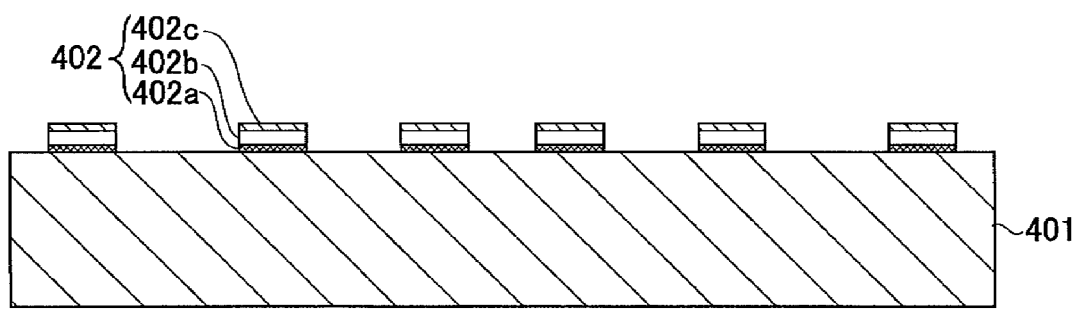
FIG. 5B illustrates another process step of the production method of the chip embedded substrate according to the fifth example.
Figure 5D:
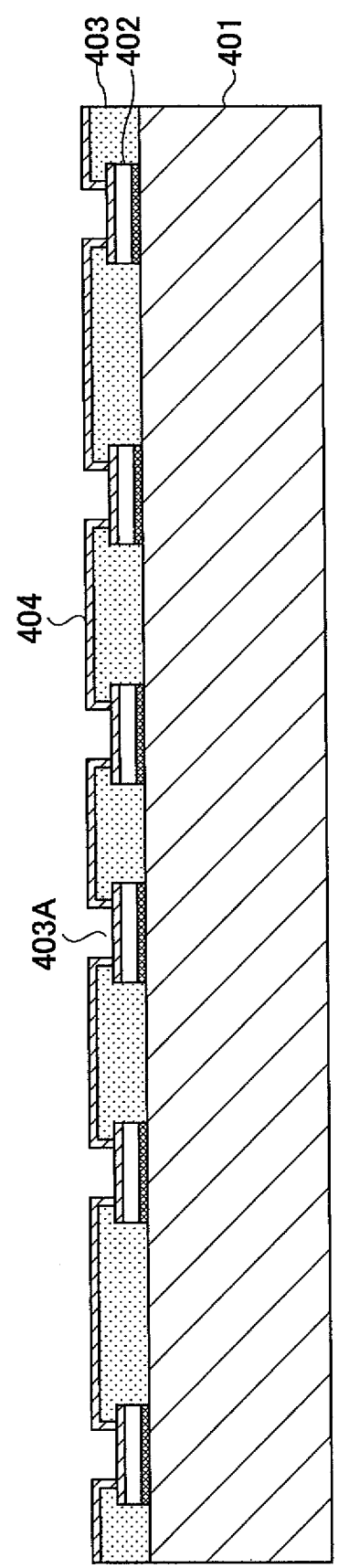
FIG. 5D illustrates another process step of the production method of the chip embedded substrate according to the fifth example.
Figure 5E:
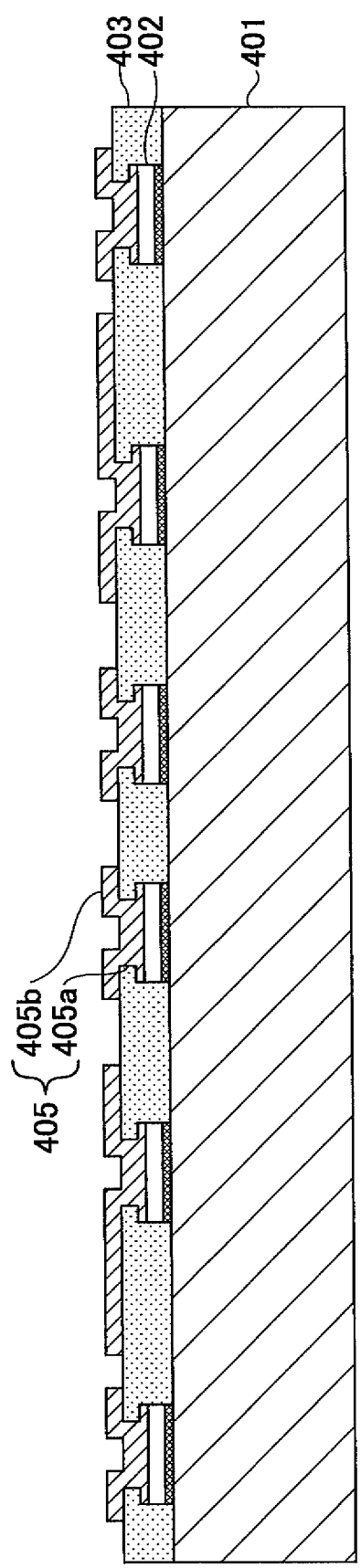
FIG. 5E illustrates another process step of the production method of the chip embedded substrate according to the fifth example.
Figure 5F:
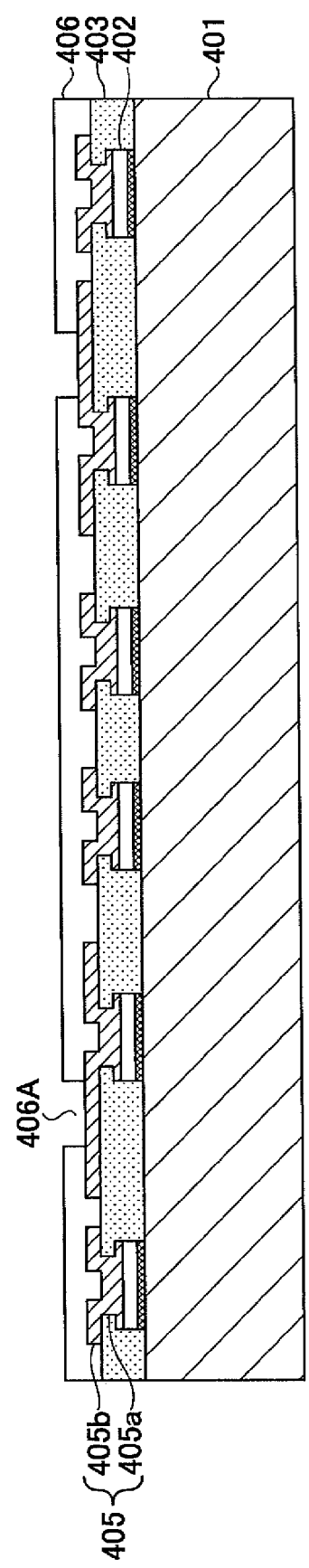
FIG. 5F illustrates another process step of the production method of the chip embedded substrate according to the fifth example.
Figure 5G:
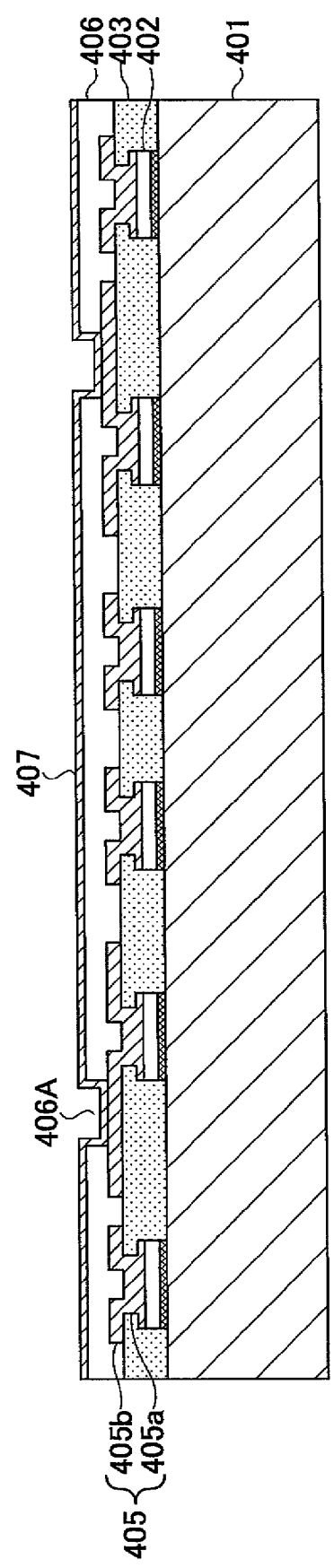
FIG. 5G illustrates another process step of the production method of the chip embedded substrate according to the fifth example.
Figure 5H:
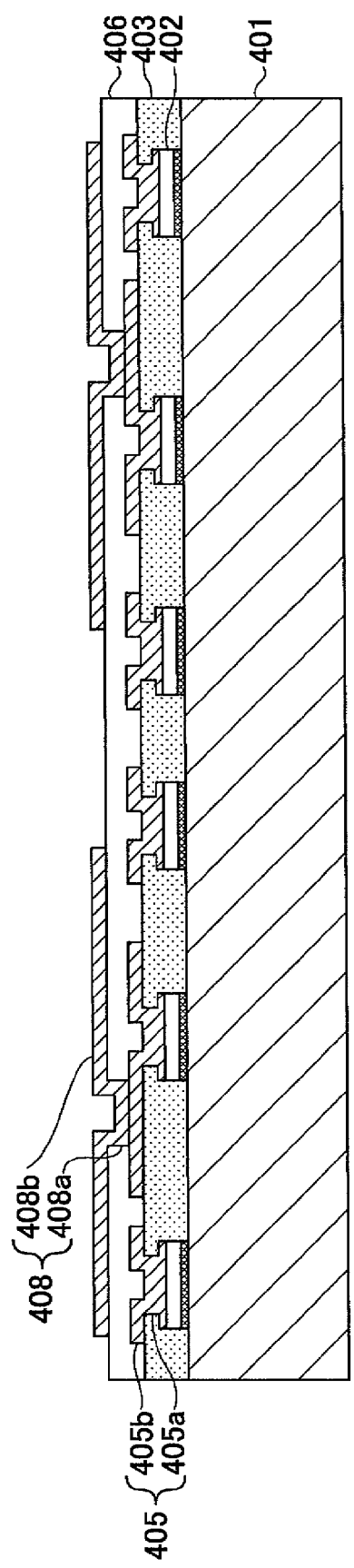
FIG. 5H illustrates another process step of the production method of the chip embedded substrate according to the fifth example.
Figure 5I:
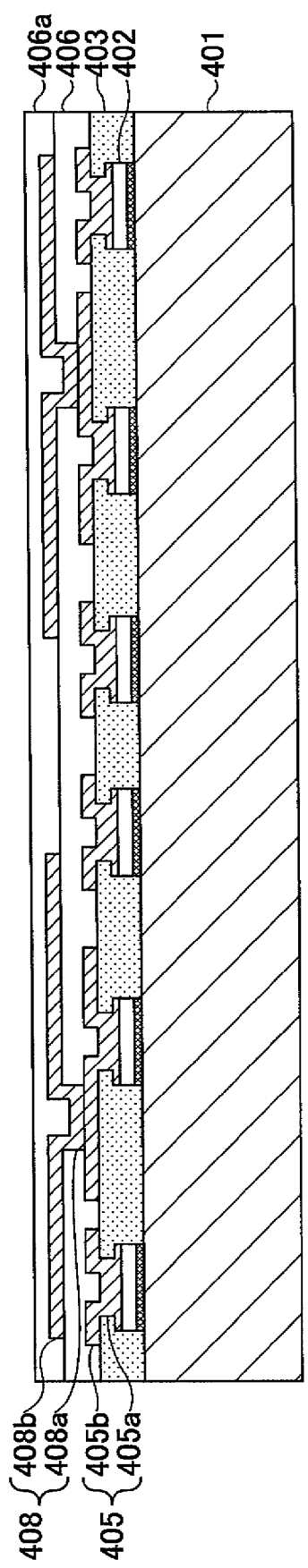
FIG. 5I illustrates another process step of the production method of the chip embedded substrate according to the fifth example.
Figure 5K:
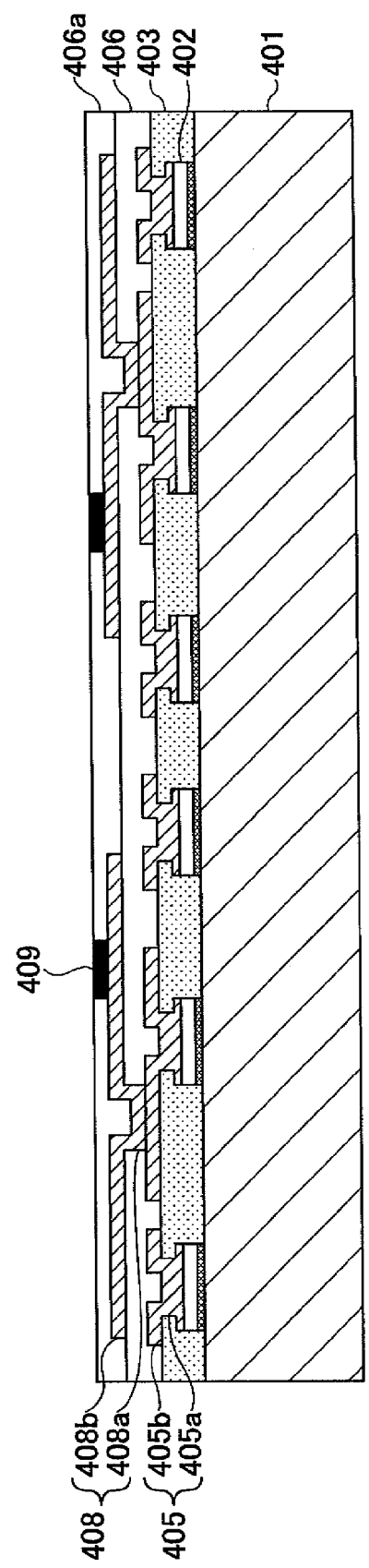
FIG. 5K illustrates another process step of the production method of the chip embedded substrate according to the fifth example.
Figure 5L:
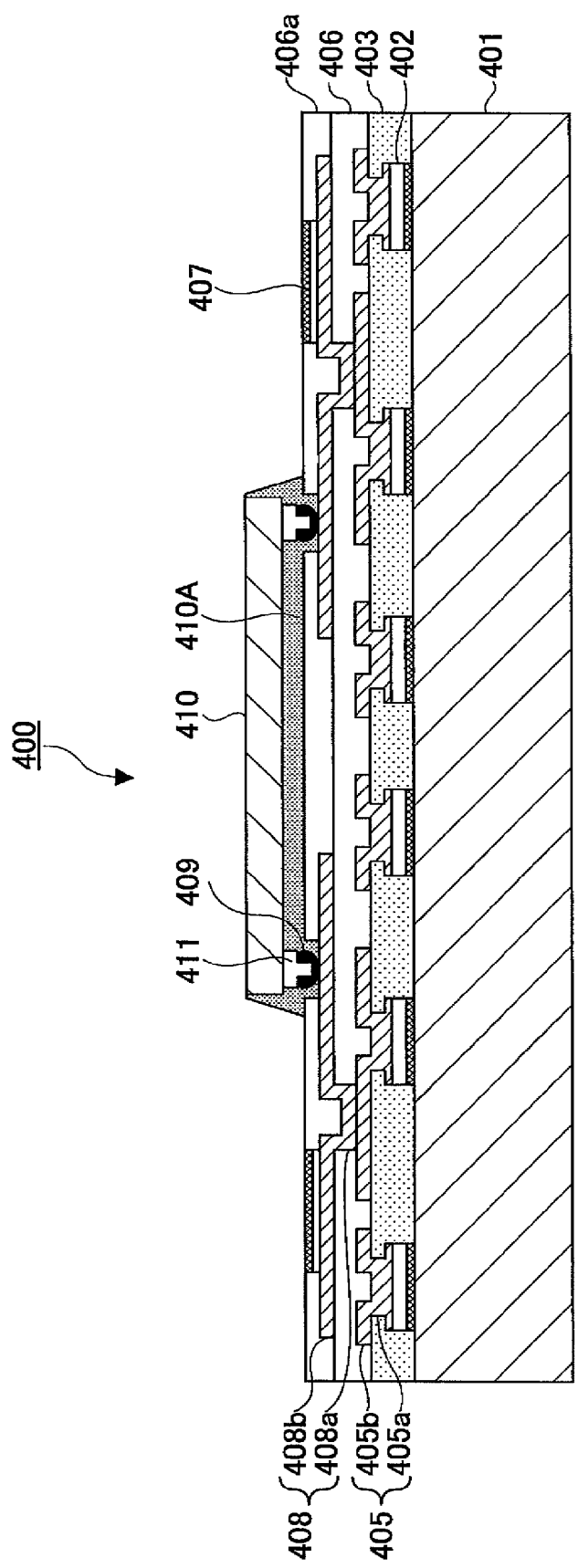
FIG. 5L illustrates another process step of the production method of the chip embedded substrate according to the fifth example.
Figure 5M:
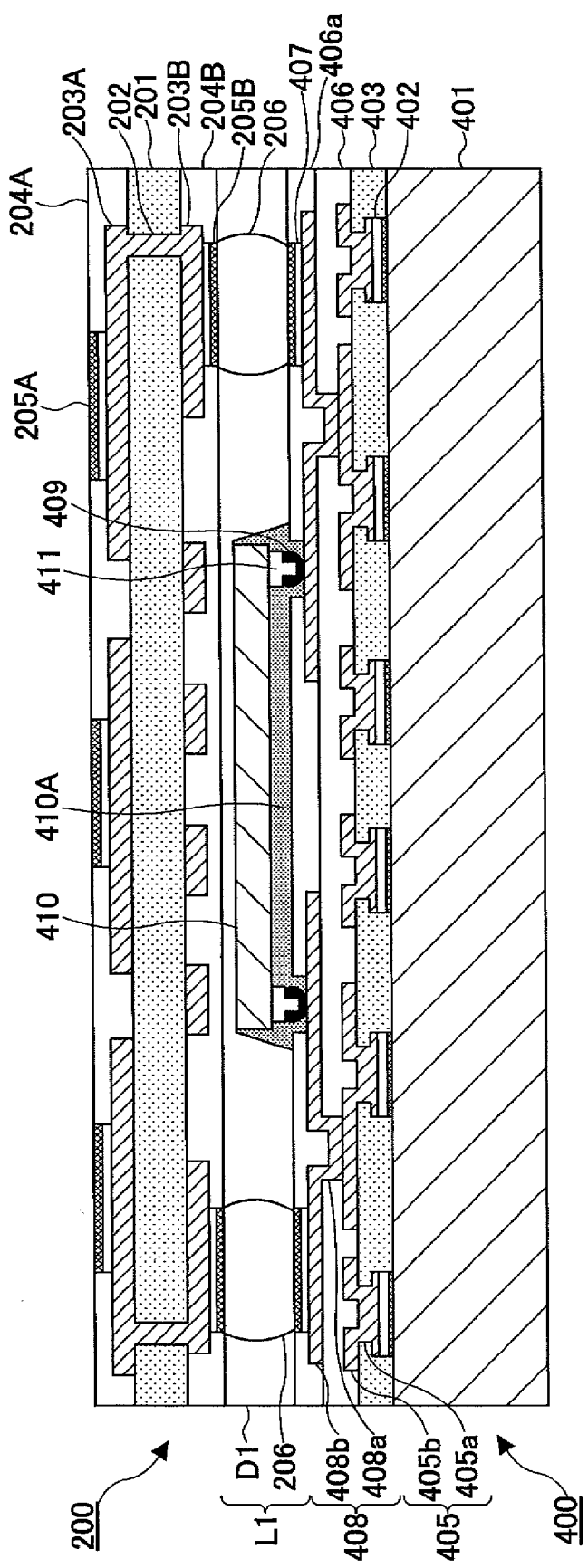
FIG. 5M illustrates another process step of the production method of the chip embedded substrate according to the fifth example.
Figure 5N:
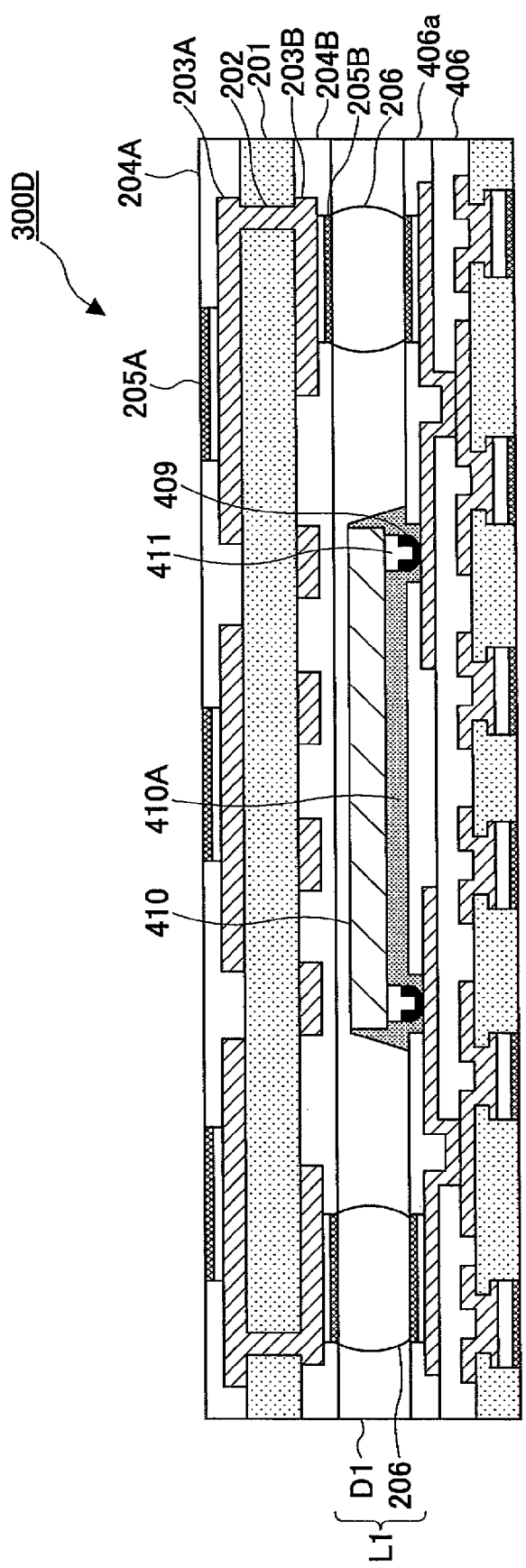
FIG. 5N illustrates another process step of the production method of the chip embedded substrate according to the fifth example.
Figure 50:
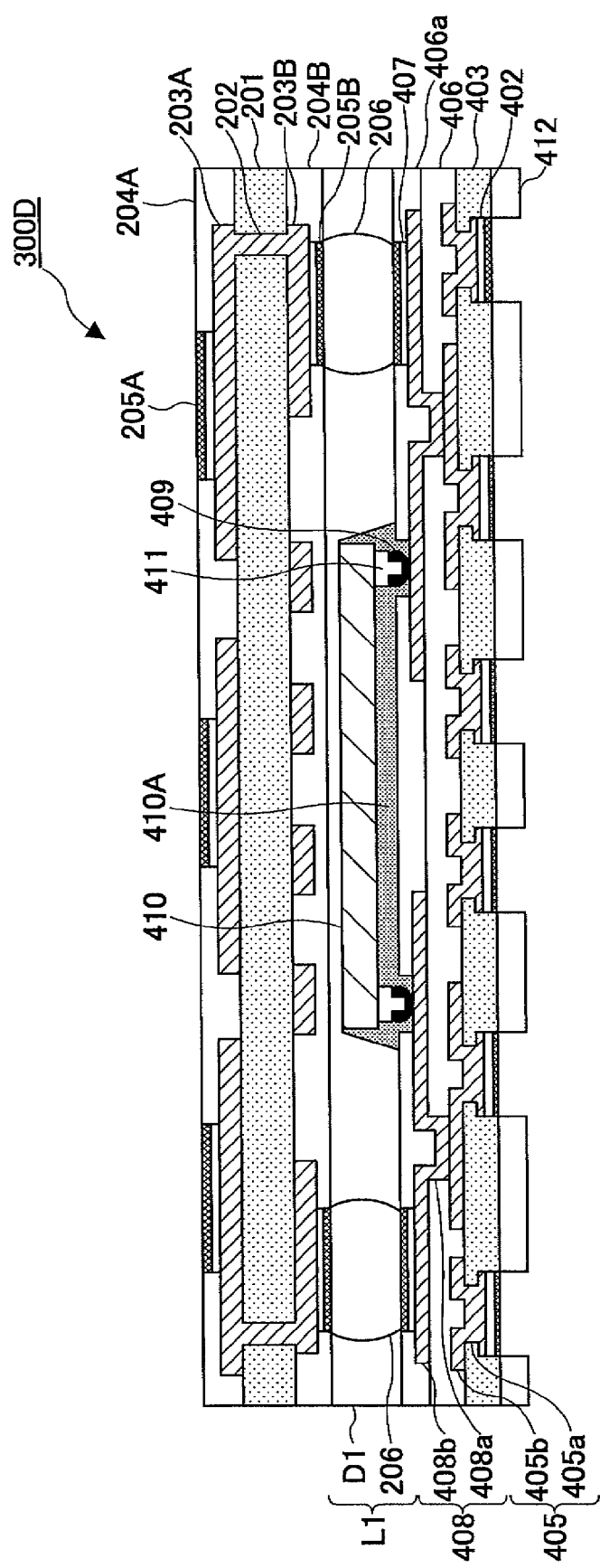
Figure 5P:
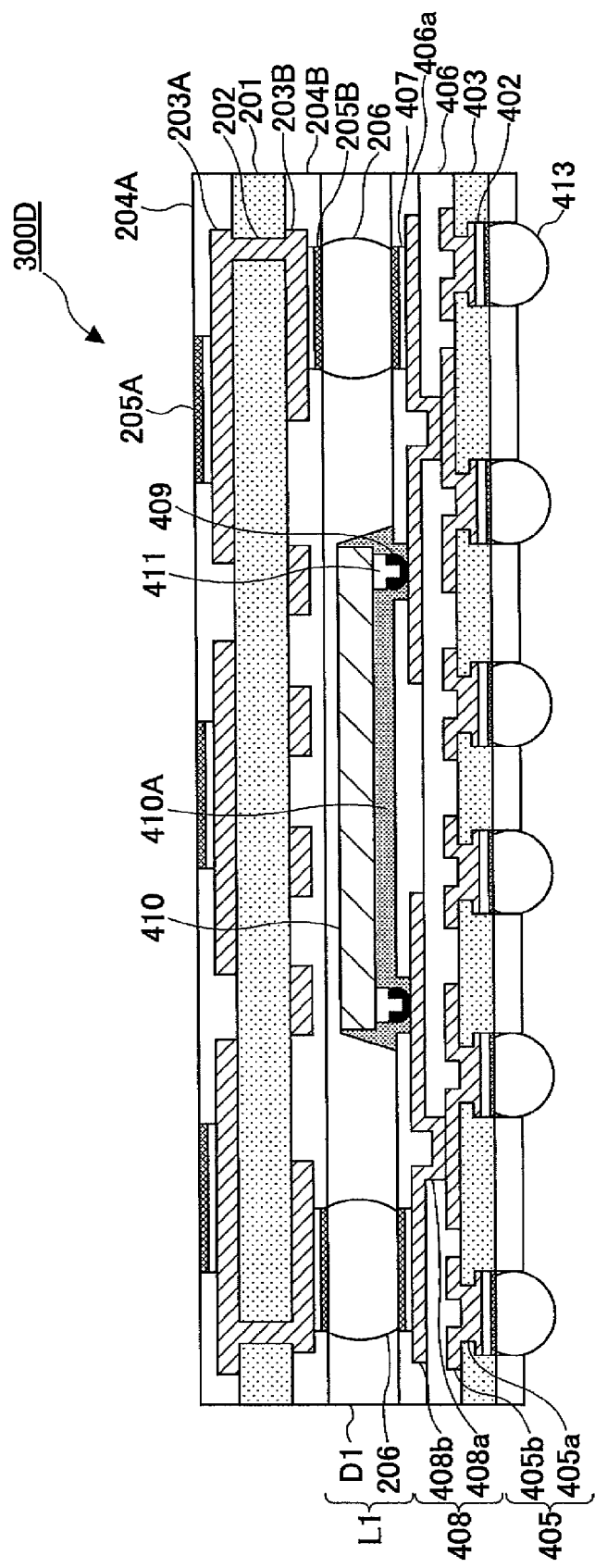
FIG. 5P illustrates another process step of the production method of the chip embedded substrate according to the fifth example.

FIGS. 5A through 5P illustrate process steps of a production method of a chip embedded substrate according to a fifth example. In a process step shown in FIG. 5A, a support substrate 401 having a thickness of 200 μm, which is made of an electrically conductive material, for example, copper, is prepared.

Next, in a process step shown in FIG. 5B, a resist pattern (not shown) is formed on the support substrate 401 by photolithography. Then, connection layers 402 having a structure in which an Au layer 402a, a Ni layer 402b and a Cu layer 402c are stacked, for example, are formed by electroplating, while the resist pattern is used as a mask. In this electroplating, since the support substrate 401 serves as an electric current path, the support substrate 401 is desirably made of electrically conductive materials, and is more desirably made of low resistance materials, such as copper.

Then, in a process step shown in FIG. 5C, insulation layers 403 are formed on the support substrate 401 so as to cover the connection layers 402. The insulation layer 403 is formed of, for example, a build-up resin (an epoxy resin, a polyimide resin, or the like) and a solder resist (an acryl resin, an epoxy acryl resin, or the like).

In this case, the insulation layer 403 is desirably formed of mechanically strong materials, for example, prepreg materials, such as glass fabric epoxy prepreg made by impregnating resin with fibrous glass, since such an insulation layer 403 can serve as a reinforcement layer (stiffener) for the wiring substrate.

After the insulation layer 403 is formed, via holes 403A are formed, for example, by a laser so that the connection layers 402 are exposed through the via holes 403A.

Next, in a process step shown in FIG. 5D, residues in and around the via holes 403A are eliminated by a desmear process, when necessary, and the surface of the insulation layer 403 is treated (roughing treatment). Then, a Cu seed layer 404 is formed on the surfaces of the insulation layer 403 and the connection layers 402 by an electroless plating process.

Next, in a process step shown in FIG. 5E, a resist pattern (not shown) is formed by photolithography. Then, Cu electroplating is carried out to form via plugs 405a in the via holes 403A and patterned wirings 405b on the insulation layer 403 using the resist pattern as a mask. The patterned wirings 405b are connected to the via plugs 405a. Thus, a wiring portion 405 is formed.

After the wiring portion 405 is formed, the resist pattern is removed and the exposed, redundant seed layer is etched off.

Next, in a process step shown in FIG. 5F, an insulation layer (build up layer) 406 made of, for example, a thermosetting epoxy resin is formed so as to cover the wiring portion 405. Then, via holes 406A are formed in the insulation layer 406 by a laser, so that parts of the pattern wirings 405b are exposed through the via holes 406A.

Next, in a process step shown in FIG. 5G, residues in and around the via holes 406A are eliminated by a desmear process in the same manner as the process step shown in FIG. 5D, and the surface of the insulation layer 403 is treated, when necessary. Then, a Cu seed layer 407 is formed on the surface of the insulation layer 406 and the exposed portions of the surface of the pattern wirings 405b by an electroless plating.

Next, in a process step shown in FIG. 5H, a resist pattern (not shown) is formed by photolithography in the same manner as the process step shown in FIG. 5E. Then, Cu electroplating is carried out to form via plugs 408a in the via holes 406A and pattern wirings 408*b* connected to the via plugs 408*a* on the insulation layer 406. Thus, wiring portions 408 are formed.

After the wiring portions 408 are formed, the resist pattern is removed and the exposed, redundant seed layer 407 is etched off.

Next, in a process step shown in FIG. 5I, an insulation layer (build-up layer) 406*a* made of, for example, a thermosetting epoxy resin is formed so as to cover the wiring portions 408.

Next, in a process step shown in FIG. 5J, openings 406B are formed in the insulation layer 406*a*, for example, by a laser, so that parts of the patterned wirings 408*b* are exposed through the openings 406B.

Next, in a process step shown in FIG. 5K, residue in and around openings 406B is eliminated by a desmear process, when necessary, and the surface of the insulation layer 406*a* is treated. Then, solder portions 409 are formed in the openings 406B by electroless plating.

Next, in a process step shown in FIG. 5L, openings are formed in the insulation layer 406*a*, for example, by a laser, so that other parts of the patterned wirings 408*b* are exposed through the openings. Then, the openings are filled with connection layers 407 made of Au/Ni (an Au top layer and a Ni bottom layer formed on the patterned wirings 408*b*) by electroplating.

Then, a semiconductor chip on which bumps 411 are formed of bonding wires made of, for example, Au or the like is placed on the wiring portion 408 so that the bumps 411 contact the corresponding solder connection portions 409. In this case, it is preferable that a reflow process be performed on the solder connection portions 409, when necessary, in order to improve electrical connection between the solder connection portions 409 and the bumps 411. In addition, it is preferable to form an underfill 410A by supplying a resin between the semiconductor chip 410 and the insulation layer 406*a*, when necessary.

By carrying out the aforementioned processes or procedures, a wiring substrate 400 where the semiconductor chip is mounted on the built-up substrate is obtained.

Next, in a process step shown in FIG. 5M, the wiring substrate 400 and the wiring substrate 200 are joined (stacked) in the same manner as shown in FIG. 1E of the first example.

In this case, the encapsulating connection layer L1 is formed between the wiring substrate 400 and the wiring substrate 200. The encapsulating connection layer L1 encapsulates the semiconductor chip 410 and connects the wiring of the wiring substrate 400 and the wiring of the wiring substrate 200. The encapsulating connection layer L1 is composed of the solder balls 206 and the insulation layers D1 made of the build-up resin formed, for example, by a laminating process. The solder balls 206 are electrically connected to the patterned wirings 203B via the connection layer 205B and to the patterned wirings 408*b* via the connection layer 407. In addition, as explained for the second example, the encapsulating connection layer L2 including the connection layer D2 made of an anisotropic conductive material may be employed instead of the encapsulating connection layer L1.

Next, in a process step shown in FIG. 5N, the support substrate 401 is removed, for example, by wet-etching. Use of the support substrate 401 provides better flatness of the wiring substrate 400, which is a built-up substrate, and removal of the support substrate 401 enables thinning of the wiring substrate 400. In addition, the support substrate 401 is desirably removed after the wiring substrate 400 and the wiring substrate 200 are joined. This is because the core substrate 201 of the wiring substrate 200 can maintain flatness of the chip embedded substrate as a whole.

Next, in a process step shown in FIG. 5O, a solder resist layer 412 is formed so as to cover the insulation layer 403 and allow the connection layers 402 to be exposed through the solder resist layer 412. By the way, this process can be omitted when the insulation layer 403 is formed by a solder resist.

Next, in a process step shown in FIG. 5P, solder balls 413 are formed on the connection layers 402, when necessary. In this matter, a chip embedded substrate 300D can be obtained.

As stated, in the chip embedded substrate according to this example of the present invention, the multilayer wirings connected to the semiconductor chip is formed by a combination of the wiring substrate 400, which is a built-up substrate, and the wiring substrate 200, which is a print circuit board. Therefore, the production yields are better and the number of semiconductor chips that have to be discarded can be reduced, compared with a situation where all the multilayer wirings connected to the semiconductor are formed by the build-up method. In addition, the multilayer wirings can be easily produced and miniaturized compared with a situation where the multilayered wirings are formed by print circuit boards.

EXAMPLE 6

FIGS. 6A through 6E illustrate process steps of a production method of a chip embedded substrate according to a sixth example of the present invention.

First, the processes shown in FIGS. 5A through 5L in the fifth example are carried out so as to form the wiring substrate 400, which is illustrated in FIG. 6A. Similarly, the wiring substrate 500 is formed. In this case, a support substrate 501, connection layers 502, insulation layers 503, 506, 506*a*, wiring portions 505 (via plugs 505*a*, patterned wirings 505*b*), wiring portions 508 (via plugs 508*a*, patterned wirings 508*b*), and connection layers 507 in the wiring substrate 500 correspond to and are made in the same manner as the support substrate 401, the connection layers 402, the insulation layers 403, 406, 406*a*, the wiring portions 405 (the via plugs 405*a*, the patterned wirings 405*b*), the wiring portions 408 (the via plugs 408*a*, the patterned wirings 408*b*), and the connection layers 407 in the wiring substrate 400, respectively. However, the semiconductor chip is not mounted on the wiring substrate 500, and solder balls 510 are formed on the connection layers 507.

Figure 6B:
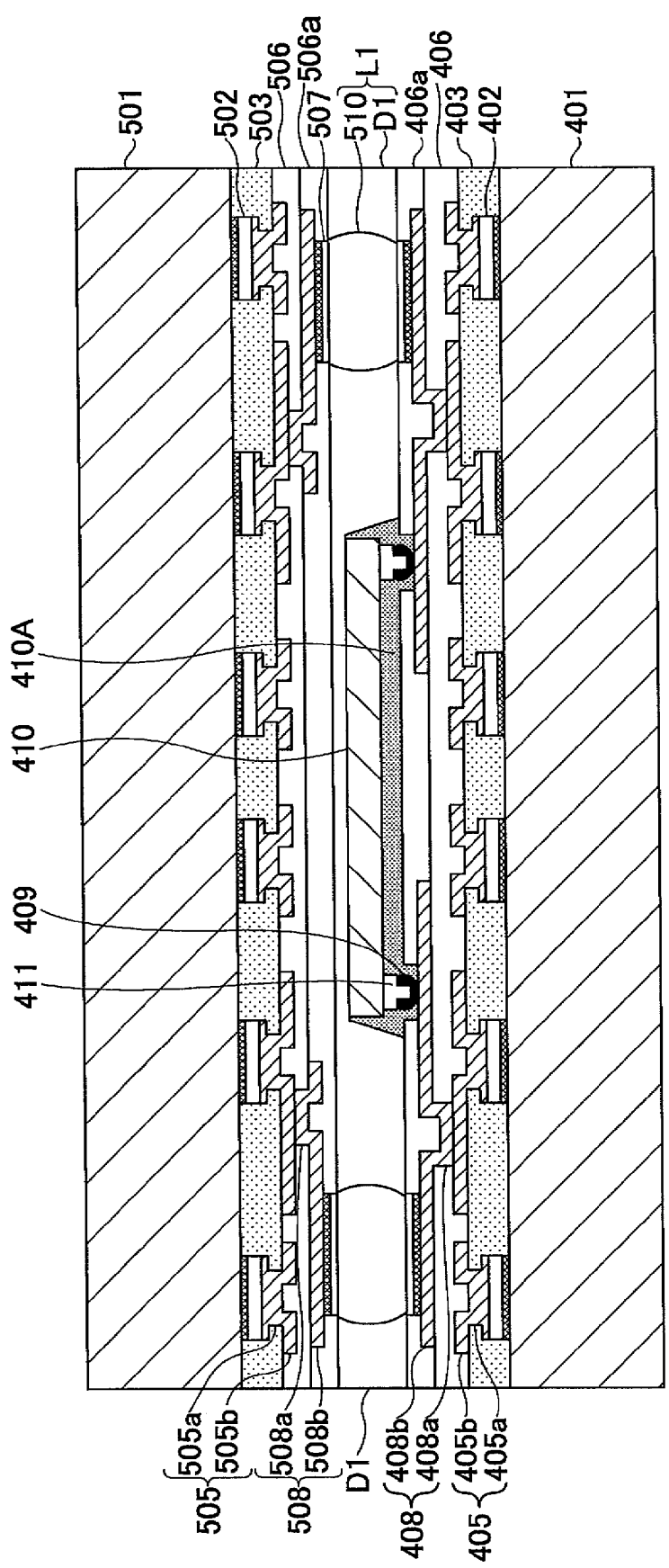
FIG. 6B illustrates another process step of the production method of the chip embedded substrate according to the sixth example of the present invention.

Next, in a process step shown in FIG. 6B, the wiring substrate 400 and the wiring substrate 500 are joined (stacked) in the same manner as shown in FIG. 1E of the first example.

In this case, the encapsulating connection layer L1 is formed between the wiring substrate 400 and the wiring substrate 500. The encapsulating connection layer L1 encapsulates the semiconductor chip 410 and connects the wirings of the wiring substrate 400 and the wiring substrate 500. The encapsulating connection layer L1 includes the solder balls 510 and the insulation layer D1 made of a build-up resin formed, for example, by a laminating process. The solder balls 510 are electrically connected to the patterned wirings 508*b* via the connection layer 507 and the patterned wirings 408*b* via the connection layer 407. By the way, as explained for the second example, the encapsulating connection layer L2 including the connection layers D2 made of an anisotropic conductive material may be employed instead of the encapsulating connection layer L1.

Figure 6C:
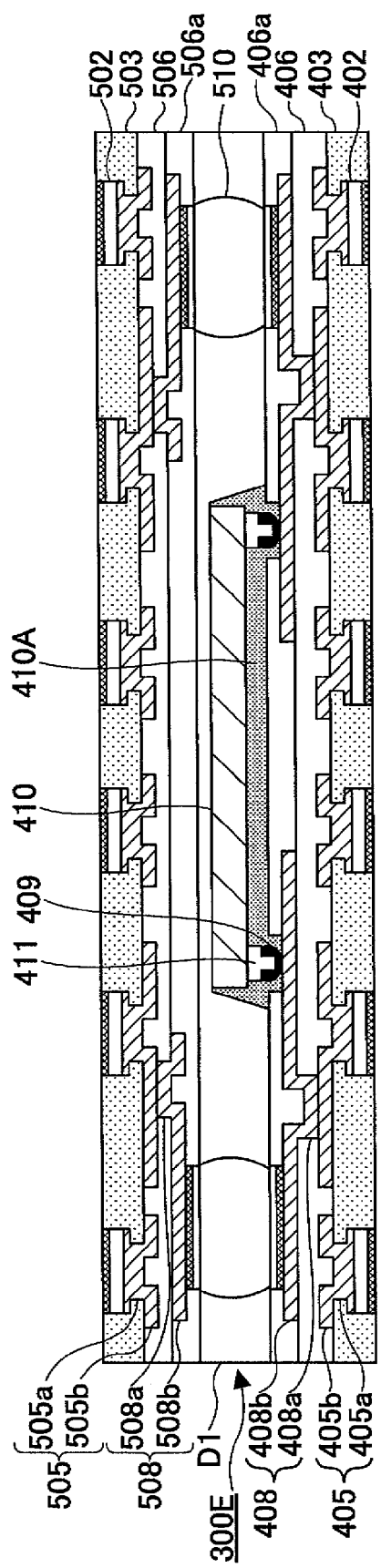
FIG. 6C illustrates another process step of the production method of the chip embedded substrate according to the sixth example of the present invention.

Next, in a process step shown in FIG. 6C, the support substrates 401, 501 are removed, for example, by wet-etching. Use of the support substrates 401, 501 provides better flatness of the wiring substrates 400, 500, which are built-up substrates, and removal of the support substrates 401, 501 enables thinning of the wiring substrates 400, 500. By the way, in order to maintain flatness of the chip embedded substrate, the support substrates 401, 501 are removed desirably after the wiring substrates 400 and the wiring substrates 500 are joined.

Figure 6D:
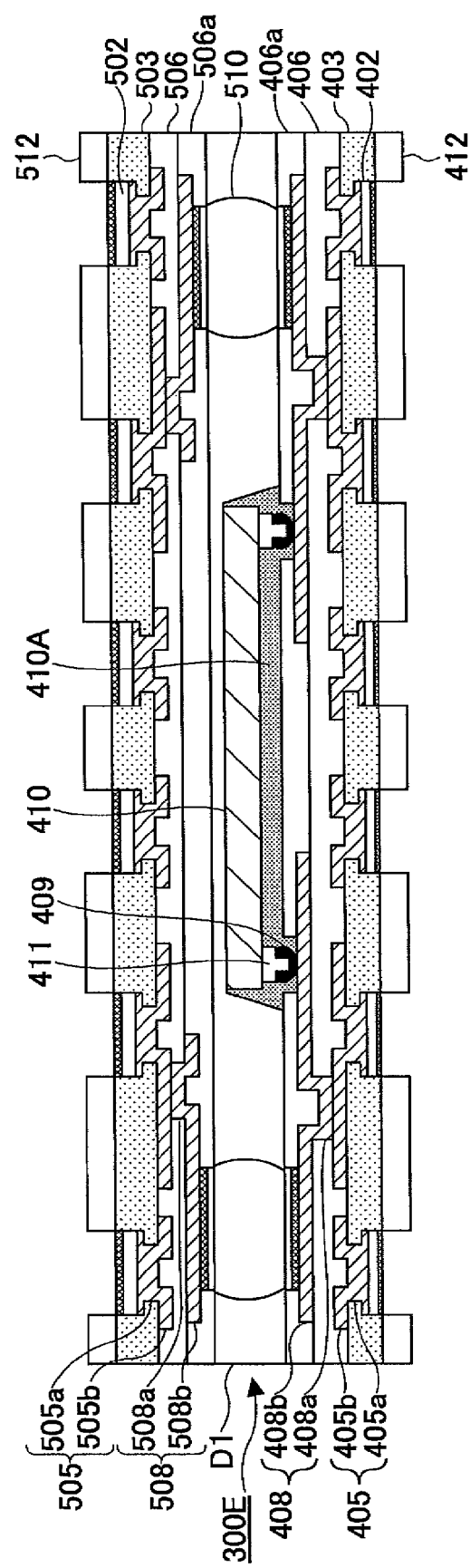
FIG. 6D illustrates another process step of the production method of the chip embedded substrate according to the sixth example of the present invention.

Next, in a process step shown in FIG. 6D, the solder resist layer 412 is formed so as to cover the insulation layer 403 and allow the connection layer 402 to be exposed through the solder resist layer 412. Similarly, the solder resist layer 512 is formed so as to cover the insulation layer 503 and allow the connection layers 502 to be exposed through the solder resist layer 512. By the way, this process can be omitted when the insulation layers 403, 503 are formed of solder resist layers.

Figure 6E:
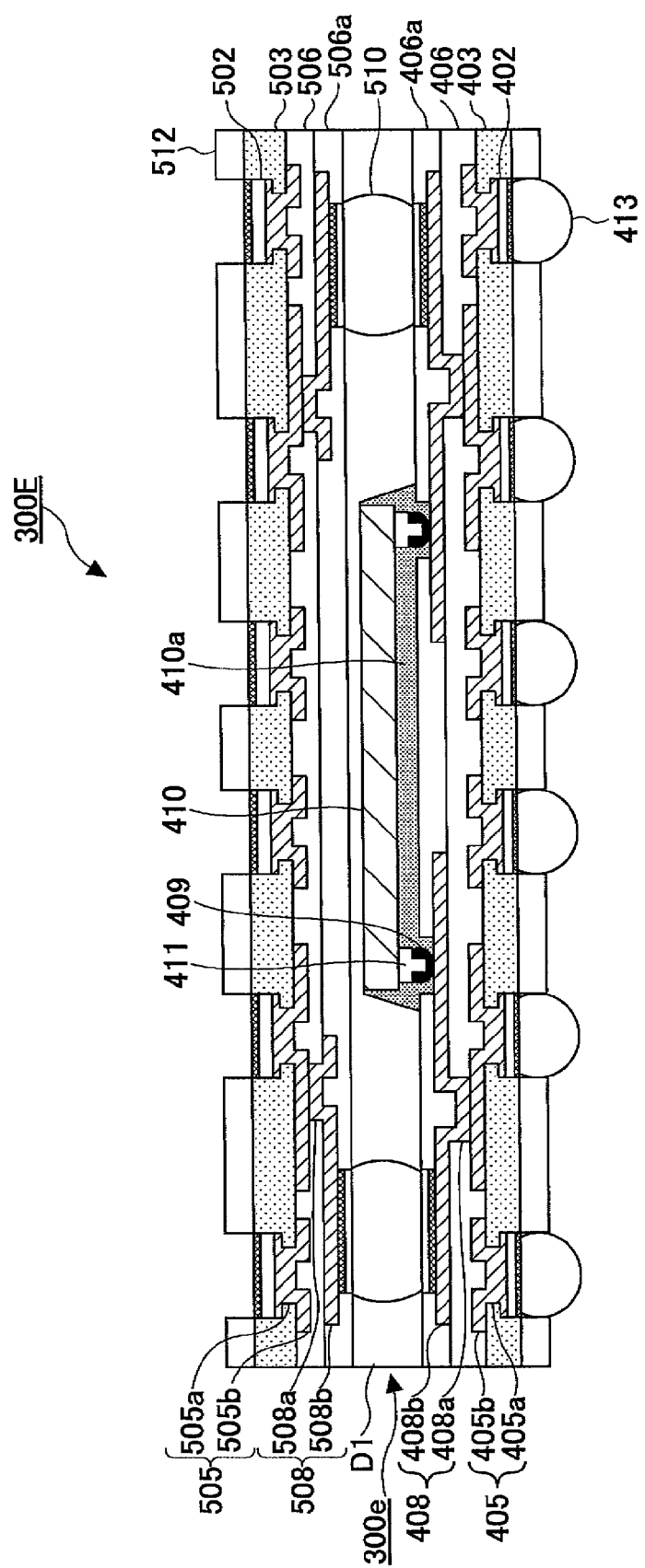
FIG. 6E illustrates another process step of the production method of the chip embedded substrate according to the sixth example of the present invention.

Next, in a process step shown in FIG. 6E, solder balls 413 are formed on the connection layers 402, when necessary. Thus, a chip embedded substrate 330E is obtained.

As stated, in the production method according to this example of the present invention, since some layers (wirings connected to the semiconductor chips) can be individually formed by the build-up method, when required, production yields can be improved and thus the number of discarded semiconductor chips can be reduced, compared with the chip embedded substrates formed all the way by the build-up method. In the following, an example of such a production method is described.

EXAMPLE 7

Figure 7:
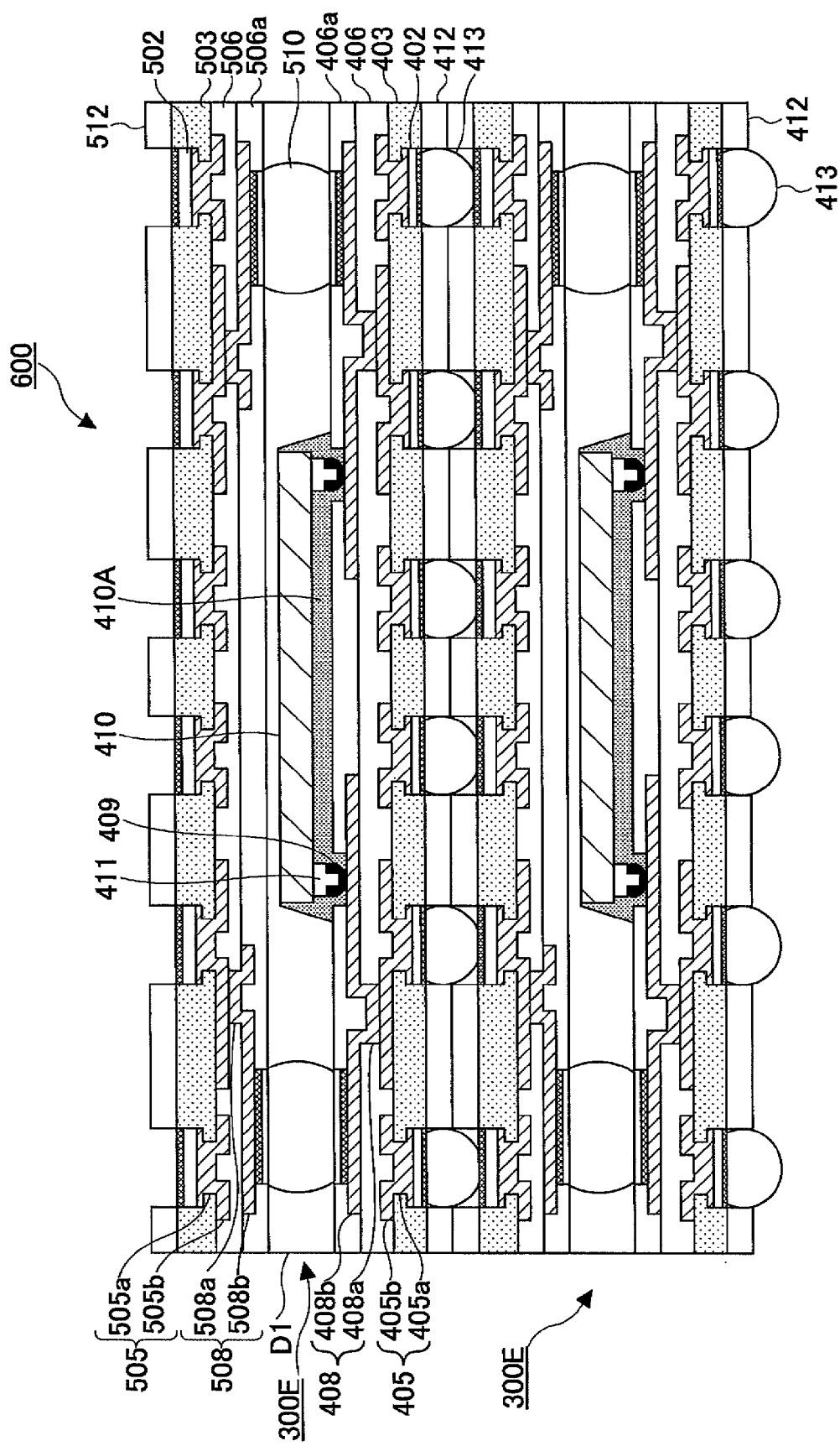
FIG. 7 illustrates a chip embedded substrate according to a seventh example of the present invention.

FIG. 7 illustrates a chip embedded substrate 600 according to a seventh example of the present invention. Referring to FIG. 7, the chip embedded substrate 600 according to this example has a configuration where the chip embedded substrates 300E according to the sixth example are stacked. As shown, the chip embedded substrates 600 according to examples of the present invention can be variously configured depending on needs. In addition, the number of layers to be stacked can be increased depending on needs, thereby enabling further expansion of the number of layers.

EXAMPLE 8

Figure 8:
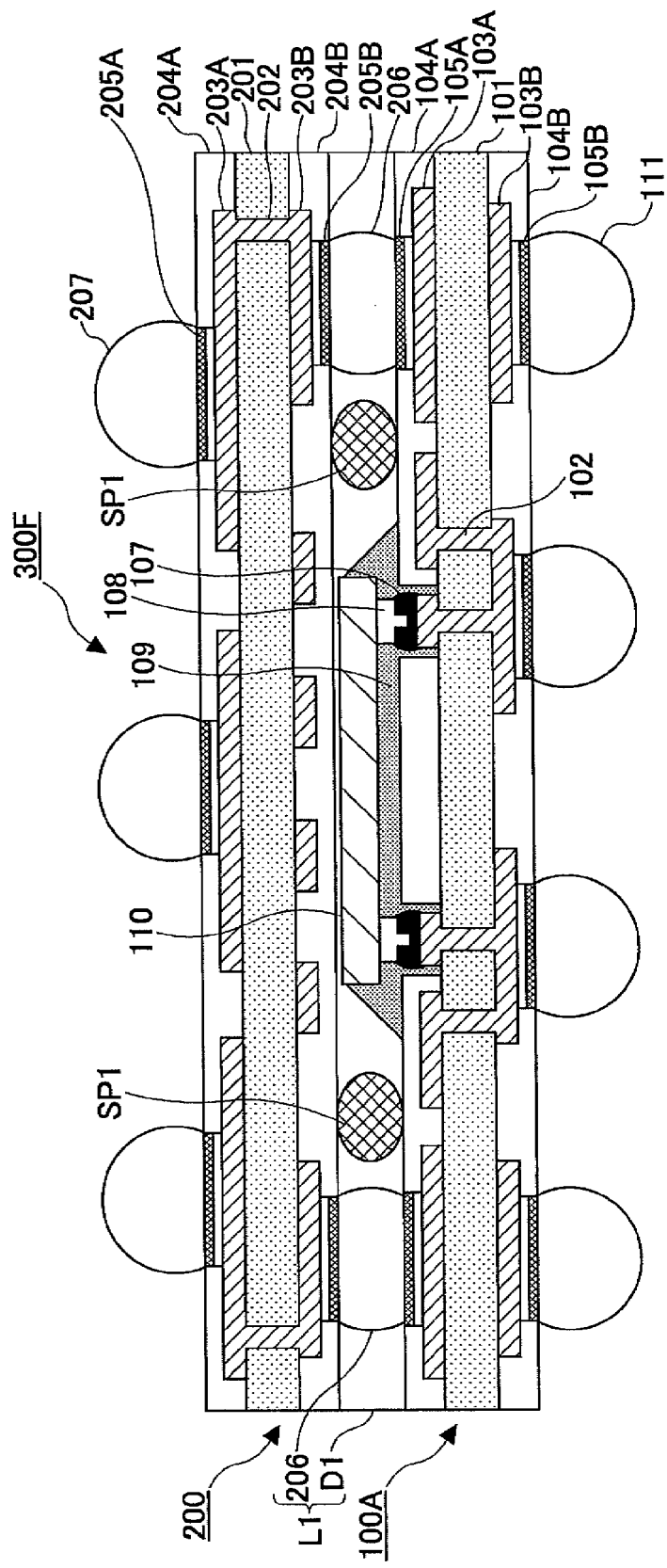
FIG. 8 illustrates a chip embedded substrate according to an eighth example of the present invention.

FIG. 8 illustrates a chip embedded substrate 300F according to an eighth example of the present invention. The chip embedded substrate 300F has a configuration where spacers SP1 of a substantially ball shape are added to the chip embedded substrate 300 described as the first example.

The spacers SP1 are formed of, for example, a resin material (e.g., divinylbenzene) or an electrically conductive material (e.g., Cu).

Since the spacers SP1 are introduced in the insulation layer D1 between the wiring substrate 100A and the wiring substrate 200, the distance between the wiring substrate 100A and the wiring substrate 200 can be adjusted. In addition to facilitating control of (maintaining) the distance between the wiring substrate 100A and the wiring substrate 200, introduction of the spacers SP1 enables reduction of warpage of the chip embedded substrate 300F and improves degree of parallelization of the wiring substrate 100A and the wiring substrate 200.

EXAMPLE 9

Figure 9:
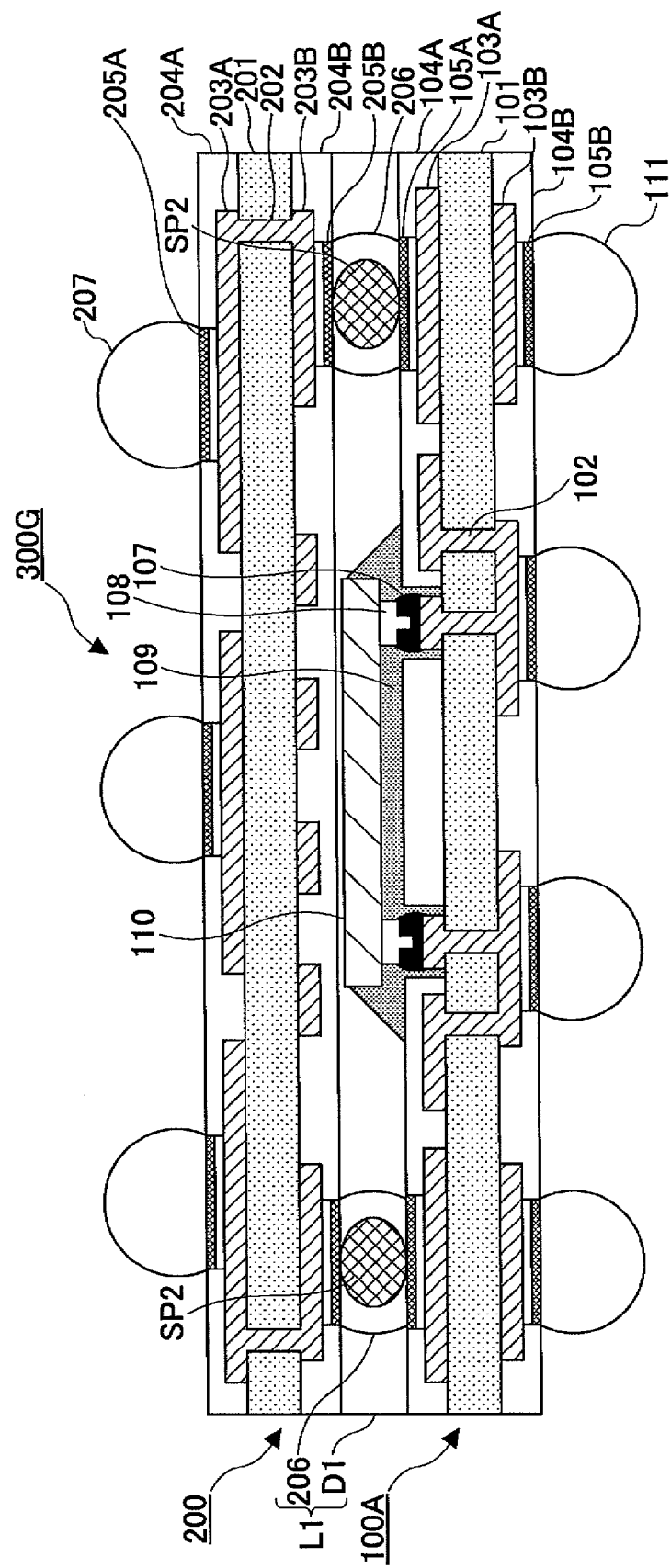
FIG. 9 illustrates a chip embedded substrate according to a ninth example of the present invention.

FIG. 9 illustrates a chip embedded substrate 300G according to a ninth example of the present invention. In the chip embedded substrate 300G, spacers SP2 corresponding to the spacers SP1 described above in the eighth embodiment are arranged in the solder balls (electrical connection members) 206.

Namely, in this example, the solder balls (electrical connection members) 206 housing the spacers SP2 electrically connect the wirings formed on the wiring substrate 100A and the wirings formed on the wiring substrate 200, and control the distance between the wiring substrate 100A and the wiring substrate 200. Additionally, in this example, additional room for arranging the spacers is not necessary, thereby enabling a narrower pitch of the wirings.

The spacers SP2 are formed of, for example, a resin material (e.g., divinylbenzene) or an electrically conductive material (e.g., Cu).

In this example, when the spacers SP2 are formed of an electrically conductive material having a high electric conductivity, for example, Cu, the resistance between the wirings formed on the wiring substrate 100A and the wiring formed on the wiring substrate 200 can be reduced.

Namely, metallic materials, which have lower electric resistance than the electrical connection members serving as a spacer, may be introduced inside the electrical connection members that connect the patterned wirings formed respectively on the two wiring substrates. In this case, the electrical connection members and the metallic materials have desirably different melting points. For example, when the solder balls (electrical connection members) are melted, the Cu member having a higher melting point than the solder balls can serve as a spacer, thereby maintaining the distance between the two wiring substrates at a predetermined distance. Specifically, electrical connection members (solder balls) that are made by coating a solder layer on a surface of the metal balls, such as Cu balls, can be desirably employed.

In addition, in the case of the eighth and the ninth example, the connection layers D2 (layers made of an anisotropic material) may be employed instead of the insulation layer D1. In other words, the solder balls and the anisotropic material may be co-employed in order to ensure electrical connection.

EXAMPLE 10

In the previous examples 8, 9, the solder balls are employed as the electrical connection members that connect the wirings formed on the wiring substrate 100A and the wirings formed on the wiring substrate 200. However, electrically conductive protrusion members may be employed as the electrical connection members instead of solder balls. As such an electrically conductive protrusion member, there are post-shaped (e.g., pillar-shaped) electrically conductive members (described in examples 10 through 13) or bumps formed of bonding wires (described in examples 14 through 16).

Figure 10:
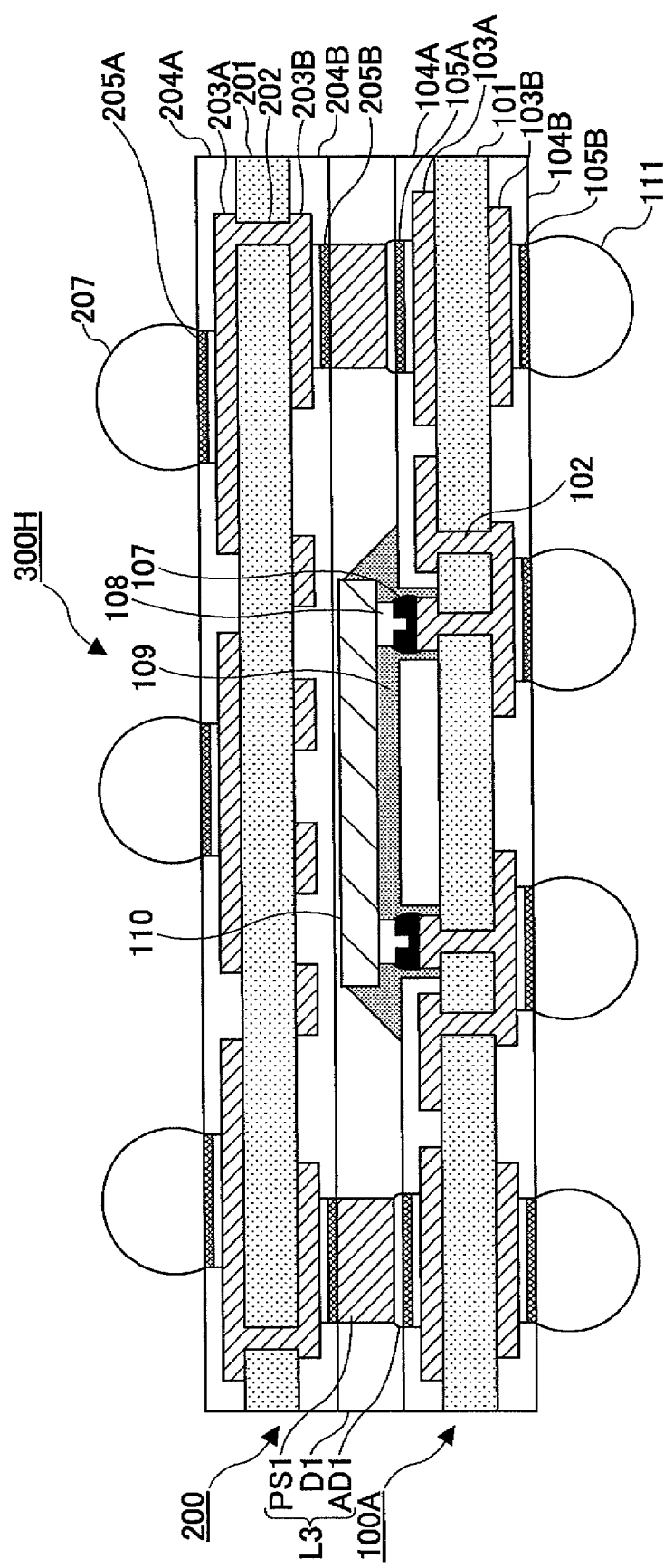
FIG. 10 illustrates a chip embedded substrate according to a tenth example of the present invention.

FIG. 10 illustrates a chip embedded substrate 300H according to a tenth example of the present invention. Referring to FIG. 10, posts PS1 made of Cu for electrically connecting the wirings formed on the wiring substrate 100A and the wirings formed on the wiring substrate 200 are formed in the chip embedded substrate 300H according to this example.

The posts PS1 are connected to the patterned wirings 203B via the connection layers 205B. Additionally, connection layers AD1 made of, for example, a solder, are formed between the posts PS1 and the connection layers 105A. Therefore, the posts PS1 are connected to the patterned wirings 103A via the connection layers AD1, 105A. When the connection layers AD1 are formed, either solder balls or solder balls having the spacers described for the ninth example may be employed.

In the above configuration, encapsulating connection layer L3 corresponding to the encapsulating connection layer L1 of the first example has the insulation layer D1, the posts PS1, and the connection layers AD1.

When the chip embedded substrate 300H according to this example is formed, the posts PS1 may be formed on the connection layers 205A of the wiring substrate 200, for example, by Cu electroplating. In addition, the posts PS1 are formed on the connection layers 105A of the wiring substrate 100A.

The chip embedded substrate 300H according to this example can facilitate control of the distance between the wiring substrate 100A and the wiring substrate 200, as is the case with the eighth and ninth examples, and reduce warpage of the chip embedded substrate 300H. Additionally, the degree of parallelization of the wiring substrate 100A and the wiring substrate 200 is improved according to this example.

Moreover, the wirings formed on the wiring substrate 100A and the wirings formed on the wiring substrate 200 may be made at narrower pitches in this example, compared with a situation where the solder balls are used. Therefore, this example can contribute to miniaturization of semiconductor apparatuses.

Furthermore, because of low resistance of the wirings formed on the wiring substrates 100A, 200, the chip embedded substrate according to this example has an advantage of reliable electrical connection.

EXAMPLE 11

Figure 11:
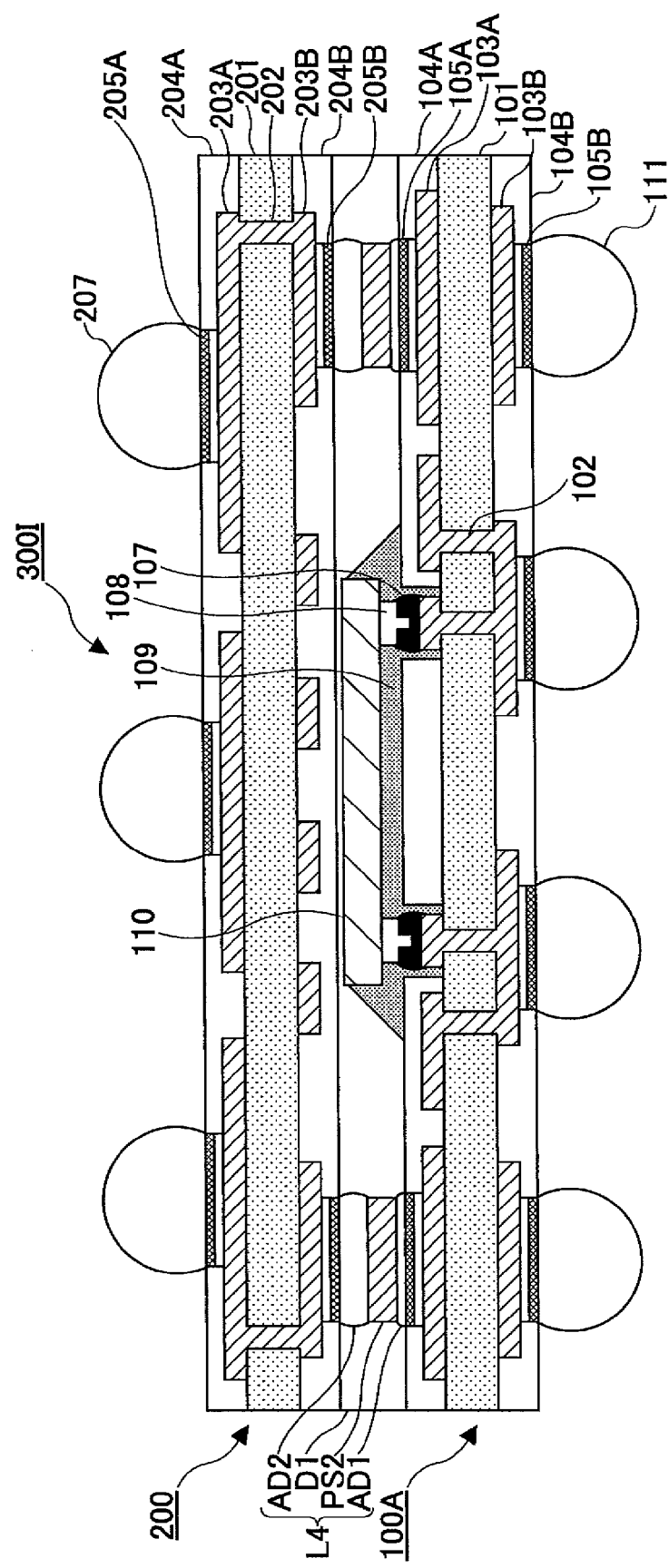
FIG. 11 illustrates a chip embedded substrate according to an eleventh example of the present invention.

FIG. 11 illustrates a chip embedded substrate 300I according to an eleventh example of the present invention. Referring to FIG. 11, posts PS2 corresponding to the posts PS1 in the chip embedded substrate 300H of the tenth example are employed and connection layers AD2 made of, for example, a solder are formed between the posts PS2 and the connection layers 205B. The connection layers AD2 can be formed in the same manner as the connection layers AD1.

In the above configuration, encapsulating connection layer L4 corresponding to the encapsulating layer L1 of the first example includes the insulation layer D1, the posts PS2, and the connection layers AD1, AD2. Namely, connection layers made of a solder are formed on both surfaces of the posts PS2 in this configuration.

Addition of the connection layers made of a solder leads to a reliable electrical connection.

Figure 12:
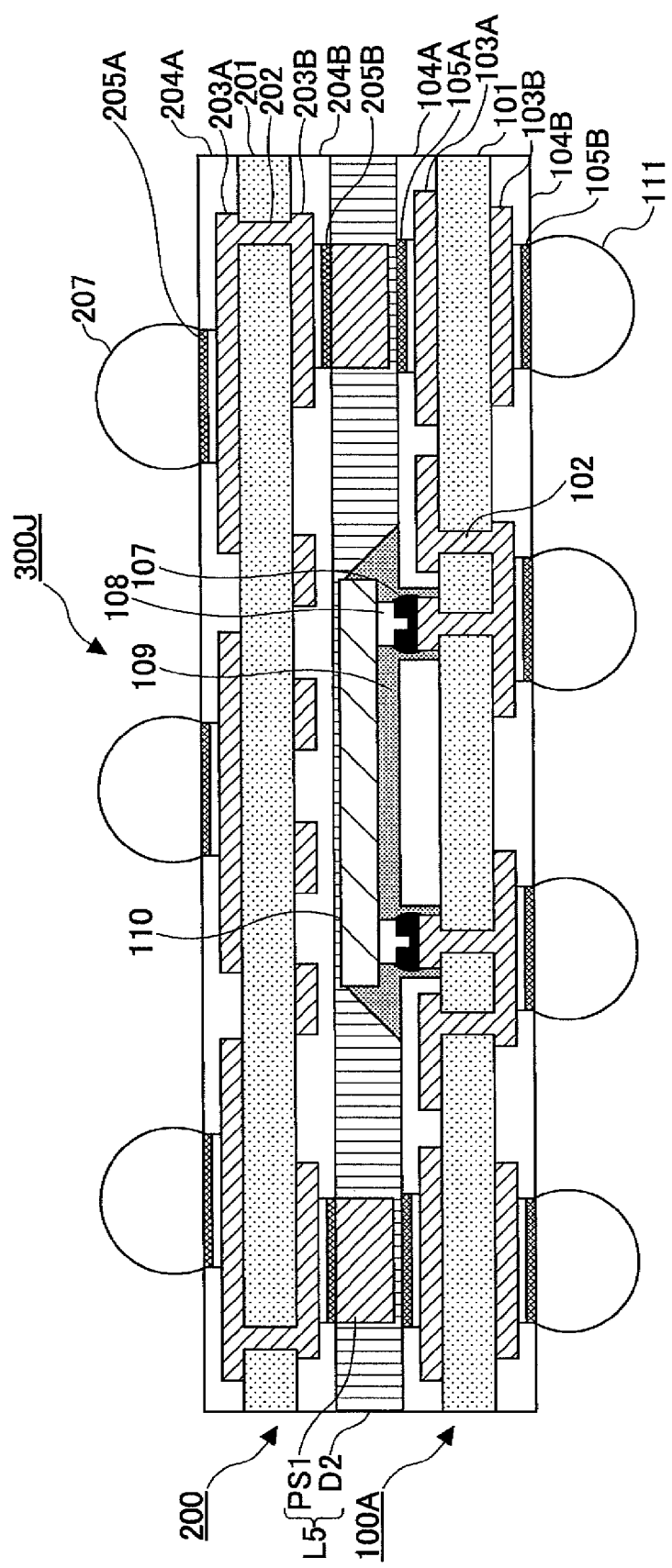
FIG. 12 illustrates a chip embedded substrate according to a twelfth example of the present invention.

FIG. 12 illustrates a chip embedded substrate 300J according to a twelfth example of the present invention. Referring to FIG. 12, the chip embedded substrate 300J according to this example does not include the connection layers AD1 of the chip embedded substrate 300H. Additionally, instead of the insulation layer D1, a connection layer D2 made of an anisotropic conductive material is formed in the chip embedded substrate 300J. In this configuration, electrical connection between the posts PS1 and the connection layers 105A is made also by the connection layer D2. An encapsulating connection layer L5 corresponding to the encapsulating connection layer L3 of the first example includes the connection layer D2 and the posts PS1 in this configuration.

Such a configuration has an advantage of facilitating the production of the chip embedded substrate 300J. For example, the electrical connection between the posts PS1 and the connection layers 105A is made possible by inserting (pushing) the posts PS1 into the connection layer D2, which eliminates the necessity of thermocompression bonding or ultrasonic bonding for connecting the posts PS1 and the connection layers 105A, thereby simplifying production procedures. By the way, the posts PS1 may be formed on the connection layers 105A.

EXAMPLE 13

Figure 13:
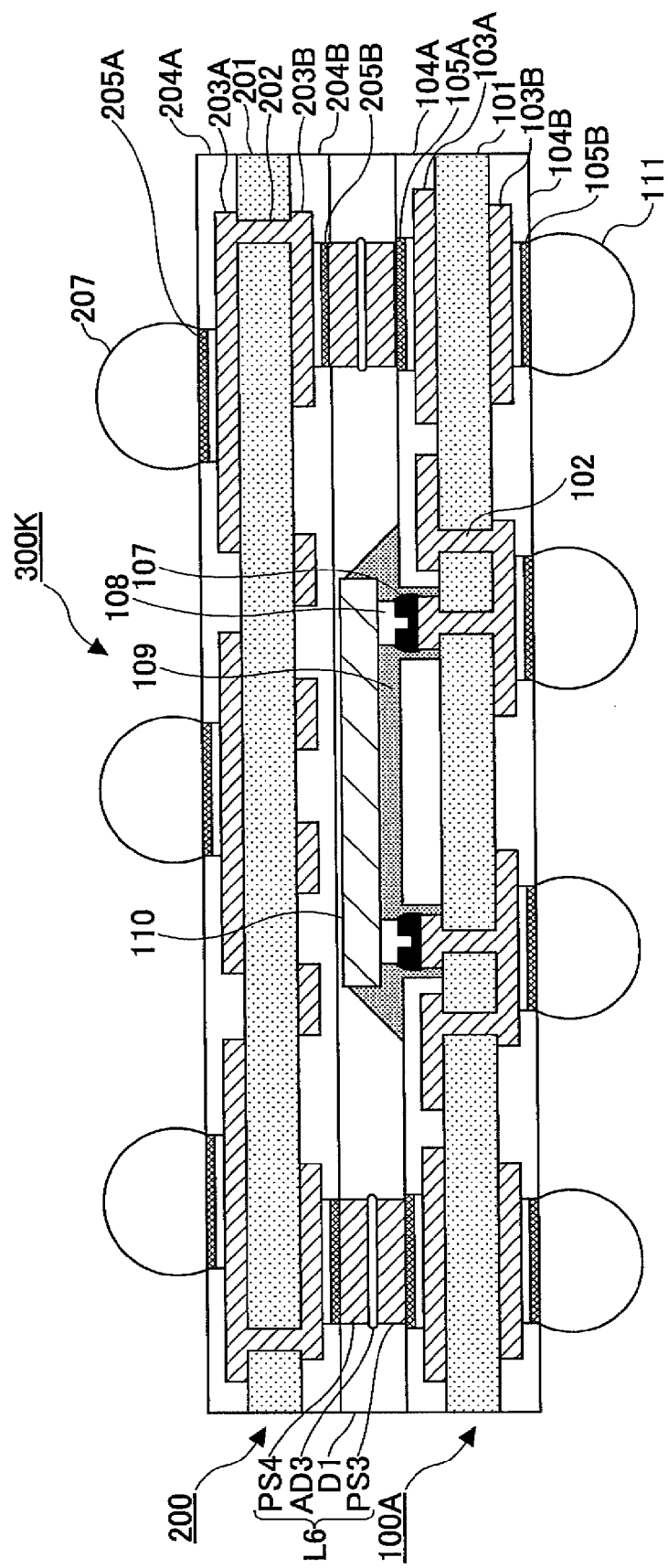
FIG. 13 illustrates a chip embedded substrate according to a thirteenth example of the present invention.

FIG. 13 illustrates a chip embedded substrate 300K according to a thirteenth example of the present invention. Referring to FIG. 13, posts PS3 and posts PS4 are formed on the connection layers 105A and the connection layers 205B, respectively, in the chip embedded substrate 300K of this example. In addition, connection layers AD3 are formed between the posts PS3 and the posts PS4.

The posts PS3, PS4 can be formed, for example, by electroplating. In the above configuration, an encapsulating connection layer L6 corresponding to the encapsulating connection layer L1 of the first example includes the insulation layer D1, the posts PS3, PS4, and the connection layers AD3.

As stated, the posts that electrically connect the wirings formed on the wiring substrate 100A and the wirings formed on the wiring substrate 200 may be formed on both the wiring substrate 100A and the wiring substrate 200.

EXAMPLE 14

Figure 14:
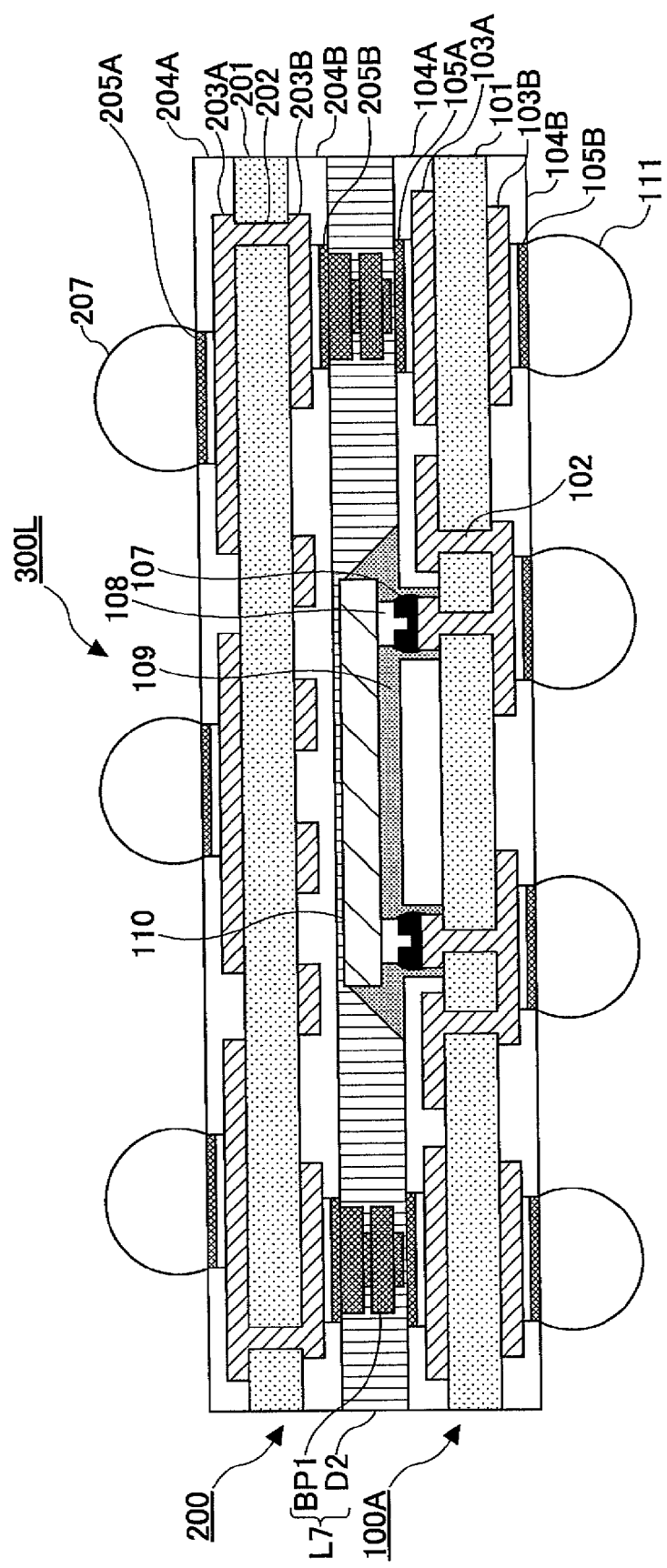
FIG. 14 illustrates a chip embedded substrate according to a fourteenth example of the present invention.

FIG. 14 illustrates a chip embedded substrate 300L according to a fourteenth example of the present invention. Referring to FIG. 14, the chip embedded substrate 300L has a configuration where the posts PS1 are replaced with bumps BP1 in the chip embedded substrate 300J of the twelfth example.

In the above configuration, the electrical connection between the bumps BP1 and the connection layers 105A is ensured by the connection layer D2 made of an anisotropic conductive material. An encapsulating connection layer L7 corresponding to the encapsulating connection layer L5 of the twelfth example includes the connection layer D2 and the bumps BP1.

The above configuration can provide an advantage of simplified production procedures of the chip embedded substrate 300L, in addition to the advantage exhibited by the twelfth example. For example, the bumps BP1 are formed by stacking plural (for example, two) bumps which are formed of bonding wires made of Au or the like using a wire-bonding process, which eliminates the necessity of a rather complicated (chemical-requiring) process such as electroplating, thereby reducing production costs. By the way, the bumps BP1 may be formed on the connection layers 105A.

EXAMPLE 15

Figure 15:
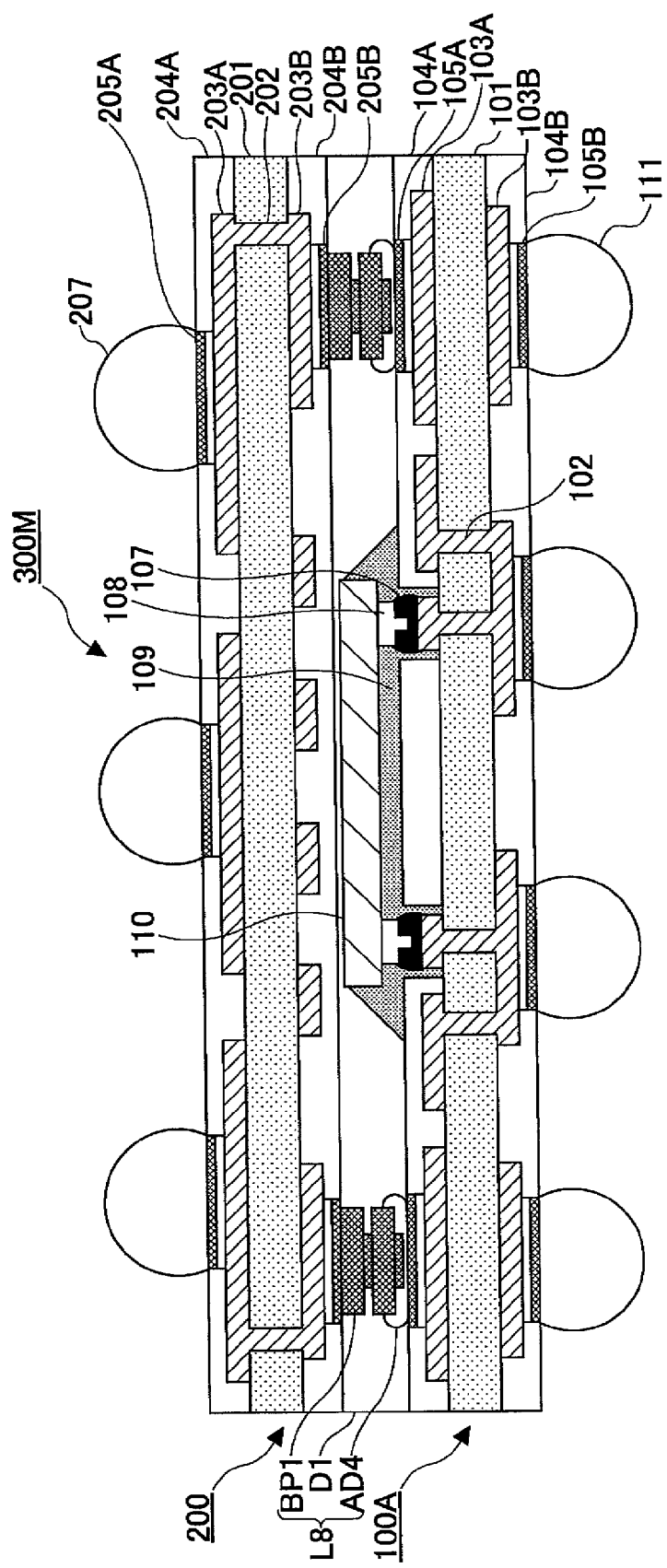
FIG. 15 illustrates a chip embedded substrate according to a fifteenth example of the present invention.

FIG. 15 illustrates a chip embedded substrate 300M according to a fifteenth example of the present invention. Referring to FIG. 15, in the chip embedded substrate 300M, the insulation layer D1 is employed in place of the connection layer D2 in the chip embedded substrate 300L of the fourteenth example. In this case, the electrical connection between the bumps BP1 and the connection layers 105A is ensured by connection layers AD4 made of, for example, a solder. An encapsulating connection layer L8 corresponding to the encapsulating connection layer L1 of the first example includes the insulation layer D1, the bumps BP1, and the connection layers AD4.

In this case, resistance between the bumps BP1 and the connection layers 105A can be reduced, compared with the chip embedded substrate 300L. By the way, the bumps BP1 may be formed on the connection layers 105A and the connection layers AD4 may be formed on the connection layers 205B.

EXAMPLE 16

Figure 16:
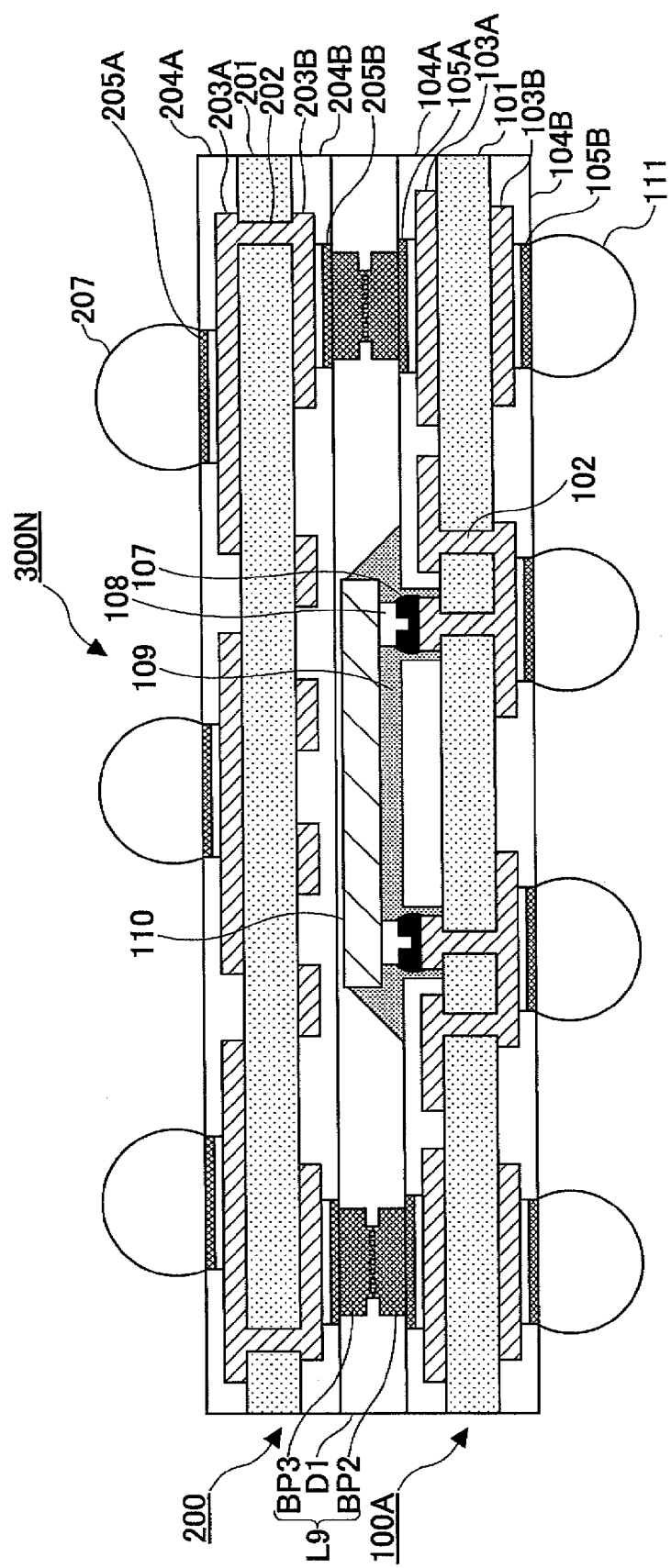
FIG. 16 illustrates a chip embedded substrate according to a sixteenth example of the present invention.

FIG. 16 illustrates a chip embedded substrate 300N according to a sixteenth example of the present invention. Referring to FIG. 16, in the chip embedded substrate 300N, bumps BP2, which are formed of bonding wires made of, for example, Au using a wire-bonding process, are disposed on the connection layers 105A; and bumps BP3, which are formed by bonding wires made of, for example, Au using a wire-bonding process, are disposed on the connection layers 205B. The bumps BP2 and the bumps BP3 are connected by, for example, thermocompression bonding or ultrasonic bonding. An encapsulating connection layer L9 corresponding to the encapsulating connection layer L1 of the first example includes the insulation layer D1 and the bumps BP2, BP3.

The bumps for electrically connecting the wirings formed on the wiring substrate 100A and the wirings formed on the wiring substrate 200 may be formed on both the wiring substrate 100A and the wiring substrate 200.

EXAMPLE 17

As described above, use of (Cu) posts can make narrower the pitches of the wirings than use of solder balls when two wiring substrates are connected. In order to further reduce the pitches, the following configuration of the chip embedded substrate, for example, is more advantageous. In the following configuration, posts for connecting two wiring substrates can be placed at narrower pitches.

Figure 17:
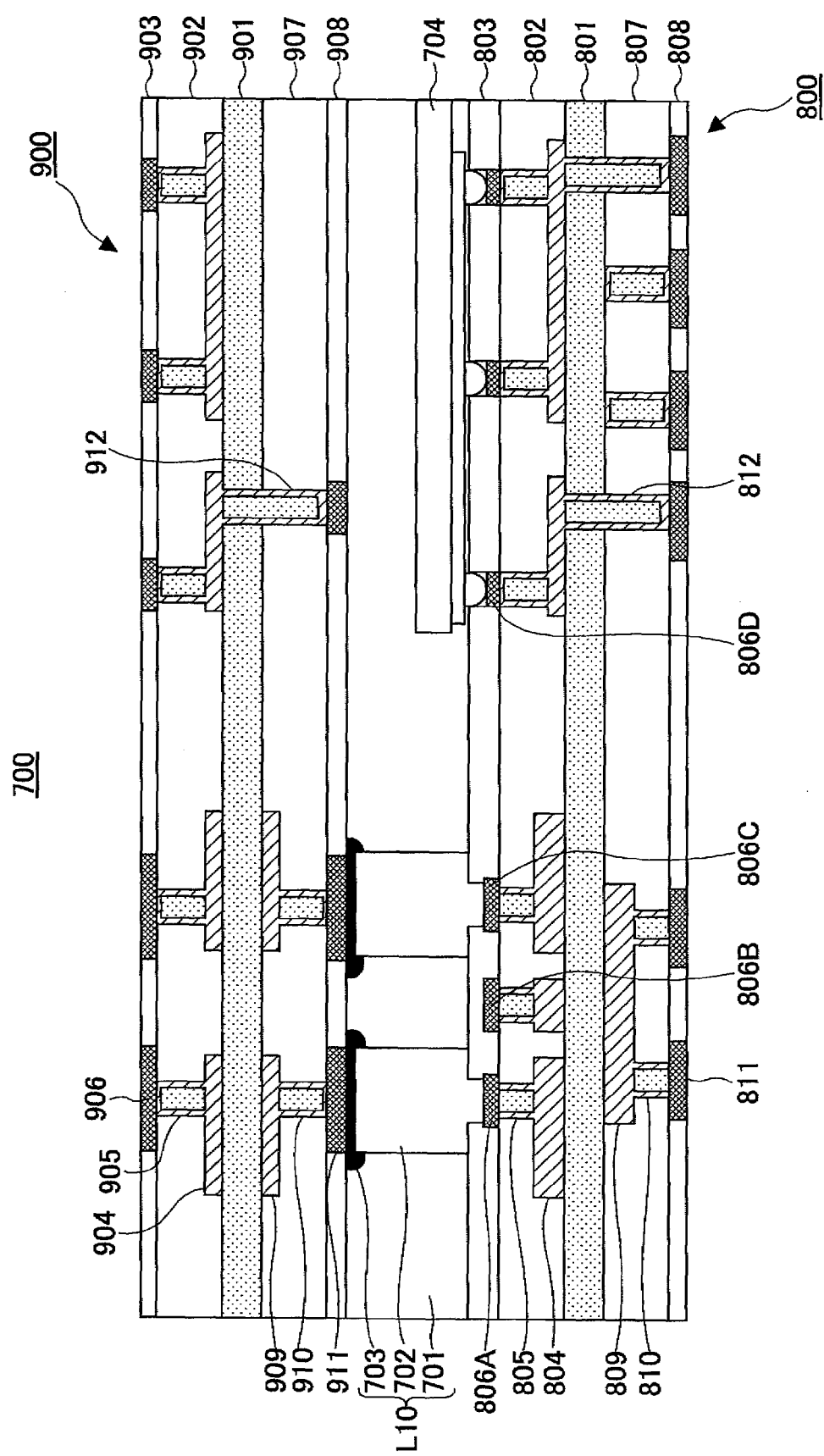
FIG. 17 illustrates a chip embedded substrate according to a seventeenth example of the present invention.

Referring to FIG. 17, an example of the above wiring substrate is explained.

FIG. 17 illustrates a chip embedded substrate 700 according to a seventeenth example of the present invention. Referring to FIG. 17, the chip embedded substrate 700 according to this example is configured so as to include an encapsulating connection layer L10 disposed between the wiring substrate 800 on which a semiconductor chip 704 is flip-chip mounted and a wiring substrate 900 disposed above the wiring substrate 800.

The encapsulating connection layer L10 includes an insulation layer 701 corresponding to the insulation layer D1, posts 702 corresponding to the posts PS1, and connection layers 703 made of a solder. The encapsulating connection layer L10 encapsulates the semiconductor ship 704 mounted on the wiring substrate 800 and connects the wirings formed on the wiring substrate 800 and the wirings formed on the wiring substrate 900.

The wiring substrate 800 is configured so as to have the wirings formed on both surfaces of a core substrate 801 made of, for example, a prepreg material. Patterned wirings 804 are formed on the surface of the core substrate 801, the surface on which the semiconductor chip 704 is mounted (referred to as an upper surface, hereinafter). In addition, an insulation layer (a build-up layer) 802 is formed so as to cover the patterned wirings 804. Moreover, an insulation layer (a solder resist layer, or build-up layer) 803 is formed on the insulation layer 802.

In the insulation layer 802, via plugs 805 are formed so as to be connected to the patterned wirings 804. To the via plugs 805 are connected uppermost patterns 806A through 806D. An insulation layer 803 is formed so as to cover the uppermost patterns. In addition, openings are formed in the insulation layer 803 so as to allow portions of the uppermost patterns 806A through 806D to be exposed therethrough. The openings are located in alignment with portions where the uppermost patterns 806A through 806D are connected to the semiconductor chip 704 and the posts 702.

In addition, the semiconductor chip 704 is mounted so as to be connected to the uppermost pattern 806D. The posts 702 are formed so as to be connected to the uppermost patterns 806A through 806C, which will be described in detail below.

Additionally, patterned wirings 809 are formed on the surface of the core substrate 801, where the surface (referred to as a lower surface, hereinafter) is opposite to the surface where the semiconductor chip 704 is mounted. An insulation layer (build-up layer) 807 is formed so as to cover the patterned wirings 809. Moreover, an insulation layer (solder resist layer, or build-up layer) 808 is formed so as to cover the insulation layer 807.

In the insulation layer 807, via plugs 810 are formed so as to be connected to the patterned wiring 809. In addition, via plugs 812 are formed so as to be connected to the patterned wirings 804, pass through the core substrate 801, and extend through the insulation layer 807. Moreover, electrode pads 811 are formed so as to be connected to the via plugs 810 or the via plugs 812. The peripheral sides of the electrode pads 811 are surrounded by the insulation layer 808.

On the other hand, the wiring substrate 900 is configured so as to have wirings formed on both surfaces of a core substrate made of, for example, a prepreg material. Patterned wirings 904 are formed on the surface of the core substrate 901, where this surface (referred to as an upper surface) is opposite to a surface facing the semiconductor chip 704. In addition, an insulation layer (build-up layer) 902 is formed so as to cover the patterned wirings 904. Moreover, an insulation layer (solder resist layer or build-up layer) 903 is formed on the insulation layer 902.

In the insulation layer 902, via plugs 905 are formed so as to be connected to the patterned wirings 904. To the via plugs 905 are connected electrode pads 906 whose peripheral sides are surrounded by the insulation layer 903.

In addition, patterned wirings 909 are formed on the surface of the core substrate 901, where this surface (referred to as a lower surface) faces the semiconductor chip 704. An insulation layer (build-up layer) 907 is formed so as to cover the patterned wirings 909. Moreover, an insulation layer (solder resist layer or build-up layer) 908 is formed so as to cover the insulation layer 907.

In the insulation layer 907, via plugs 910 are formed so as to be connected to the patterned wirings 909. In addition, a via plug 912 is formed so as to be connected to the patterned wirings 904, pass through the core substrate 901, and extend through the insulation layer 907. Moreover, electrode pads 911 are formed so as to be connected to the via plugs 910 or the via plug 912. The peripheral sides of the electrode pads 911 are surrounded by the insulation layer 908. Furthermore, some of the electrode pads 911 are connected to the posts 702 via the connection layers 703.

The chip embedded substrate 700 is characterized in that the wiring structure on the upper surface of the wiring substrate 800 is configured to be multilayered and in that the uppermost patterns of the multilayered structure (uppermost patterns 806A through 806C) and the insulation layer covering the uppermost patterns can be arranged at narrower pitches.

Figure 18:
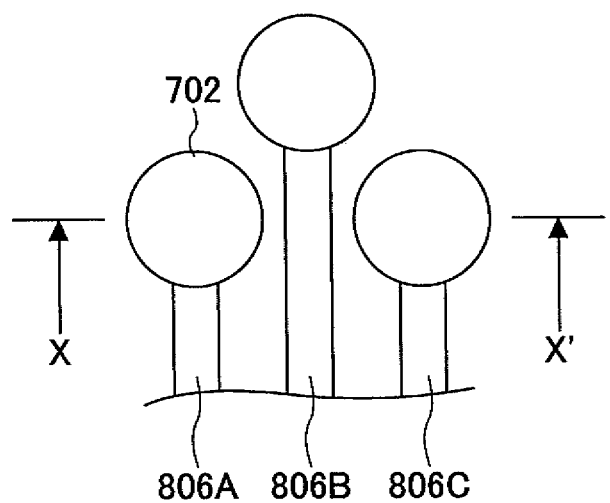
FIG. 18 illustrates connection portions of the chip embedded substrate according to the seventeenth example of the present invention.

FIG. 18 is a plan view illustrating the uppermost patterns 806A through 806C in a planar relationship to the posts 702 formed so as to be connected to the uppermost patterns 806A through 806C. Referring to FIG. 18, extending lengths of the uppermost patterns 806A through 806C, which are arranged adjacently, are appropriately adjusted in this example. Specifically, a long uppermost pattern and a short uppermost pattern are alternately arranged. Because of this arrangement, the posts 702 connected to the uppermost patterns 806A through 806C are arranged in a staggered way when seen from above (in plan view).

In addition, portions of the uppermost patterns 806A through 806C are covered by the insulation layer 803, where these portions are not connected to the posts 702. Namely, it is clearly understood from FIG. 17, which is a cross-sectional view taken along a line X-X' of FIG. 18, that the upper surface of the uppermost pattern 806B is covered by the insulation layer 803.

Since the chip embedded substrate 700 has the above configuration, the posts 702 can be arranged at narrower pitches. In other words, since the uppermost conductive patterns that are connected to the posts can be changed depending on the design and the portions of the patterns which are not connected to the posts are covered by the insulation layer (solder resist layer), narrower pitches of connection structures become possible.

Referring to FIGS. 19A through 19E, an example of a production method of the chip embedded substrate 700 is described.

Figure 19A:
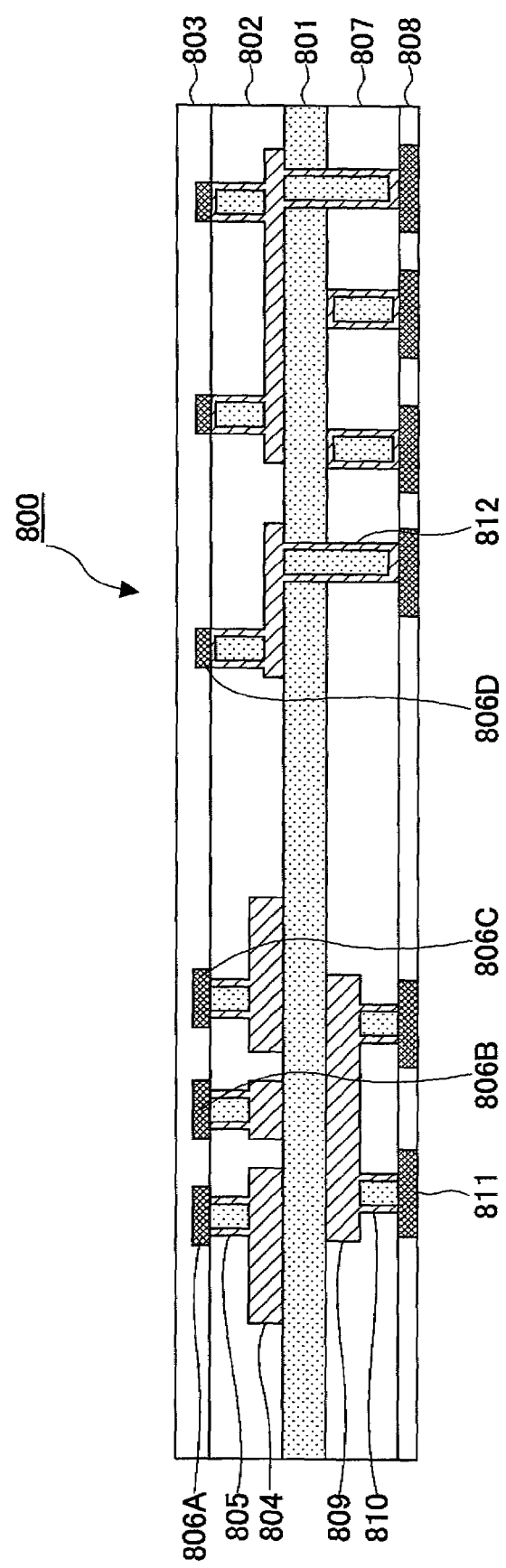
FIG. 19A illustrates one process step of a production method of the chip embedded substrate illustrated in FIG. 17.

First, in a process step shown in FIG. 19A, a known method, such as a semi-additive method, is employed to form the wiring substrate 800. For example, a surface of the prepreg material on which a copper foil is adhered is etched into patterns to form the patterned wirings 804, 809. Next, the via plugs 805, 810, 812, the electrode pads 811, and the uppermost patterns 806A through 806D are formed, for example, by the Cu electroplating method. At this stage, the uppermost patterns 806A through 806D are entirely covered by the insulation layer 803.

Figure 19B:
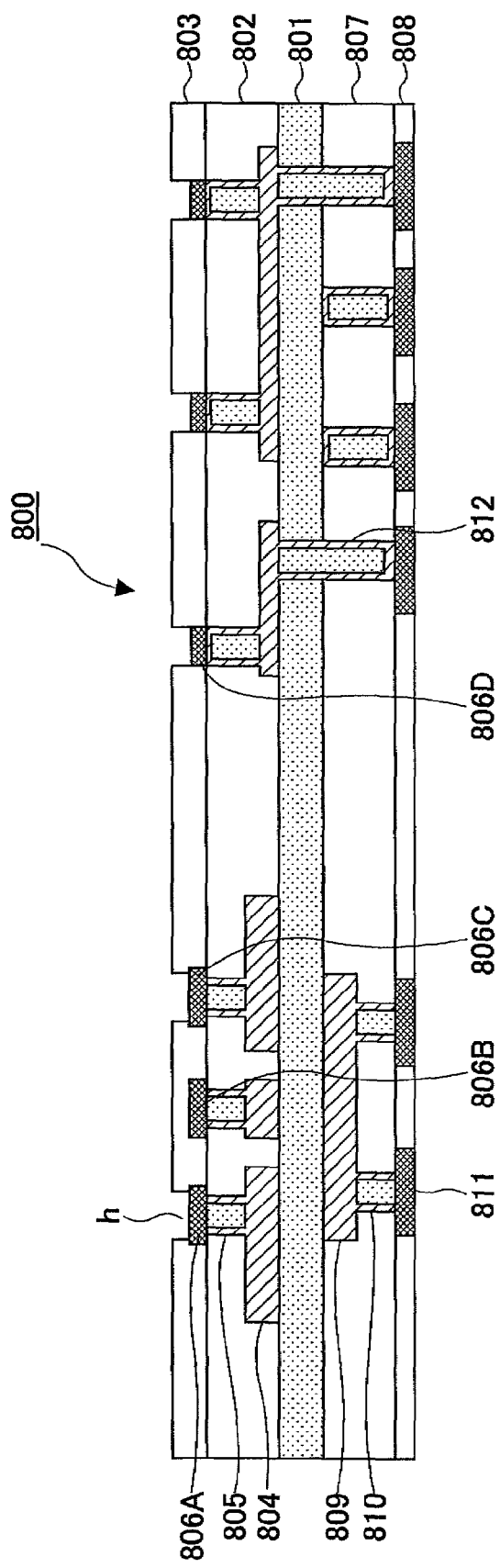
FIG. 19B illustrates another process step of the production method of the chip embedded substrate illustrated in FIG. 17.

Next, in a process step shown in FIG. 19B, openings h, which pass through the insulation layer 803 to reach the uppermost patterns 806A through 806D, are made by, for example, a laser. By the way, an opening to reach the uppermost pattern 806B is not shown in FIG. 19B. This is because the openings h corresponding to 806A through 806D are arranged in a staggered way when seen from the above. Namely, the uppermost pattern 806B is covered by the insulation layer 803 in the cross-sectional view of FIG. 19B.

Figure 19C:
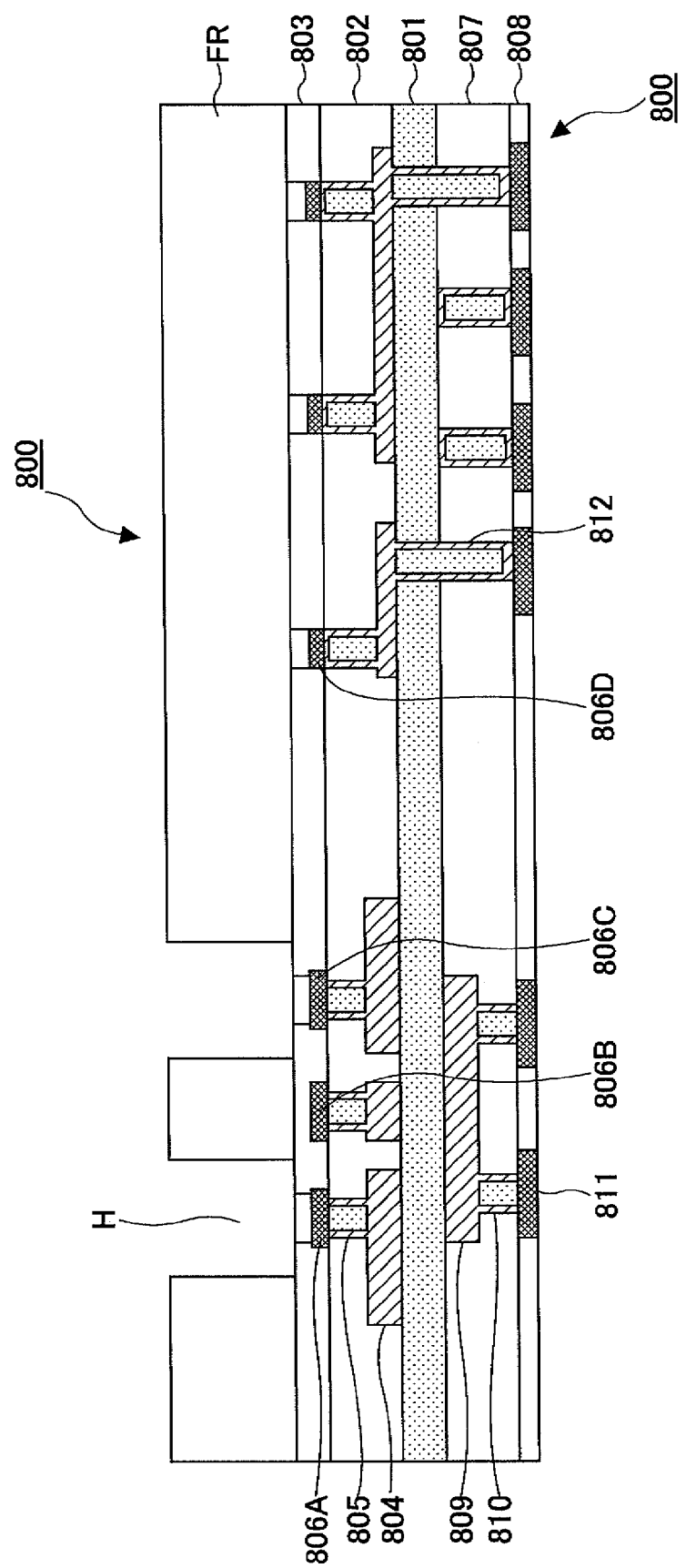
FIG. 19C illustrates another process step of the production method of the chip embedded substrate illustrated in FIG. 17.

Next, in a process step shown in FIG. 19C, a resist layer FR is applied or adhered onto the insulation layer 803. Then, the resist layer FR is patterned so as to make openings H at positions corresponding to the openings h where the uppermost patterns 806A through 806C are exposed therethrough.

Figure 19D:
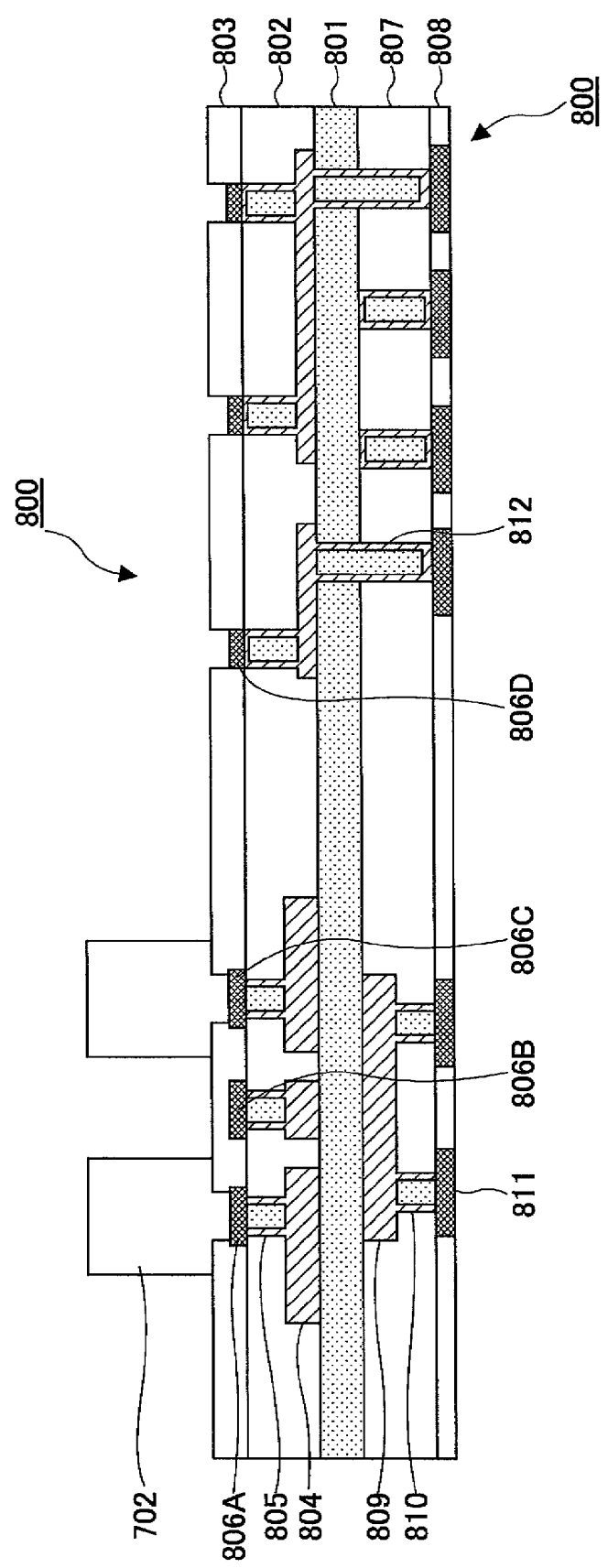
FIG. 19D illustrates another process step of the production method of the chip embedded substrate illustrated in FIG. 17.

Next, in a process step shown in FIG. 19D, the posts 702 are made in the openings h, H by, for example, a Cu electroplating method. Then, the resist layer FR is removed.

Figure 19E:
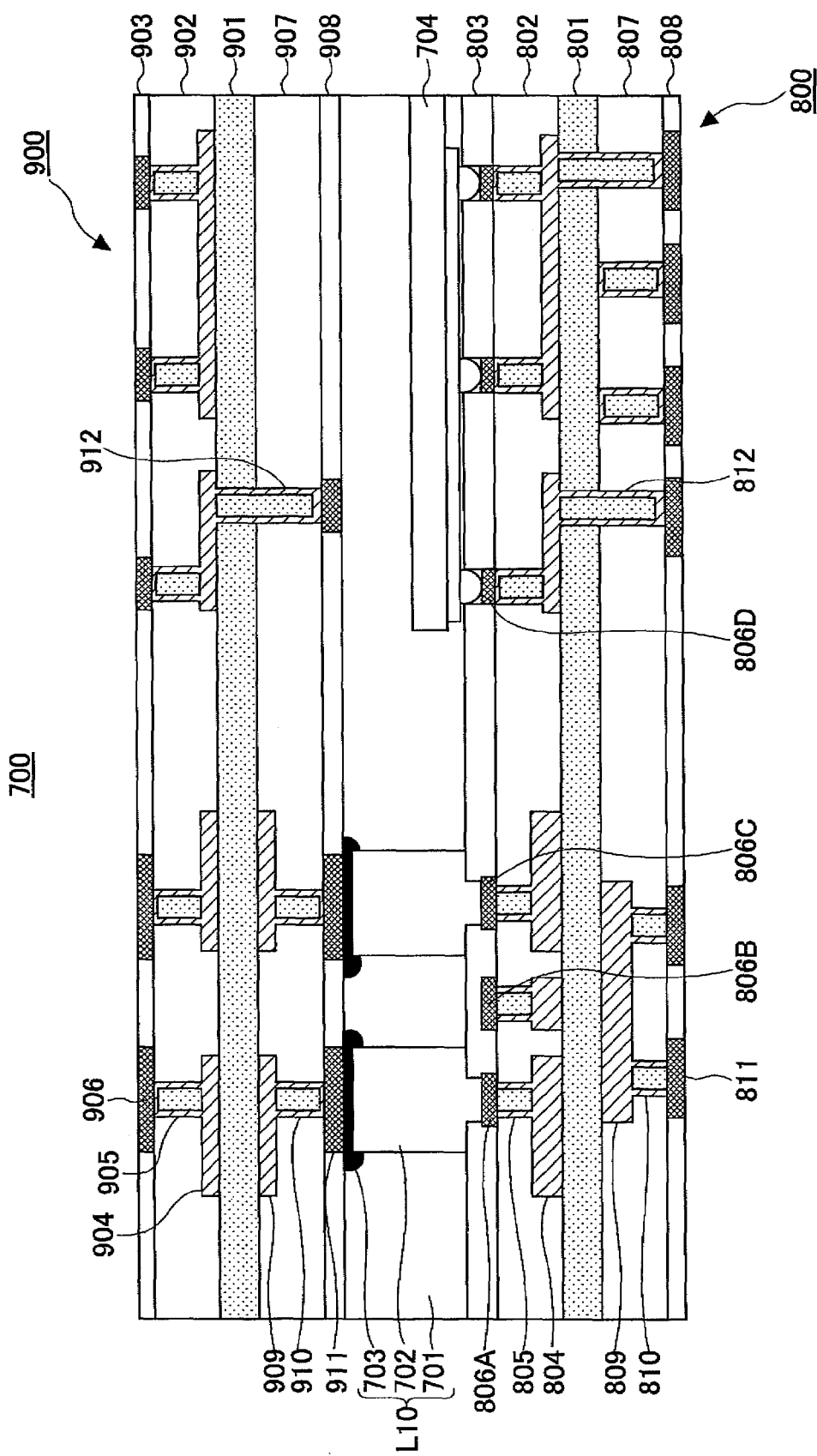
FIG. 19E illustrates another process step of the production method of the chip embedded substrate illustrated in FIG. 17.

Next, in a process step shown in FIG. 19E, the semiconductor chip 704 is flip-chip mounted so as to be connected to the uppermost pattern 806D and then encapsulated by the insulation layer 701. On the wiring substrate 800 is joined the wiring substrate 900. At this time, the connection layer 703 made of, for example, a solder is formed between the posts 702 and the electrode pads 911. In this manner, the wiring substrate 800 and the wiring substrate 900 are electrically connected and the semiconductor chip 704 is encapsulated. Thus, the chip embedded substrate 700 is obtained.

According to the above production method, a semiconductor apparatus having a finely arranged wiring structure can be manufactured in response to demands for narrower pitches of the connection wirings.

In addition, the configurations of the eighth through the seventeenth examples are applicable to the chip embedded substrate employing the built-up substrate or made by the built-up method, as is the case with the chip embedded substrates 300D of the fifth example (FIG. 5P) and 300E of the sixth example (FIG. 6E).

Moreover, although the solder balls are formed as external connection terminals of the chip embedded substrate in the above examples, the chip embedded substrate may be configured without the solder balls. Taking the first example (FIG. 1F) as an example here, the solder balls 111, 207 can be omitted. In this case, the connection layers 105B, 205A serve as the external connection terminals.

Furthermore, although only a portion corresponding to one chip embedded substrate is illustrated in the above examples, plural chip embedded substrates can be simultaneously manufactured using, for example, a large size substrate. Namely, the examples of the present invention are not limited to joining substrates having a size corresponding to a single chip embedded substrate. For example, plural chip embedded substrates may be simultaneously manufactured using large size substrates and then the large size substrates having sizes corresponding to the plural chip embedded substrates may be separated into individual chip embedded substrates by a dicing process.

In this case, substrates of various sizes can be combined in various ways to manufacture the chip embedded substrates, as described below. In the following explanation, the wiring substrate 100A and the wiring substrate 200 can be used as a first substrate and a second substrate, respectively.

First, as a first instance, individual first substrates and individual second substrates are stacked (joined) to obtain the chip embedded substrates. In this case, the substrates are not required to be separated, basically.

Next, as a second instance, there is the following method: First, plural first substrates are produced on a large size substrate (or a large size substrate made on the support substrate). Then, individual second substrates are stacked (joined) on the corresponding plural first substrates produced on the large size substrate. Next, the large size substrate is severed so as to separate the plural first substrates. Thus, plural chip embedded substrates are obtained.

Next, as a third instance, there is the following method: First, plural second substrates are produced on a large size substrate (or a large size substrate made on the support substrate). Then, individual first substrates are stacked (joined) on the plural second substrates produced on the large size substrate. Next, the large size substrate is severed so as to separate the plural second substrates. Thus, plural chip embedded substrates are obtained.

Next, as a fourth instance, there is the following method: First, plural first substrates are produced on a first large size substrate (or a large size substrate made on the support substrate). Similarly, plural second substrates are produced on a second large size substrate (or a large size substrate made on the support substrate). Then, the first large size substrate and the second large size substrate are stacked on each other so that the first substrates are stacked on the corresponding second substrates. Next, the first large size substrate and the second large size substrate joined together are severed so as to separate the first and the second substrates. Thus, plural chip embedded substrates are obtained.

As stated, the above production methods enable production of the chip embedded substrates by combining variously sized substrates.

EXAMPLE 18

When the semiconductor chip is flip-chip mounted, shapes of underfills and the methods for forming the underfills may be changed variously. As shown in FIG. 1C of the first example, a resin material (for example, a liquid resin) called an underfill is supplied and hardened between the semiconductor chip and the substrate, which has been widely carried out.

However, since the wiring substrates are subject to a repetition of heating and cooling after the underfill is formed, there may be caused warpage in the underfill (the wiring substrates) due to differences in thermal history, thermal expansion coefficients, or sheer stress between the underfill and the materials around the underfill.

In order to prevent warpage of the wiring substrates that is caused by the underfill, an area (volume) where the underfill is formed may be reduced as described below.

Figure 20:
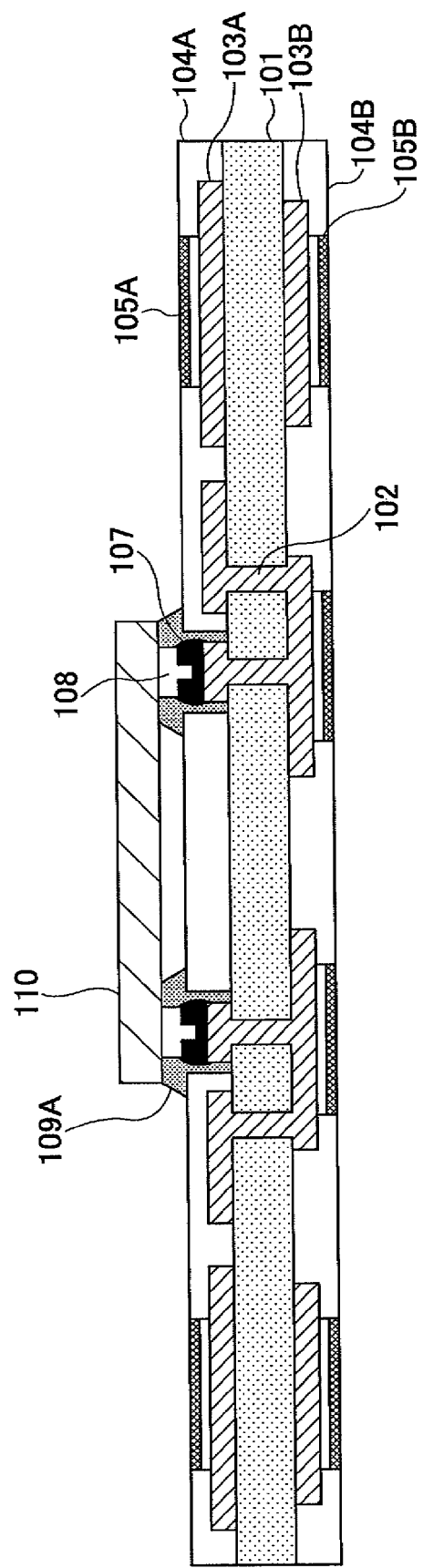
FIG. 20 illustrates one process step of a production method of a chip embedded substrate according to an eighteenth example.

For example, in the production method shown as the first example, a process step shown in FIG. 20 can be carried out instead of the process step shown in FIG. 1C. Referring to FIG. 20, an underfill 109A is supplied not entirely between the semiconductor chip 110 and the wiring substrate but to the four bumps 108 of the semiconductor chip 110 and their vicinity. Therefore, the area (volume) where the underfill is formed becomes smaller, thereby preventing warpage of the wiring substrate caused by the underfill.

Figure 21A:
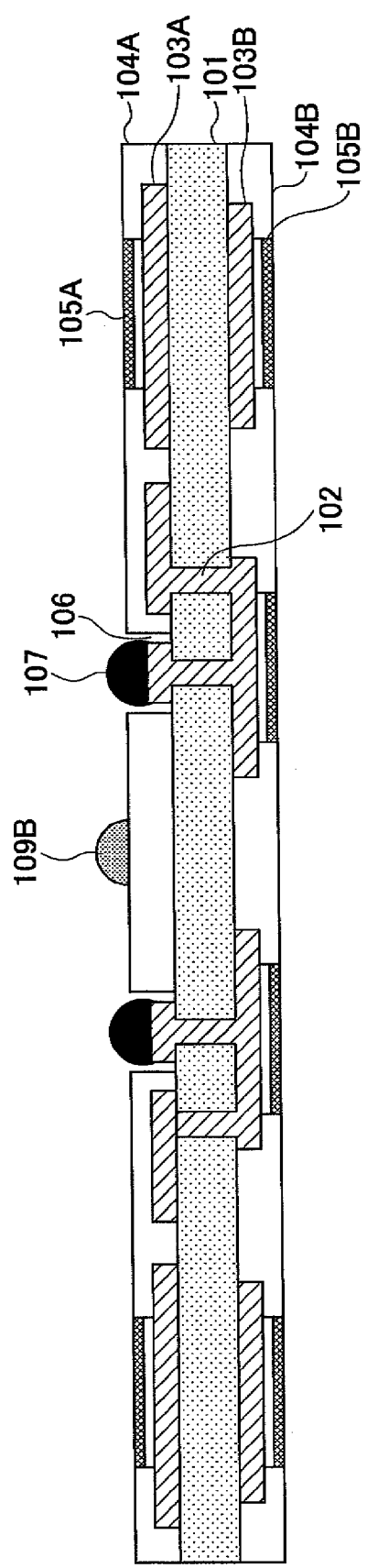
FIG. 21A illustrates another process step of the production method of the chip embedded substrate according to the eighteenth example.

In addition, the underfill may be formed at and around the center of the semiconductor chip. In this case, processes shown in FIGS. 21A and 21B may be carried out instead of the process step shown in FIG. 20.

First, a liquid resin (underfill) 109B is dispensed by potting in the center of the portion where the semiconductor chip is to be mounted on the solder resist layer 104A of the wiring substrate. Then, the semiconductor chip 101 is mounted in a process step shown in FIG. 21B. Therefore, the underfill 109B is formed only in and around the center of the semiconductor chip 101.

EXAMPLE 19

The electrically conductive members (for example, solder balls) used for joining two wiring substrates may be placed on the substrate on which the semiconductor chip is mounted, or the substrate that is joined on the substrate on which the semiconductor chip is mounted.

For example, in the case of the first example, the electrically conductive members are disposed on the wiring substrate that is joined onto the wiring substrate on which the semiconductor chip is mounted. FIG. 22 is an explanatory view for describing in detail the process step shown in FIG. 1E of the first example. Namely, FIG. 22 illustrates the process of joining the wiring substrate 100A and the wiring substrate 200 in the production method of the first example.

Referring to FIG. 22, the electrical connection members (solder balls 206) are arranged on the wiring substrate 200 that is joined onto the wiring substrate 101A on which the semiconductor chip 110 is mounted.

In addition, the process step shown in FIG. 22 may be changed to a process step shown in FIG. 23. In this case, the electrical connection members (solder balls 206) are arranged on the wiring substrate 100A on which the semiconductor chip 110 is mounted.

When the two wiring substrates are joined, either the wiring substrate on which the semiconductor chip is mounted or the wiring substrate that is to be joined onto the wiring substrate on which the semiconductor chip is mounted may be placed below (or above) the other wiring substrate.

Figure 24:
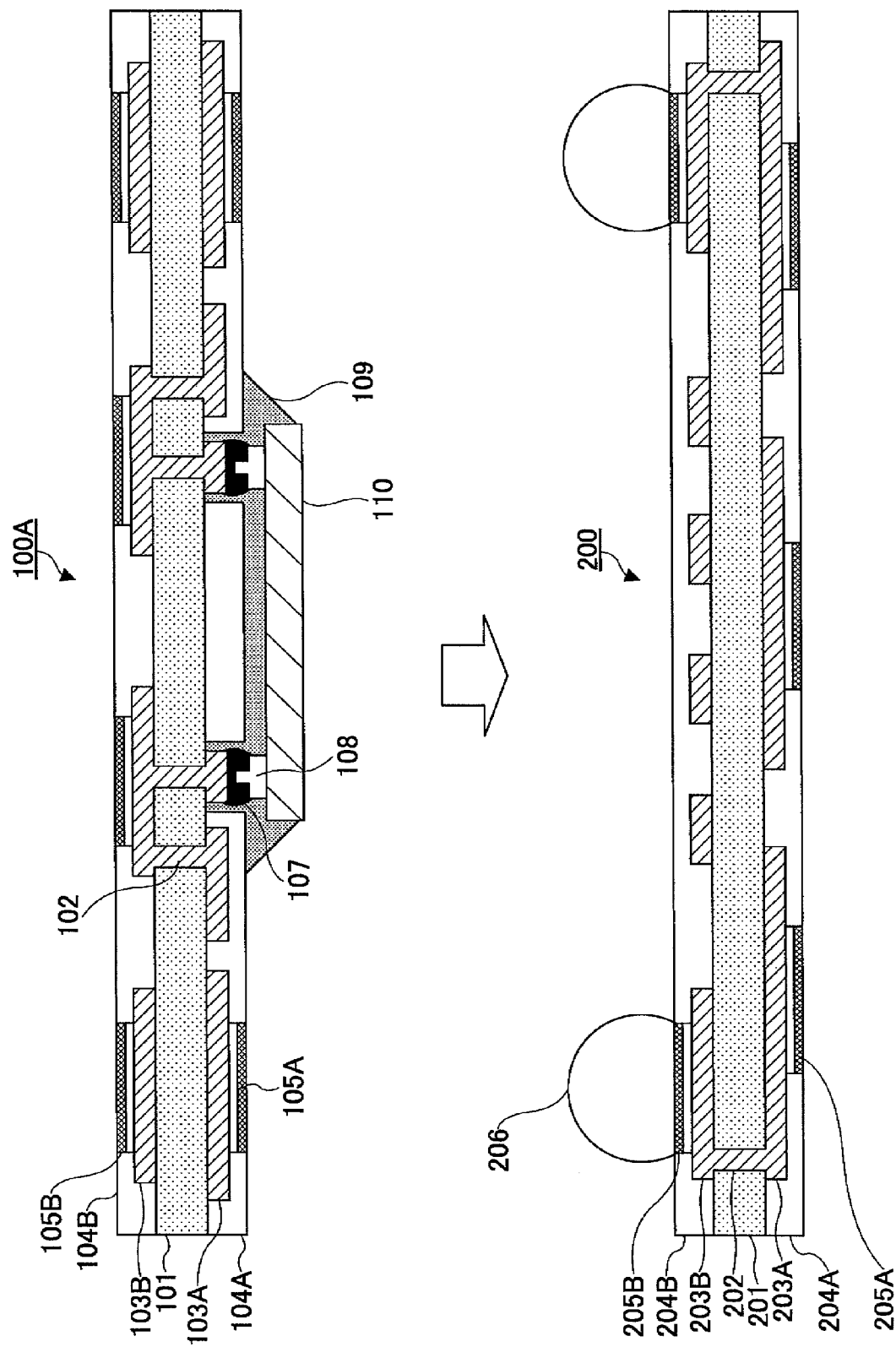
FIG. 24 illustrates another process step of the wiring substrate joining method.

As shown in FIG. 24, for example, the wiring substrate 100A, which is disposed below the wiring substrate 200 in the step shown in FIG. 22, can be placed above and thus joined down onto the wiring substrate 200 disposed, for example, on a work table. In this case, the electrical connection members (solder balls 206) are disposed on the wiring substrate 200.

In addition, as shown in FIG. 25, the wiring substrate 100A, which is disposed below the wiring substrate 200 in the step shown in FIG. 23, can be placed above and joined down on the wiring substrate 200 disposed, for example, on a work table. In this case, the electrical connection members (solder balls 206) are disposed on the wiring substrate 100k

EXAMPLE 20

In the previous examples, the semiconductor chip is mounted on the wiring substrate in a face-down manner. However, examples of the present invention are not limited to the facedown mounting. For example, the semiconductor chip may be mounted in a face-up manner.

Figure 26:
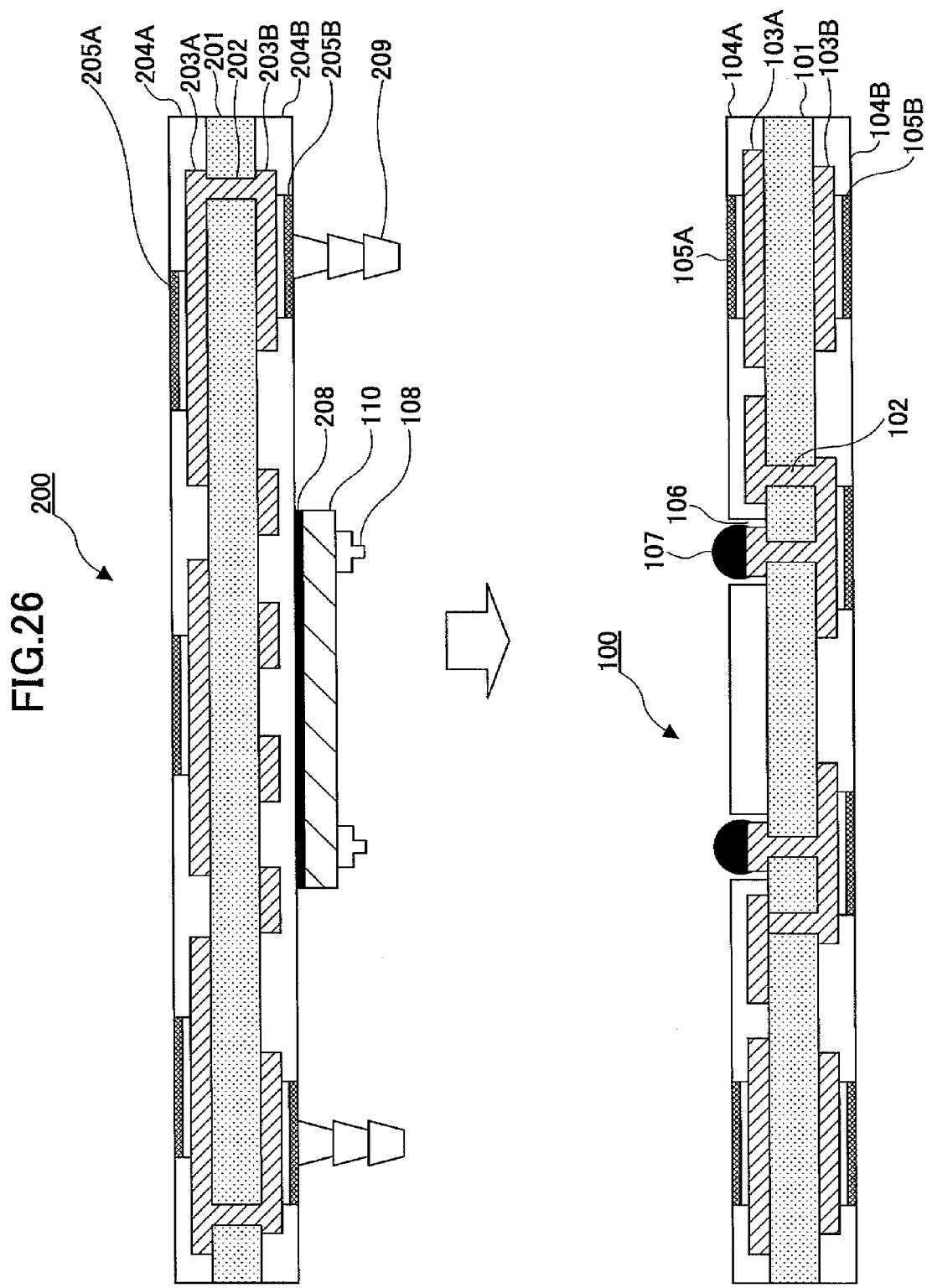
FIG. 26 illustrates one process step of a production method of a chip embedded substrate according to a twentieth example.
Figure 27:
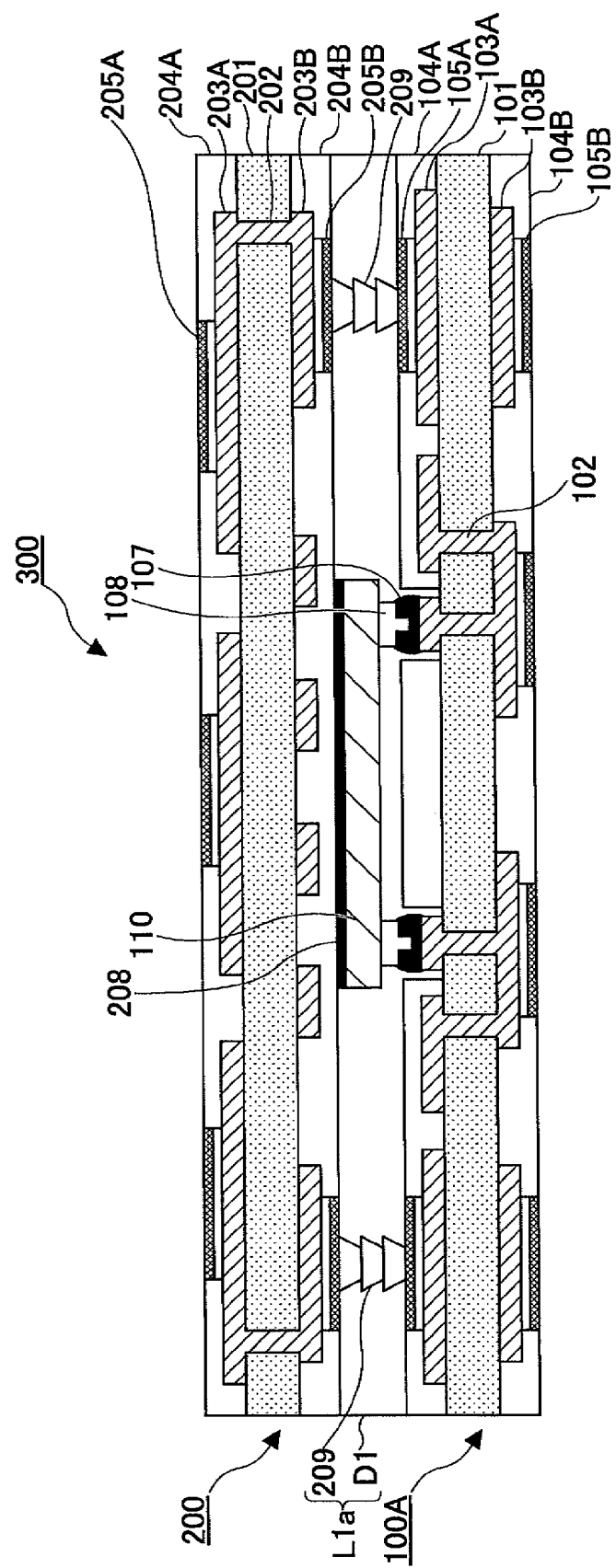
FIG. 27 illustrates another process step of the production method of the chip embedded substrate according to the twentieth example.

FIGS. 26 and 27 illustrate production methods where the semiconductor chip is mounted in a face-up manner on the wiring substrate and then the chip embedded substrate is produced. Referring to FIG. 26, the wiring substrate 100 is prepared by carrying out the processes shown in FIGS. 1A and 1B. Namely, the connection layers 107 made of, for example, are formed on portions of the patterned wirings 103A by electroplating in the wiring substrate 100 shown in FIG. 1A, where the portions are exposed through the openings 106 of the solder resist layer 104A.

In addition, the semiconductor chip 110 is adhered in a face-up manner on the wiring substrate 200 (the solder resist layer 204B) shown in FIG. 1D of the first example, using a film resin 208 (called a die-attach film, for example). On the semiconductor chip 110, the bumps (electrical connection members) 108 formed of bonding wires made of, for example, Au or the like are formed.

On the connection layers 205B (the patterned wirings 203B) of the wiring substrate 200, stacked bumps (formed of bonding wires made of, for example, Au or the like) 209 are formed in place of the solder balls 206.

Next, in a process step shown in FIG. 27, the wiring substrate 100 and the wiring substrate 200 are joined in the same manner as explained above in reference to FIG. 1E.

When the wiring substrate 200 and the wiring substrate 100 are joined, a first method or a second method in the following, for example, can be employed.

The first method is as follows: First, the wiring substrate 200 is stacked and pressed onto the wiring substrate 100 with a film-like thermosetting build-up resin (unhardened at this stage) disposed between the two substrates. In this case, the bumps (electrical connection members) 209 are forced into the film-like build-up resin so as to contact the connection layers 105A of the wiring substrate 100. At the same time, the bumps 108 are forced into the build-up resin so as to contact the connection layers 107 of the wiring substrate 100. Then, by applying heat to the two substrates, the connection layers 107 are melted, and the build-up resin is hardened by the heat so as to become the insulation layer D1. As a result, an encapsulating connection layer L1a including the insulation layer D1 and the bumps 209 is formed.

The second method is as follows: First, the wiring substrate 200 is stacked and pressed onto the wiring substrate 100. In this case, the bumps 209 of the wiring substrate 200 are pressed so as to contact the connection layers 105A of the wiring substrate 100. At the same time, the bumps 108 are pressed so as to contact the connection layers 107. By heating the two substrates, the connection layers 107 are melted. Then, the liquid resin is supplied between the wiring substrate 200 and the wiring substrate 100 and hardened to become the insulation layer D1. As a result, the encapsulating connection layer L1a including the insulation layer D1 and the bumps 209 are formed.

By joining the wiring substrate 100 and the wiring substrate 200 in the aforementioned manner, the patterned wirings 203B of the wiring substrate 200 and the patterned wirings 103A of the wiring substrate 100 are electrically connected through the bumps 209. In addition, the semiconductor chip 110 and the patterned wirings 103A of the wiring substrate 100 are electrically connected through the bumps 108.

By the way, the semiconductor chip 110 is not electrically connected to the substrate on which the semiconductor chip 110 is first mounted (disposed or adhered), namely, the wiring substrate 200 in this example. Namely, "mounting" in this example means that the semiconductor chip is attached (disposed) but does not mean that the semiconductor chip is electrically connected.

According to this example, it is not necessary to supply the underfill between the semiconductor chip and the substrate on which the semiconductor chip is mounted (disposed). Therefore, warpage of the substrate caused by the underfill can be prevented.

EXAMPLE 21

Although the above examples exemplify the bumps for connecting the semiconductor chip and the patterned wirings, the present invention are not limited to those examples. For example, the semiconductor chip and the patterned wirings may be connected by a bonding wire.

Figure 28:
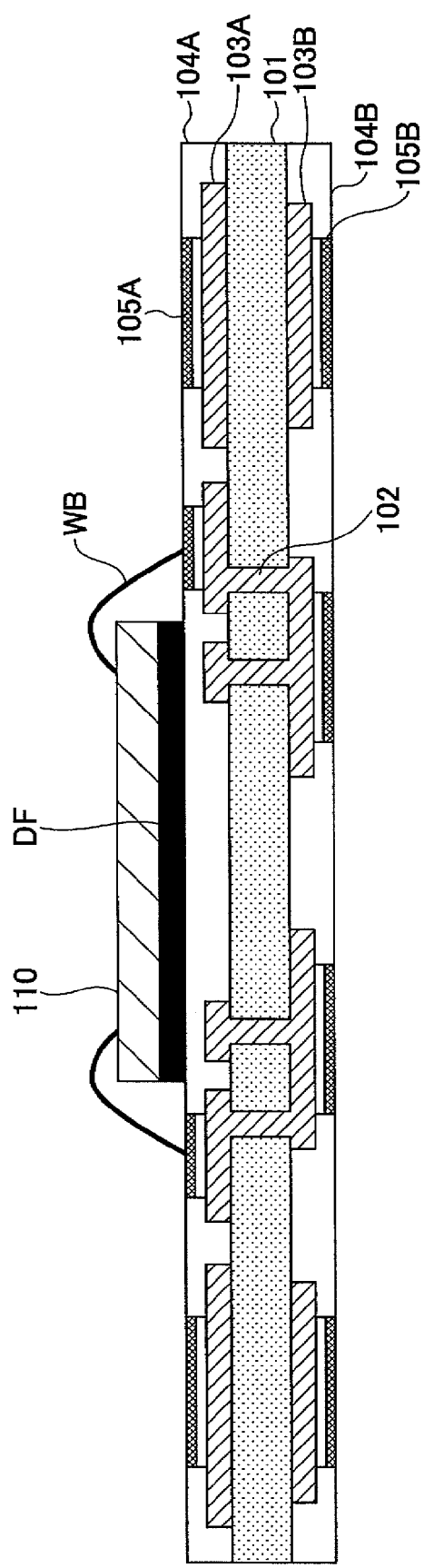
FIG. 28 illustrates one process step of a production method of a chip embedded substrate according to a twenty-first example.
Figure 29:
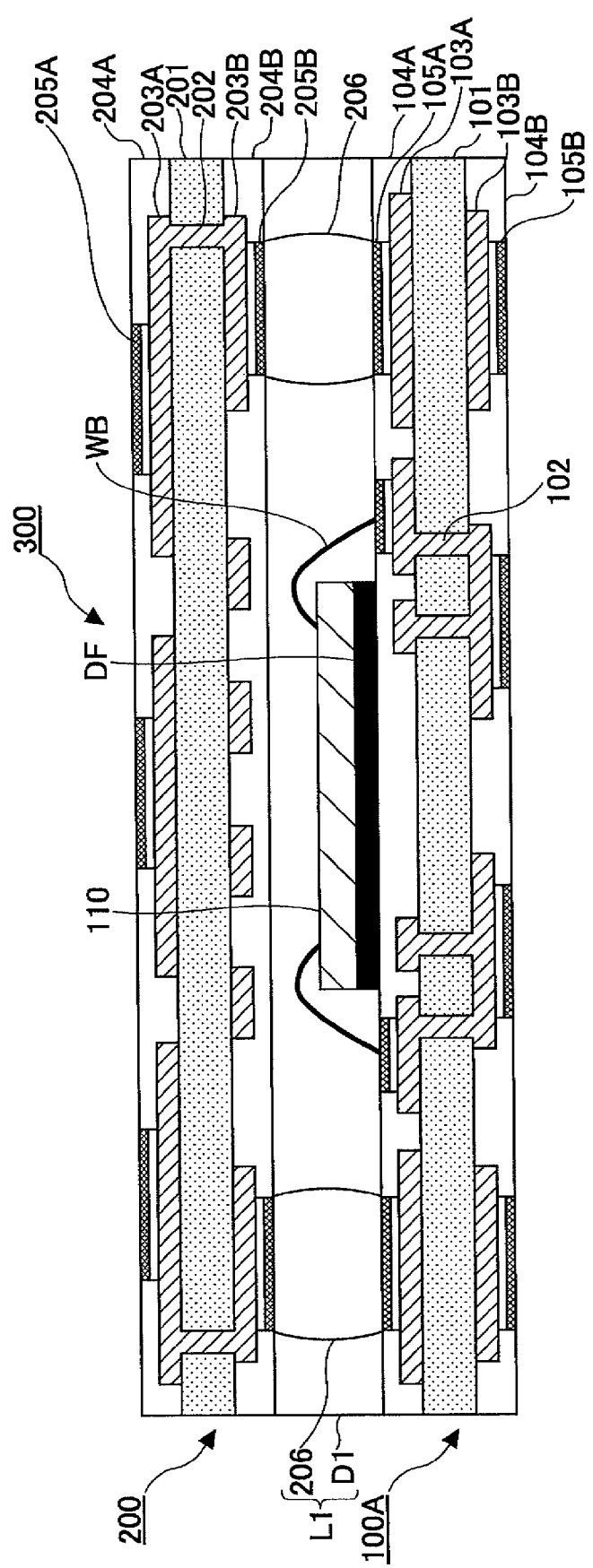
FIG. 29 illustrates another process step of the production method of the chip embedded substrate according to the twenty-first example.

FIGS. 28 and 29 illustrate process steps of a production method of a chip embedded substrate according to a twenty first example. In a process step shown in FIG. 28, the semiconductor chip 110 is attached in a face-up manner on a wiring substrate having the same configuration as the wiring substrate 100 of the first example shown in FIG. 1A, specifically on the solder resist layer 104A, using a film resin DF (called a die-attach film, for example). In addition, the semiconductor chip 110 is connected to the patterned wirings 103A by a bonding wire WB. In this case, the pattern of the patterned wirings 103A and the openings made in the solder resist layer may be adjusted in accordance with the wire-bonding.

Next, in a process step shown in FIG. 29, the same process as explained for the first example in reference to FIG. 1E is carried out so as to produce the chip embedded substrate. As shown in this example, the semiconductor chip may be arranged in a face-up manner in relation to the substrate on which the semiconductor chip is mounted and electrically connected by a wire-bonding process.

EXAMPLE 22

According to other examples of the present invention, electronic parts except for the semiconductor chip may be mounted on (or embedded in) the chip embedded substrate. For example, the electronic parts may include a so-called surface mount device. Specifically, the electronic parts may include a capacitor, an inductor, a resistor, an oscillation device (for example, a quartz oscillator), a filter, and a communications device (for example, a surface acoustic wave (SAW) device).

Figure 30:
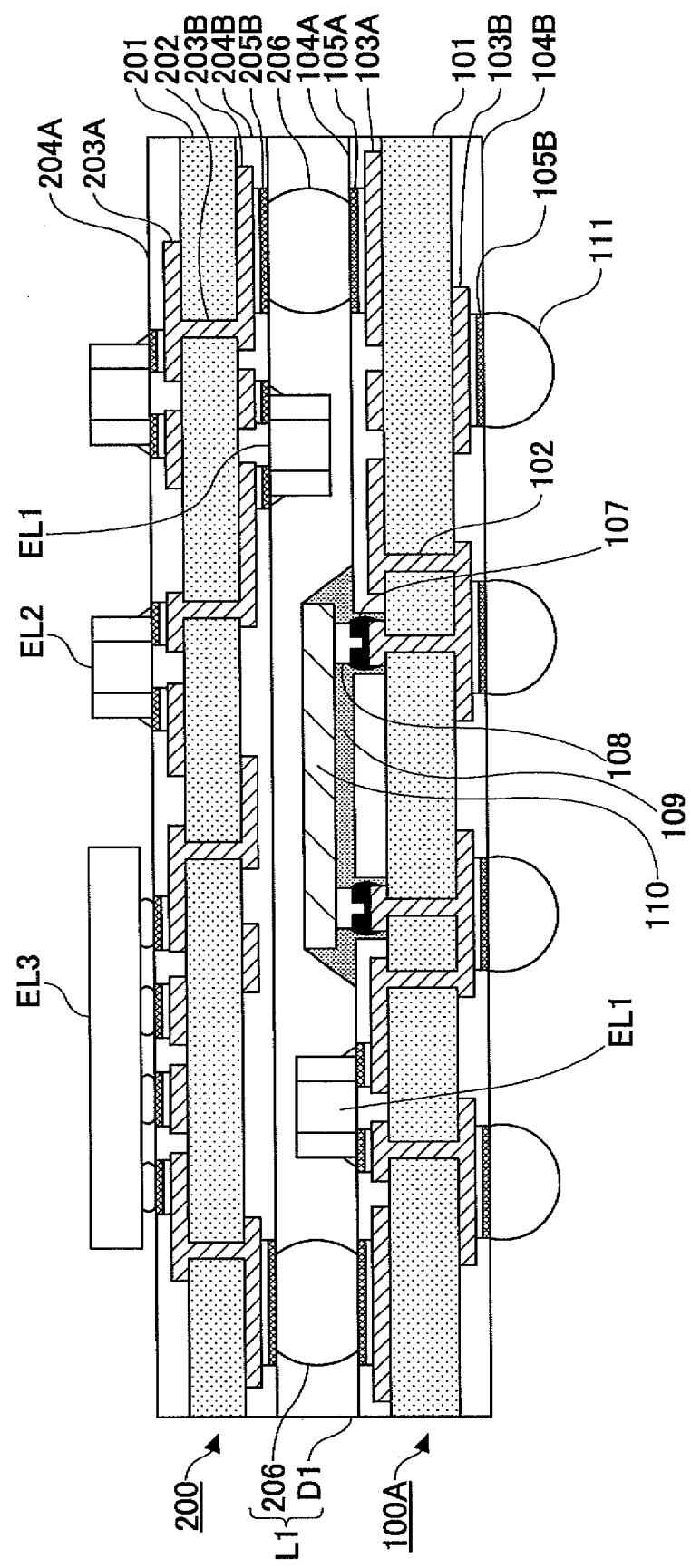
FIG. 30 illustrates one process step of a production method of a chip embedded substrate according to a twenty-second example.

FIG. 30 illustrates the chip embedded substrate 300 which is shown in the first example but with electronic parts EL1, EL2, EL3 mounted on the chip embedded substrate. For example, the electronic parts EL2, EL3 are mounted on an upper surface of the wiring substrate 200, the upper surface being opposite to the surface facing the semiconductor chip 110, and connected to the patterned wirings 203A.

However, since a mounting area on the upper surface of the wiring substrate 200 is limited, if a large number of electronic parts are mounted on the upper surface, the wiring substrate 200 (and thus the chip embedded substrate) needs to be larger. Therefore, it is desirable that the electronic parts be disposed between the wiring substrate 200 and the wiring substrate 100A and encapsulated by the encapsulating connection layer L1 (the insulation layer D1). In this example, plural electronic parts EL1 are disposed between the wiring substrate 200 and the wiring substrate 100A and encapsulated by the encapsulating connection layer L1 (the insulation layer D1).

For example, in the chip embedded substrate according to this example, one electronic part EL1 is mounted on the same surface of the wiring substrate 100A where the semiconductor chip 110 is mounted. In addition, another electronic part EL1 is mounted on the surface of the wiring substrate 200 which faces the surface where the semiconductor chip 110 is mounted. In this case, the electronic parts EL1 are encapsulated by the encapsulating connection layer L1 (the insulation layer D1) in the same manner as the semiconductor chip 110 is encapsulated. When the electronic part EL1 is mounted on the surface of the wiring substrate 200 which is the opposite surface to the surface where the semiconductor ship 110 is mounted, the electronic part EL1 is desirably arranged so as to skirt the semiconductor chip 110 (in a position adjacent to the semiconductor chip 110). When configured in this manner, the chip embedded substrate can be thinned.

In the above configuration, the electronic parts EL1 may be mounted on both the wiring substrate 200 and the wiring substrate 100A. In addition, the parts EL1 may be mounted only on the wiring substrate 200, or the wiring substrate 100A.

Figure 31:
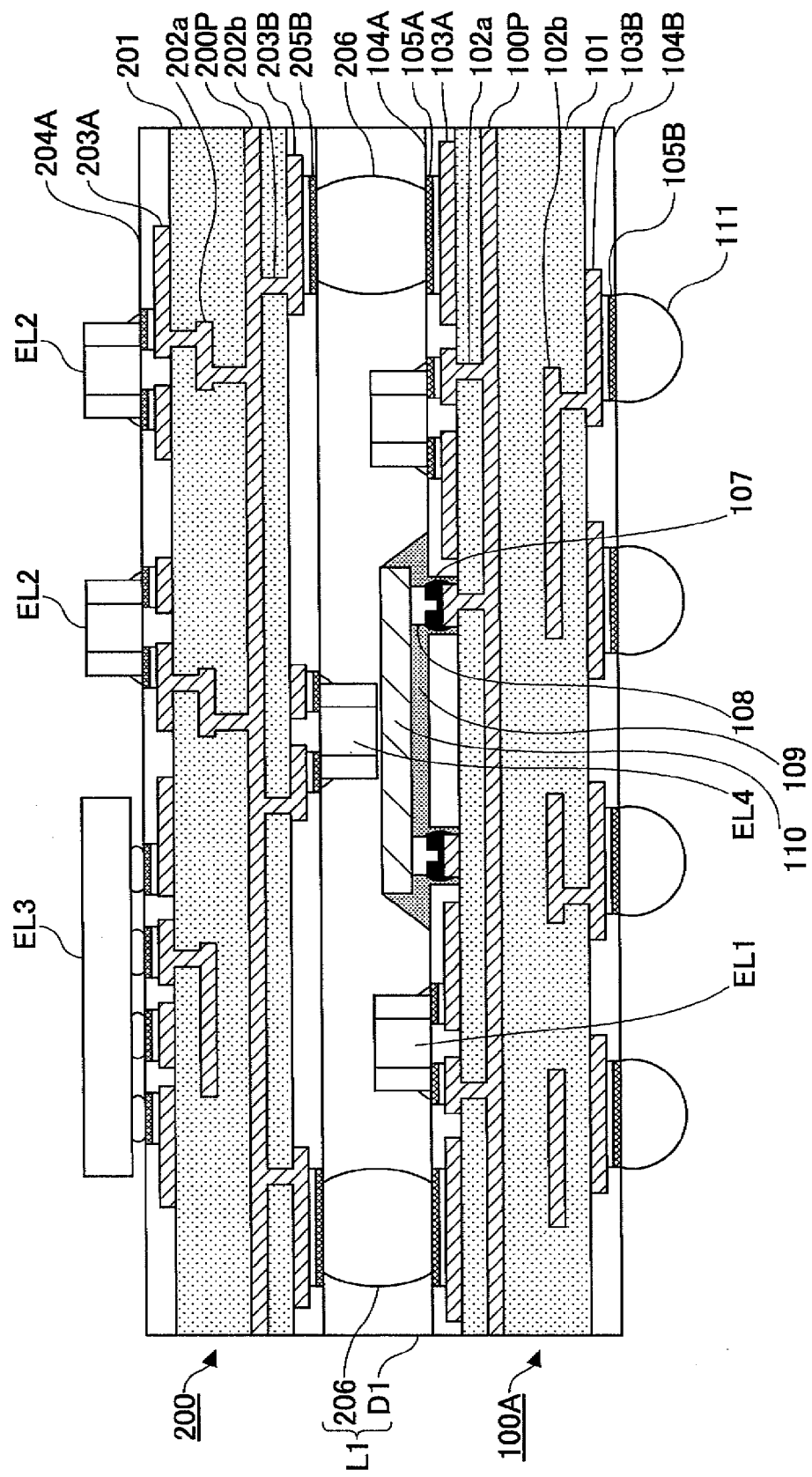
FIG. 31 illustrates another process step of the production method of the chip embedded substrate according to the twenty-second example.

In addition, when the electronic parts are mounted on the surface of the wiring substrate 200, which is to be joined onto the substrate where the semiconductor chip is mounted, the surface facing the semiconductor chip 110, the following configuration may be contemplated. FIG. 31 illustrates the chip embedded substrate 300, which is the same as explained in the first example, where an electronic part EL4 in addition to the electronic parts EL1 EL2, EL3 is mounted.

As shown in the figure, the electronic part EL4 is mounted on the surface of the wiring substrate 200, which is to be joined onto the substrate where the semiconductor chip is mounted, the surface facing the semiconductor chip 110. The electronic part EL4 is arranged right above the semiconductor chip 110. When the electronic part is arranged right above the semiconductor chip 110, the electronic parts may be densely mounted and the chip embedded substrate may be smaller two-dimensionally.

Moreover, in the chip embedded substrate shown in the figure, an electrically conductive layer 100P is formed (embedded) in the wiring substrate 100A (the lower wiring substrate) and an electrically conductive layer 200P is formed (embedded) in the wiring substrate 200 (the upper wiring substrate). The electrically conductive layer 100P is formed substantially entirely on the wiring substrate 100A when seen from above (in plan view). Similarly, the electrically conductive layer 200P is formed substantially entirely on the wiring substrate 200 when seen from above.

Therefore, the semiconductor chip 110 and the electronic parts EL1, EL4 which are mounted between the wiring substrate 100A and the wiring substrate 200 are electromagnetically shielded. Thus, the electromagnetically shielded electronic part (semiconductor chip) is insusceptible to noise from, for example, the electronic parts EL2, EL3. In addition, the electromagnetically shielded electronic part (semiconductor chip) imposes less influence on the electronic parts EL2, EL3.

By the way, an electrically conductive layer (a ground plane) which is grounded so as to be at ground potential and another electrically conductive layer (a power plane) to which a predetermined electric potential is given in relation to the ground potential may be formed in the wiring substrates. When such electrically conductive layers as the above ground plane or the power plane are employed as an electromagnetic shield, the electronic parts and the semiconductor chip disposed between the wiring substrate 100A and the wiring substrate 200 are more efficiently shielded.

For example, when the above configuration is used, the electronic parts and the semiconductor chip that may cause noise can be easily shielded, and the electronic parts and the semiconductor chip that are susceptible to noise can be easily shielded.

In addition, use of the above configuration can facilitate electromagnetic separation between an analog device and a digital device. For example, the analog device (the digital device) may be mounted between the wiring substrate 100A and the wiring substrate 200 while the digital device (the analog device) is mounted on the wiring substrate 200, specifically, on the surface opposite to the surface that faces the semiconductor chip.

In addition, a wiring structure 102a (a via plug or patterned wiring) may be formed between the patterned wirings 103A and the electrically conductive layer 100P and a wiring structure 102b may be formed between the patterned wiring 103B and the electrically conductive layer 100P, when necessary. Similarly, a wiring structure 202a may be formed between the patterned wirings 203A and the electrically conductive layer 200P; and a wiring structure 202b may be formed between the patterned wiring 203B and the electrically conductive layer 200P, when necessary.

Figure 32:
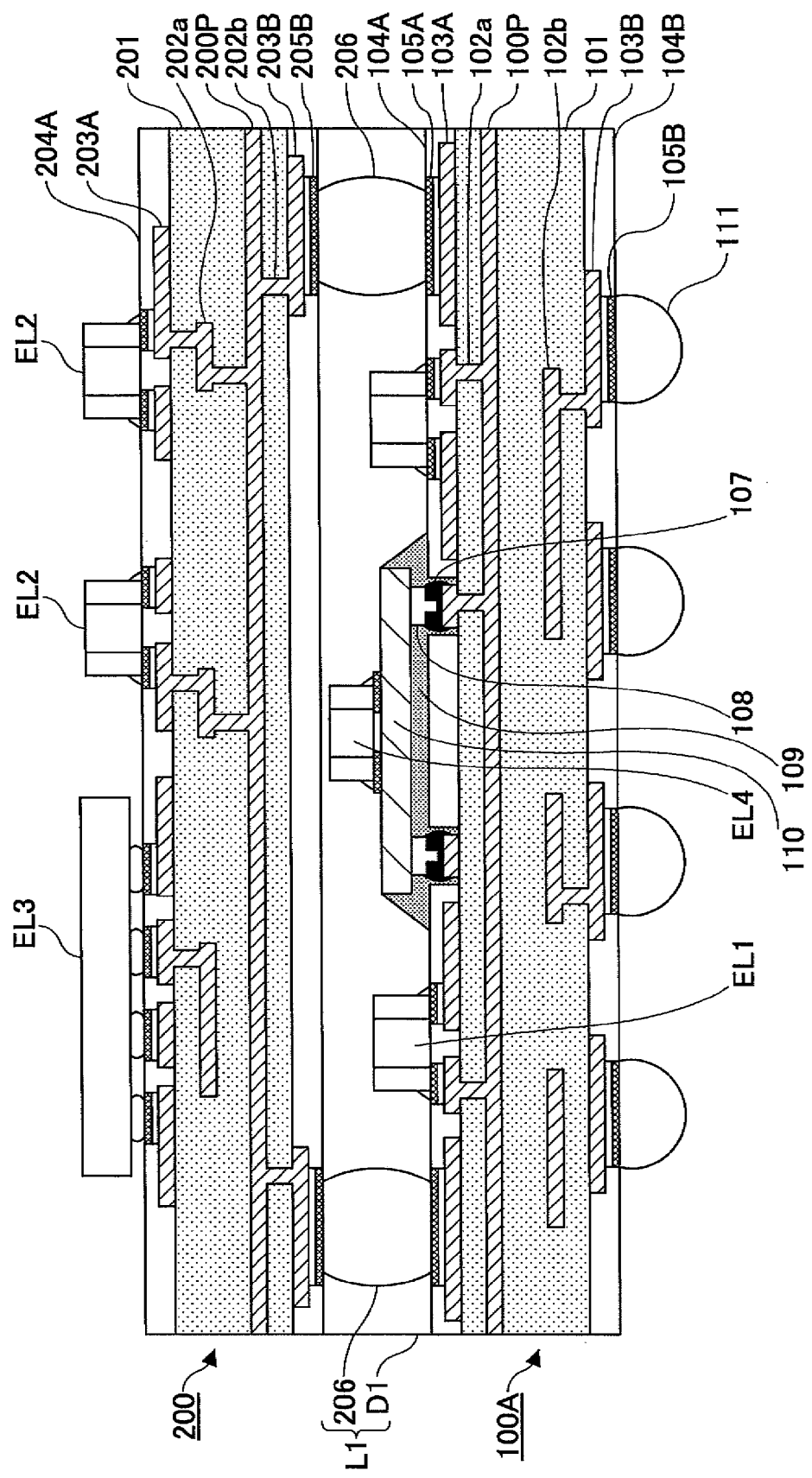
FIG. 32 illustrates another process step of the production method of the chip embedded substrate according to the twenty-second example.

Furthermore, the structure shown in FIG. 31 can be modified as shown in FIG. 32. Namely, the electronic part EA may be stacked and mounted on the semiconductor chip 110.

EXAMPLE 23

Since some electronic parts may be thicker (higher) than the semiconductor chip, the chip embedded substrate tends to be thicker when the electronic parts are mounted between the wiring substrate 100A and the wiring substrate 200 and the distance between the wiring substrate 100A and the wiring substrate 200 is set in accordance with the electronic parts.

Therefore, when the electronic parts are mounted in the chip embedded substrate, the wiring substrate 100A or the wiring substrate 200 may have an opening through which the electronic parts can be exposed, which may downsize the chip embedded substrate.

Figure 33:
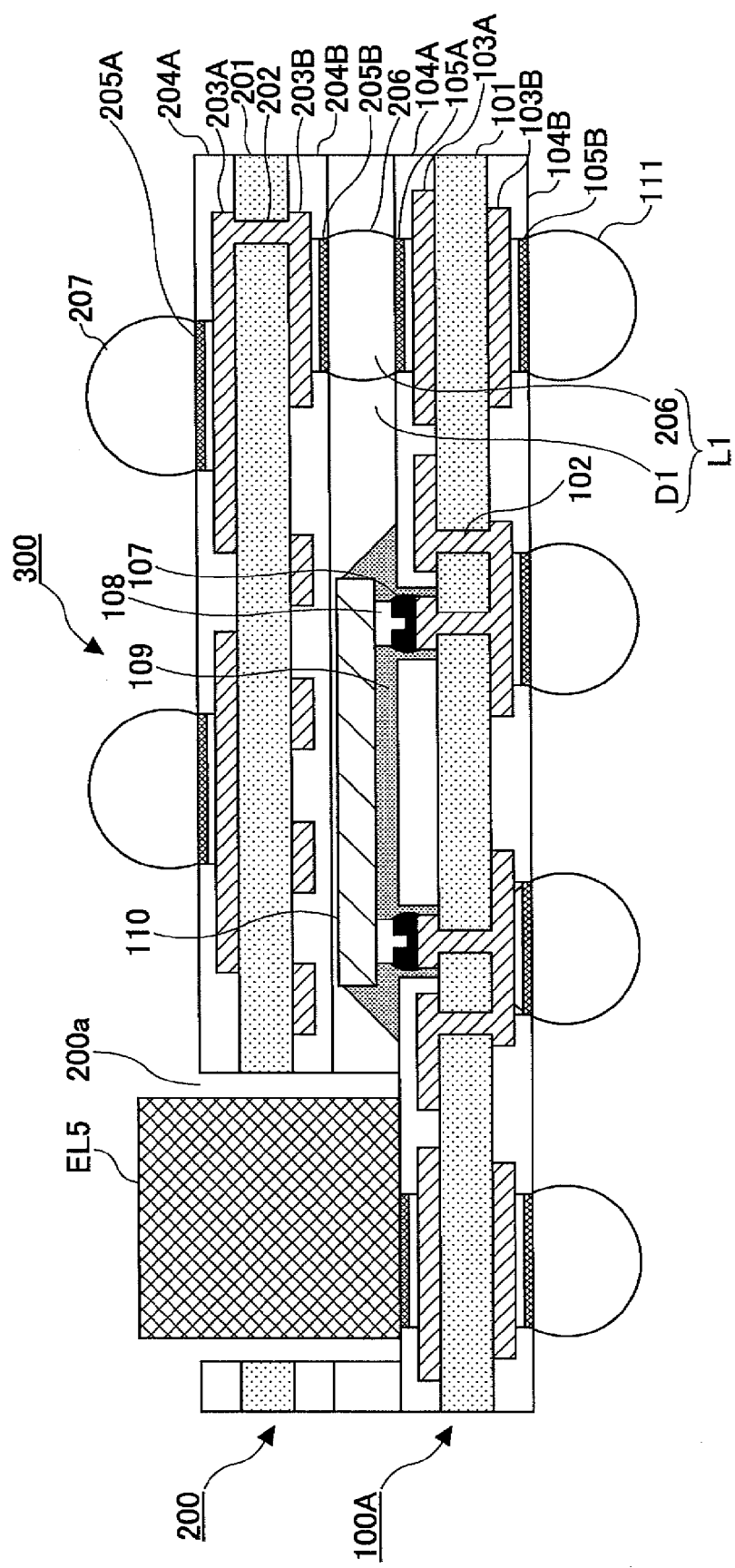
FIG. 33 illustrates one process step of a production method of a chip embedded substrate according to a twenty-third example.

FIG. 33 illustrates an example where an electronic part EL5 is mounted on the chip embedded substrate 300 of the first example. As shown, the electronic part EL5 is mounted on the wiring substrate 100A and connected to the patterned wirings 103A.

The chip embedded substrate shown in the figure is characterized in that an opening 200a that allows the electronic part EL5 mounted on the wiring substrate 100A to be exposed is formed. Therefore, even when the electronic part whose height measured from the mounting surface is higher than the semiconductor chip 110 is mounted, the chip embedded substrate may be prevented from being thick.

Figure 34:
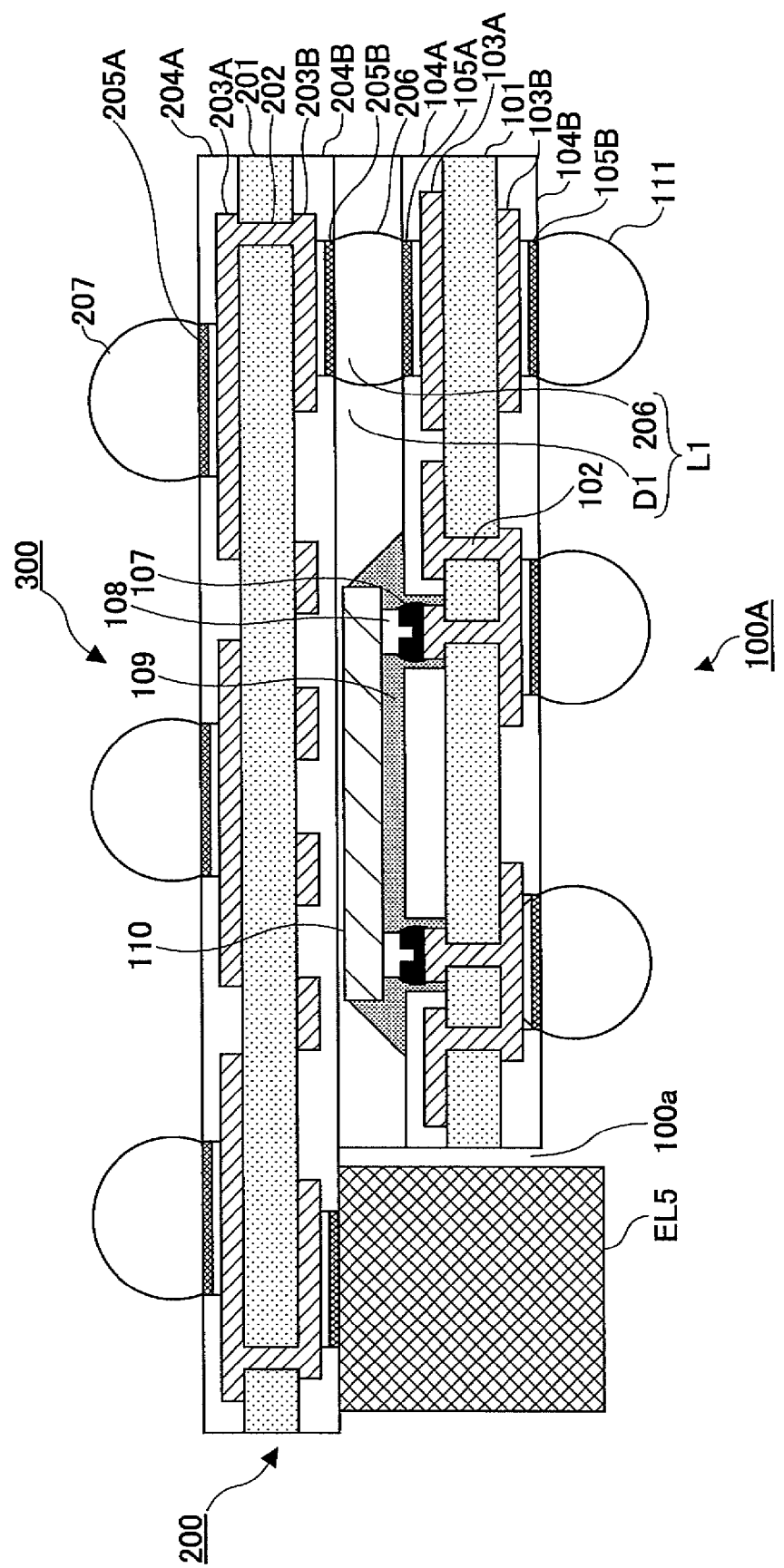
FIG. 34 illustrates another process step of the production method of the chip embedded substrate according to the twenty-third example.

In addition, when the electronic part EL5 is mounted on the wiring substrate 200 as shown in FIG. 34, an opening 100a that allows the electronic part EL5 mounted on the wiring substrate 200 to be exposed through the opening 100a may be formed in the wiring substrate 100A.

Moreover, when a semiconductor chip is mounted on the wiring substrate 100A, another opening that allows the semiconductor chip to be exposed through the opening may be formed in the wiring substrate 200. In addition, when the semiconductor chip is mounted on the wiring substrate 200, yet another opening that allows the semiconductor chip to be exposed through the opening may be formed in the wiring substrate 100A. When the semiconductor chip to be mounted is large or thick, for example, or when stacked plural semiconductor chips are mounted, the opening formed in the wiring substrate can prevent the chip embedded substrate from being larger.

EXAMPLE 24

When the chip embedded substrate is produced, it is desirable to reduce as much as possible an area where a solder resist layer is formed. The solder resist layer is a resin member used to prevent solder or the like, when melted, from flowing, for example. The resin may include a photosensitive material in order to facilitate patterning, which makes this resin different from the built-up resin in terms of constituents.

Generally, the solder resist layer has lower physical strength and lower glass transition temperature (lower heat resistance) than the build-up resin.

Figure 35:
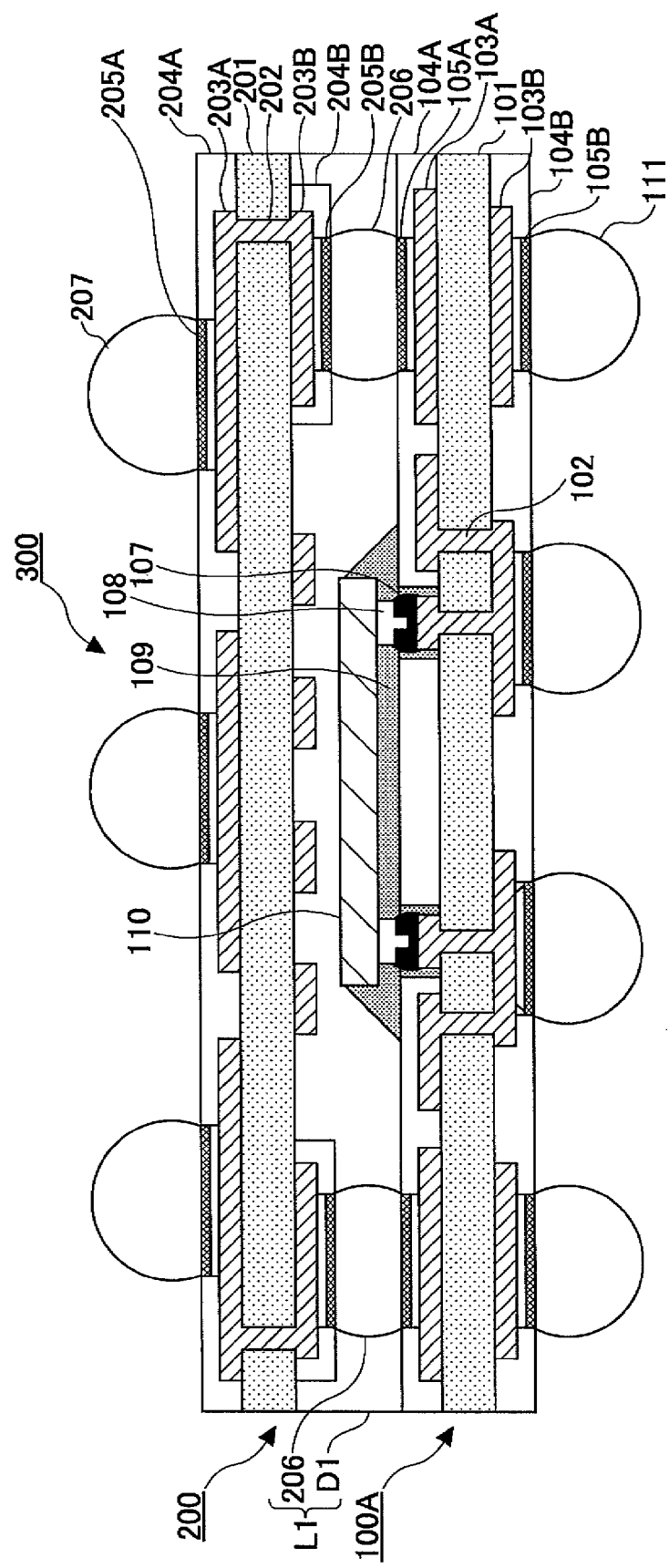
FIG. 35 is one view of a chip embedded substrate according to a twenty-fourth example.

Therefore, it is desirable to reduce an area of the solder resist layer (or avoid the use of the solder resist) as follows, FIG. 35 illustrates an example where the solder resists 204B of the wiring substrate 200 are downsized in the chip embedded substrate 300 explained as the first example. In this figure, the areas where the solder resist layers 204B are formed are reduced, and the solder resist layers 204B are formed in the vicinity of the patterned wiring 203B to which electrical connection is made by a solder.

Therefore, a volume (or area) occupied by the insulation layer D1 made of the build-up resin becomes larger between the wiring substrate 100A and the wiring substrate 200 in place of the insulation layer D1, which improves reliability of the chip embedded substrate. In addition, such a configuration may be applied to the solder resist layer 104A on the wiring substrate 100A.

Figure 36:
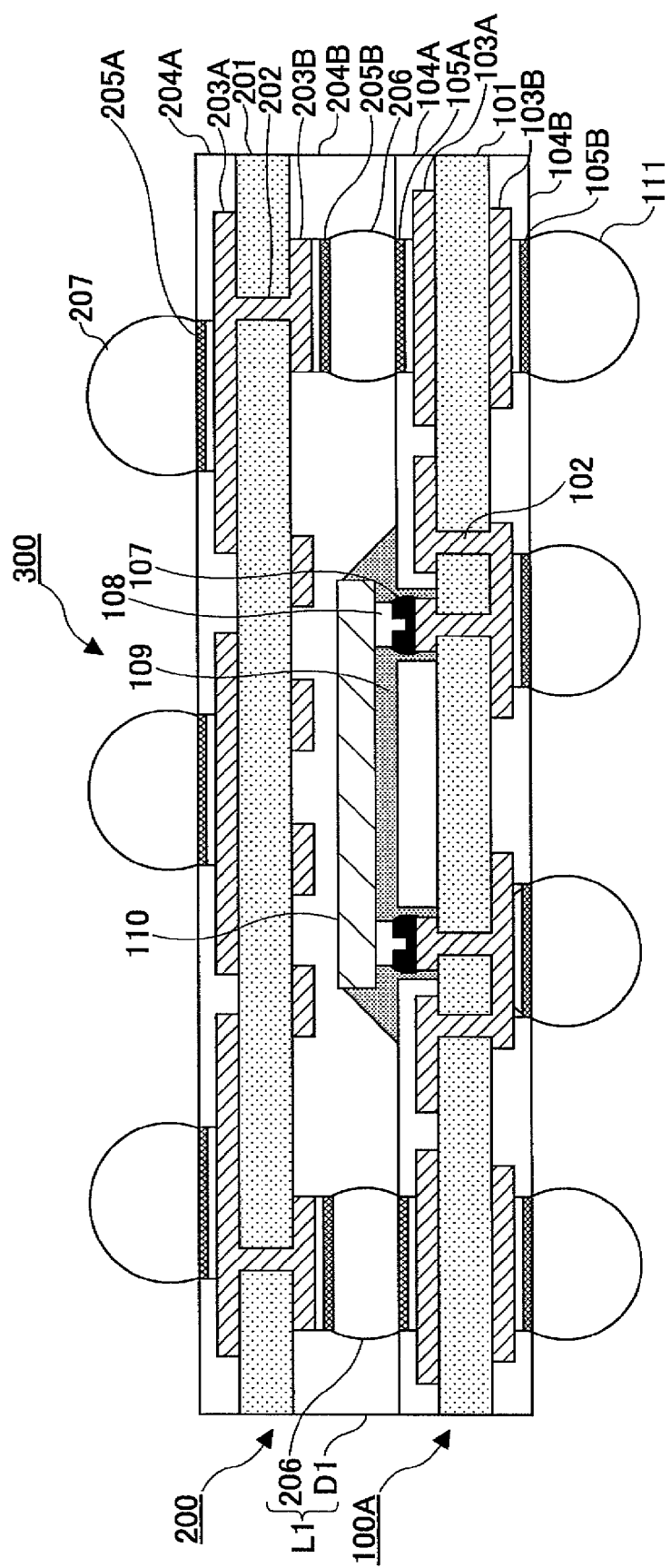
FIG. 36 is another view of the chip embedded substrate according to the twenty-fourth example.

FIG. 36 illustrates an example where the solder resist layers 204B on the wiring substrate 200 are eliminated in the chip embedded substrate 300 shown as the first example. In this figure, the patterned wirings 203B to which the solder balls 206 are connected are formed in positions in accordance with the via plugs 202. Moreover, the patterned wirings 203B are made smaller and a space where the solder may be melted to flow on the patterned wirings 203B is made smaller. For example, the patterned wirings 203B are desirably formed so as to have a shape (area) similar to a shape (area) of a so-called electrode pad.

With the above configuration, the solder resist layer 204B can be eliminated, thereby further improving reliability of the chip embedded substrate.

EXAMPLE 25

In a chip embedded substrate according to an example of the present invention, not only one semiconductor chip but plural semiconductor chips can be embedded.

FIGS. 37 through 42 illustrate examples where plural semiconductor chips are mounted on the chip embedded substrate 300 shown as the first example. By the way, while the aforementioned electronic parts EL2, EL3 are mounted on the chip embedded substrate, detailed structures (the patterned wirings, the via plugs, or the like) of the wiring substrate 100A and the wiring substrate 200 are partially omitted in order to present an outlined structure.

Figure 37:
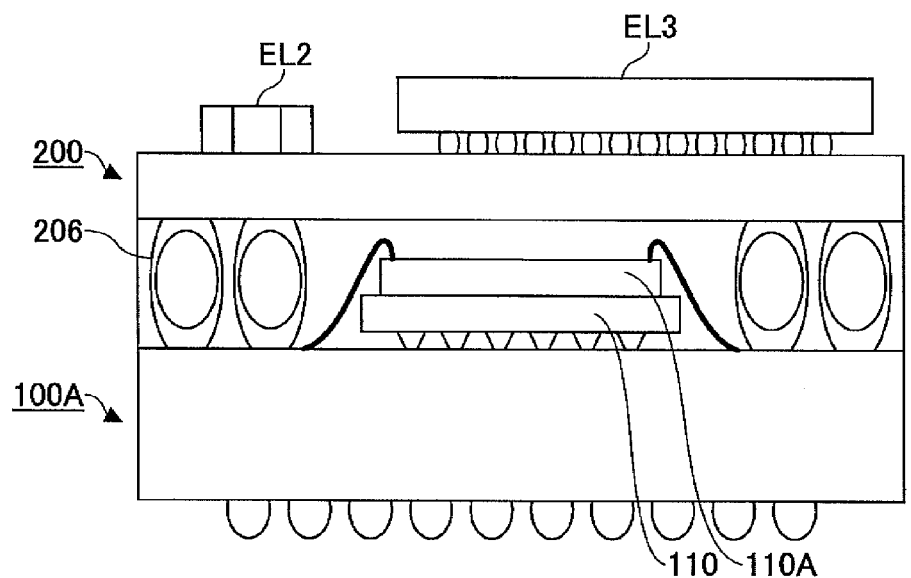
FIG. 37 is one view of a chip embedded substrate according to a twenty-fifth example.

As shown in FIG. 37, a semiconductor chip 110A is stacked and mounted on the semiconductor chip 110 that is connected to the wiring substrate 100A by a flip-chip assembling. In addition, the semiconductor chip 110A is connected to the wiring substrate 100A by bonding wires.

Figure 38:
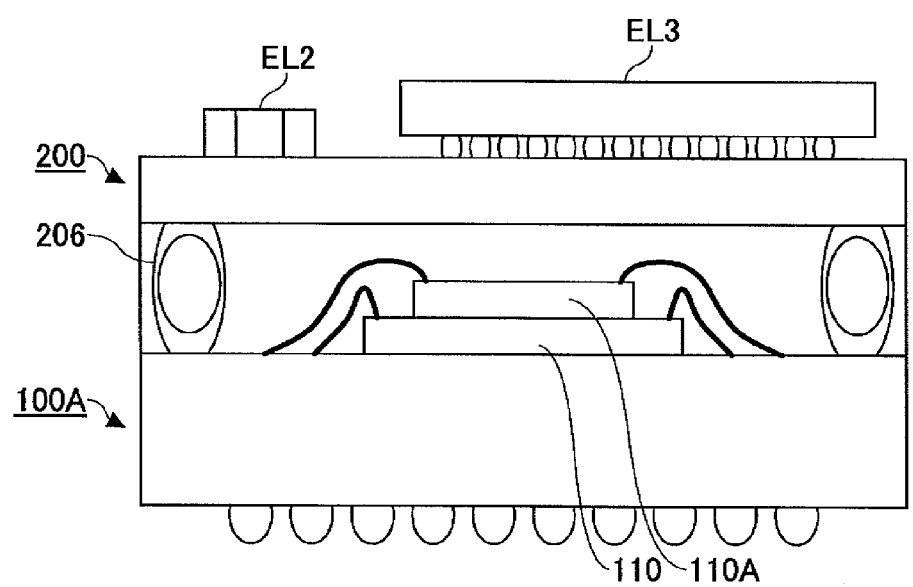
FIG. 38 is another view of the chip embedded substrate according to the twenty-fifth example.

In FIG. 38, the semiconductor chips 110, 110A are stacked in a face-up manner on the wiring substrate 100A and connected by bonding wires to the wiring substrate 100A.

Figure 39:
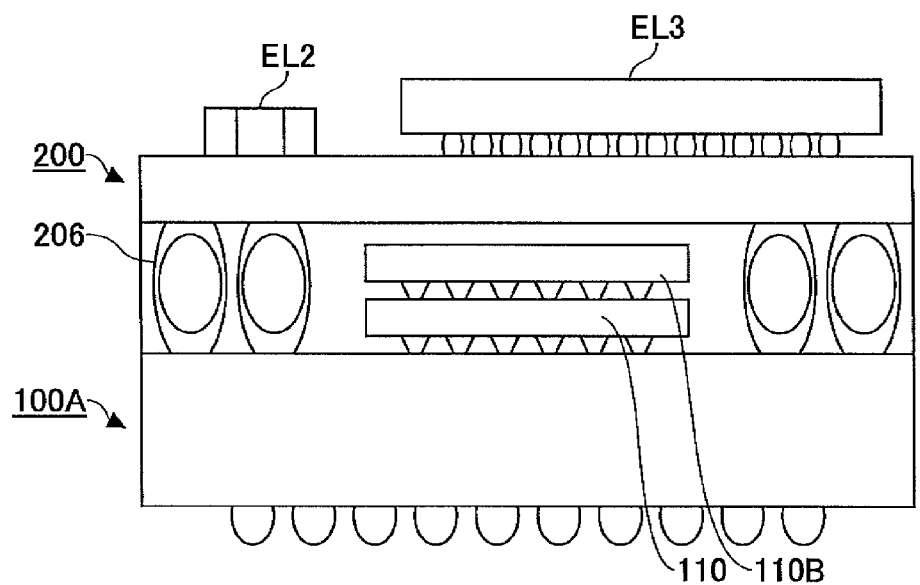
FIG. 39 is another view of the chip embedded substrate according to the twenty-fifth example.

In FIG. 39, a semiconductor chip 110B is stacked on and connected by the flip-chip assembling to the semiconductor chip 110 that is connected by the flip-chip assembling to the wiring substrate 100A. In this case, a through plug (not shown) may be formed in the semiconductor chip 110, for example, and the semiconductor chip 110B is connected through the through plug to the wiring substrate 100A.

Figure 40:
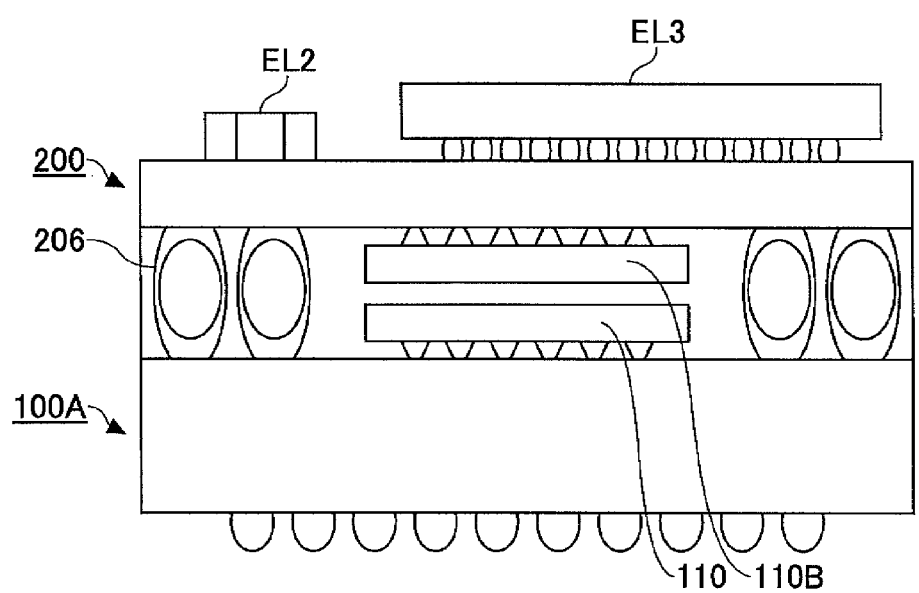
FIG. 40 is another view of the chip embedded substrate according to the twenty-fifth example.

In FIG. 40, the semiconductor chip 110B is arranged above the semiconductor chip 110 connected by the flip-chip assembling to the wiring substrate 100A and connected by the flip-chip assembling to the wiring substrate 200. Namely, the semiconductor chip 110B is flip-chip mounted on the surface of the wiring substrate 200, the surface facing the semiconductor chip 110 (the wiring substrate 100A).

Figure 41:
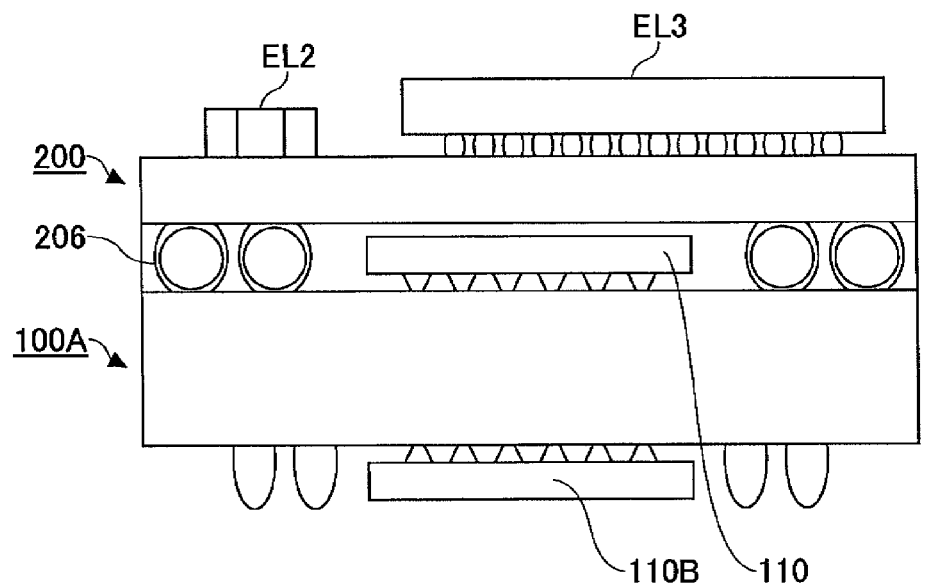
FIG. 41 is another view of the chip embedded substrate according to the twenty-fifth example.

In FIG. 41, the semiconductor chip 110B is flip-chip mounted on a surface of the wiring substrate 100A, where this surface is opposite to the surface on which the semiconductor chip 110 is flip-chip mounted. Namely, the semiconductor chips are flip-chip mounted on both sides of the wiring substrate 100A.

By the way, not only two semiconductor chips but more semiconductor chips may be mounted.

Figure 42:
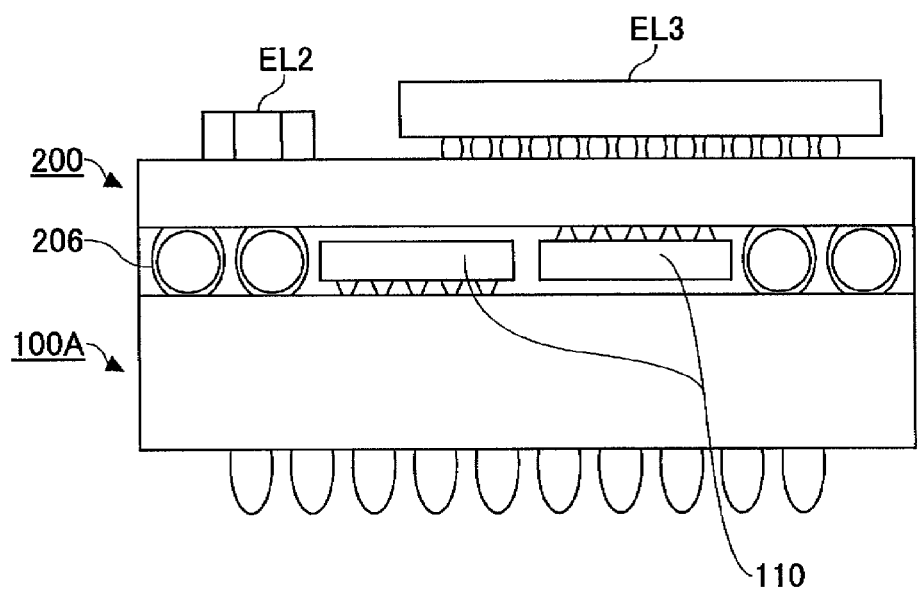
FIG. 42 is another view of the chip embedded substrate according to the twenty-fifth example.

For example, in FIG. 42, plural semiconductor chips 110 are disposed between the wiring substrate 100A and the wiring substrate 200 in such a way that the semiconductor chips 110 skirt (or are located adjacent to) each other when seen from above. According to this configuration, the chip embedded substrate can be desirably thinned.

In addition, in FIGS. 37 through 42, the electronic part EL3 may be mounted through an interposer.

EXAMPLE 26

It has been explained that there are mainly two processes of forming the insulation layer D1 (the encapsulating connection layer L1) between the wiring substrate 100A and the wiring substrate 200 in the production method of the chip embedded substrate of the first example. Namely, one process is to use a thermosetting film-like build-up resin and the other is to use a liquid resin.

However, it takes a long time when the liquid resin, for example, is supplied between the wiring substrate 100A and the wiring substrate 200, which may be an obstacle to improving production efficiency. In order to address this problem, the wiring substrate 100A and the wiring substrate 200 are locked in a mold into which in turn a pressurized, heated molding resin is injected, thereby forming the insulation layer D1.

Figure 43A:
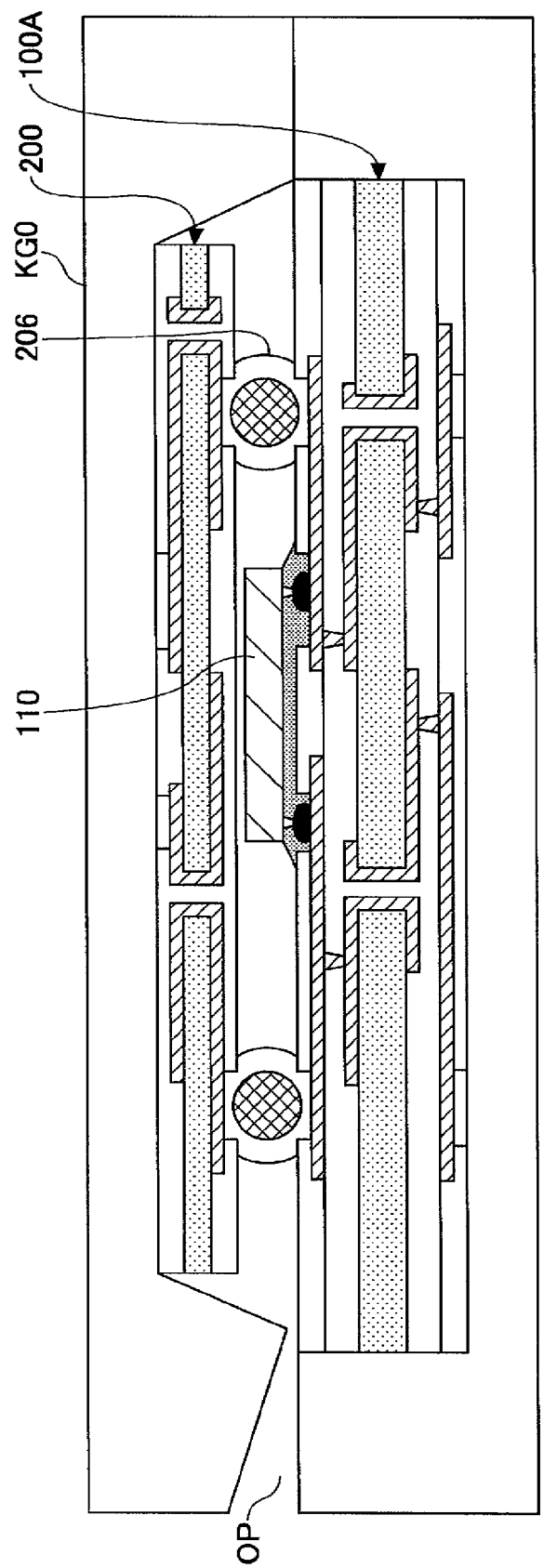
FIG. 43A illustrates one process step of an insulation layer forming method.
Figure 43B:
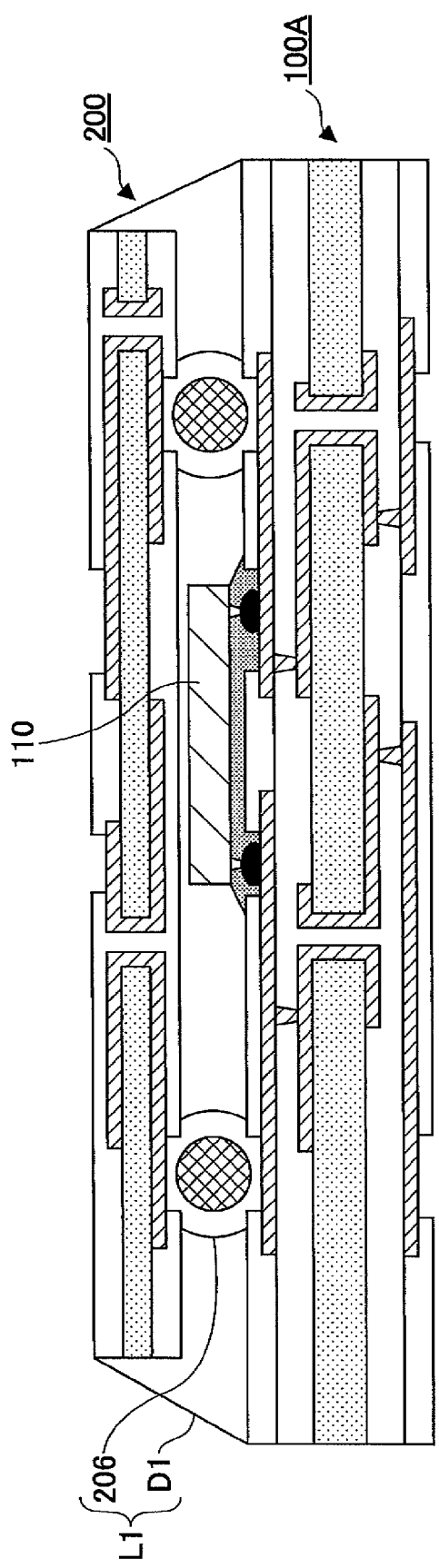
FIG. 43B illustrates another process step of the insulation layer forming method.

FIGS. 43A and 43B illustrate process steps of forming an insulation layer (made of a resin) between the wiring substrate 100A and the wiring substrate 200, where mold pressing is employed instead of processes of interposing the resin film and supplying the liquid resin. By the way, parts of detailed structures of the wiring substrates 100A, 200 are omitted so as to present an outlined representation in FIGS. 43A and 43B.

In a process step shown in FIG. 43A, the wiring substrate 100A and the wiring substrate 200 are housed in a mold KG0 so as to oppose each other. Then, in the same step, a molding resin is pressed into the mold KG0 through an opening (mold gate) OP toward between the wiring substrate 100A and the wiring substrate 200 and thus hardened. Next, the wiring substrates are taken out from the mould KG0 (FIG. 43B). In this manner, the insulation layer D1 (the encapsulating connection layer L1) may be formed, even when the mold pressing technology is employed.

By the way, the above mold pressing may be carried out in the following way.

Figure 44A:
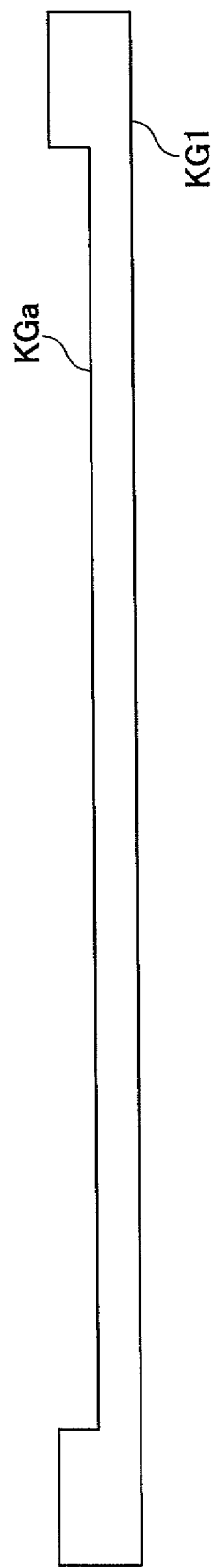
FIG. 44A illustrates one process step of a different insulation layer forming method.
Figure 44B:
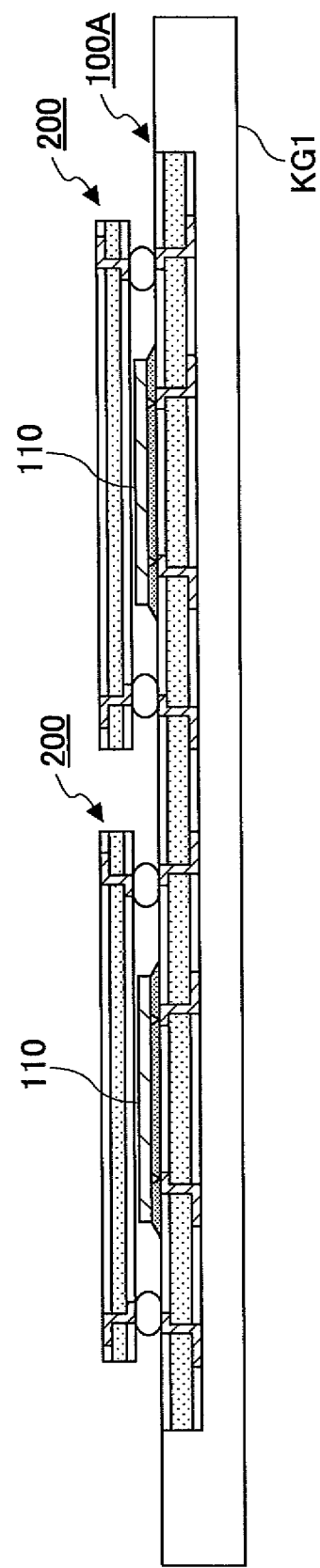
FIG. 44B illustrates another process step of the different insulation layer forming method.

First, in a process step shown in FIG. 44A, a mold KG1 having a recess portion KGa is prepared. Then, in a process step shown in FIG. 44B, the wiring substrate 100A and the wiring substrate 200 are disposed in the recess portion KGa of the mold KG1 so that the substrates 100A, 200 oppose each other.

Figure 44C:
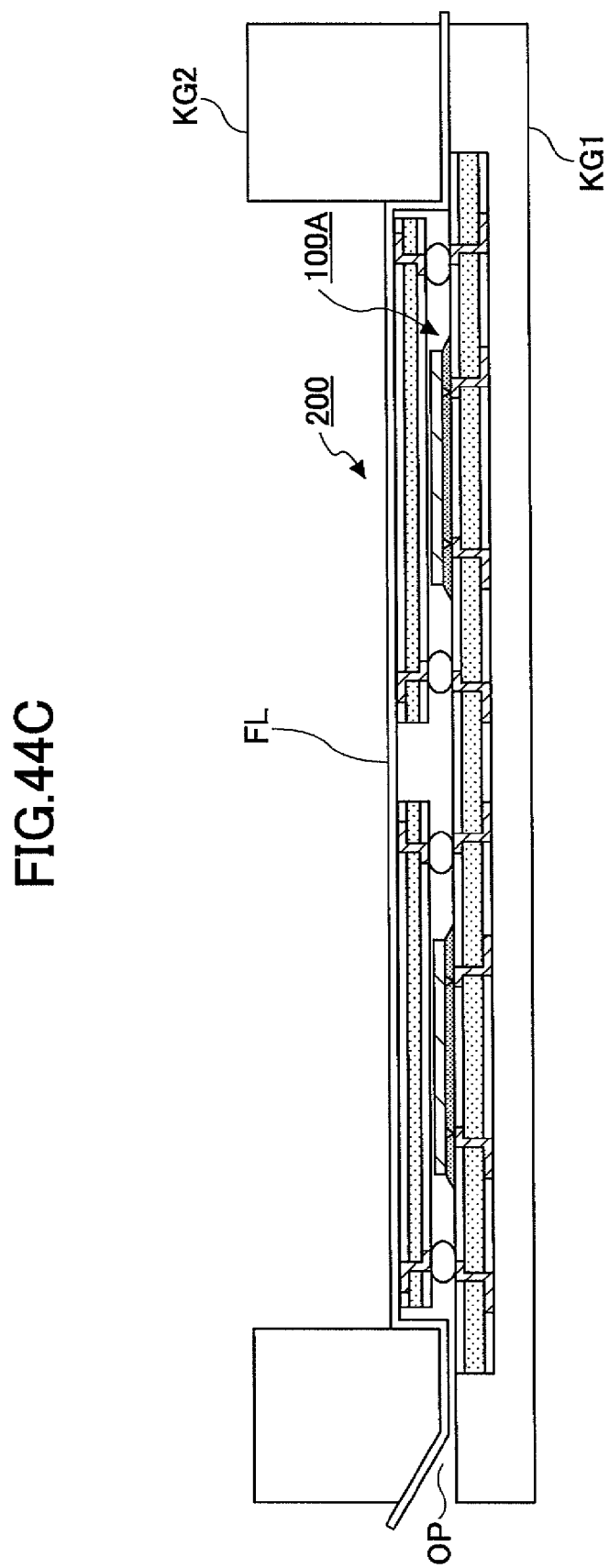
FIG. 44C illustrates another process step of the different insulation layer forming method.
Figure 44D:
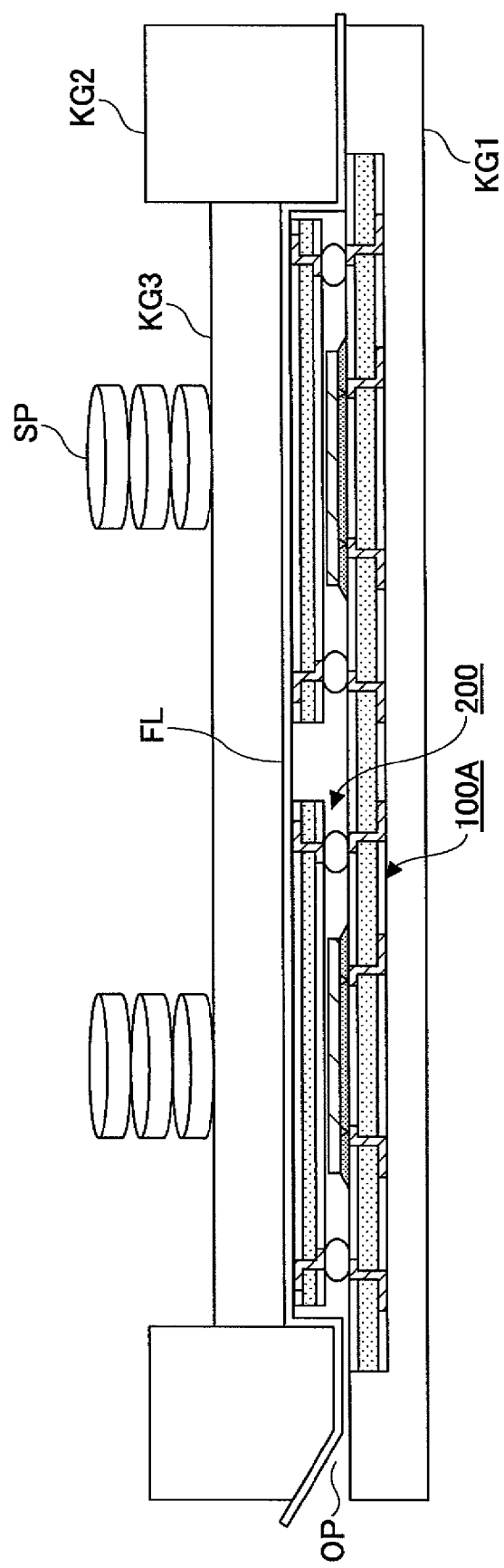
FIG. 44D illustrates another process step of the different insulation layer forming method.

Next, in process steps shown in FIGS. 44C and 44D, after a film FL is adhered on the wiring substrate 200, molds KG2, KG3 are sequentially placed on the film FL. In this case, it is desirable that even stress is applied across the surface of the mold KG3 by pressing the mold KG3 by pressure-applying means SP, for example. In the mold KG2, the opening (mold gate) OP is formed for allowing the molding resin to be introduced. By the way, the film FL may be attached on the molds KG2, KG3 and then the molds KG2, KG3 may be placed on the wiring substrate 200.

Figure 44E:
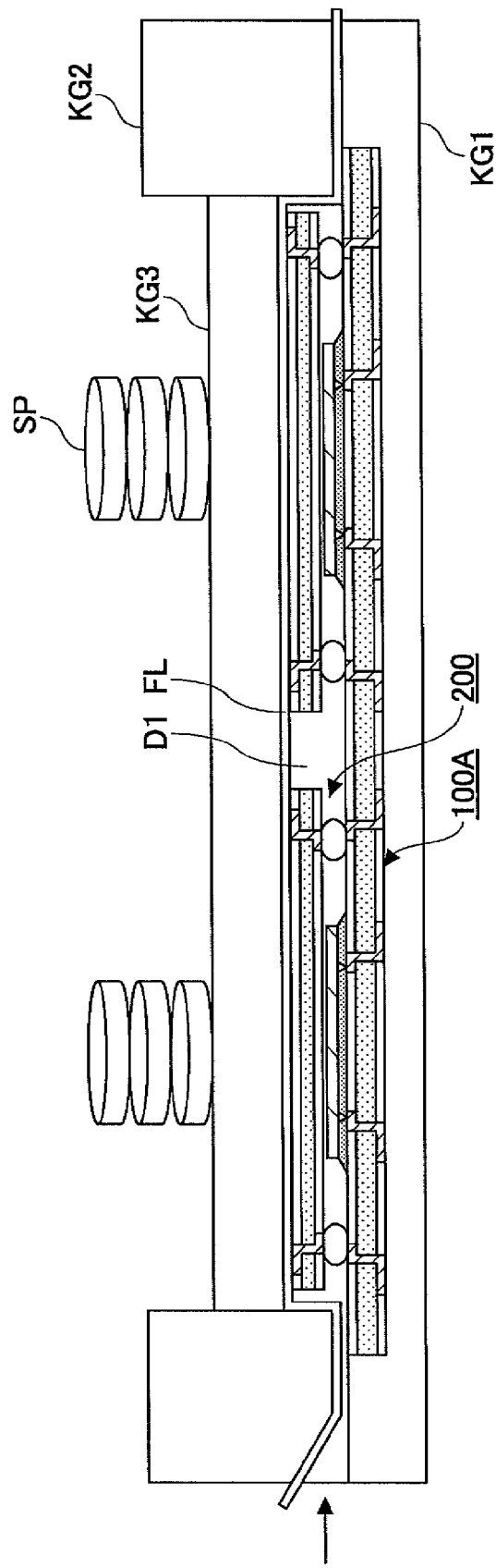
FIG. 44E illustrates another process step of the different insulation layer forming method.
Figure 44F:
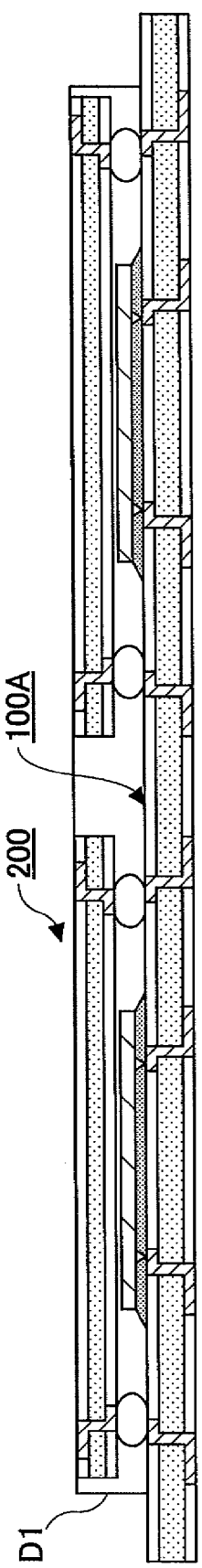
FIG. 44F illustrates another process step of the different insulation layer forming method.
Figure 44G:
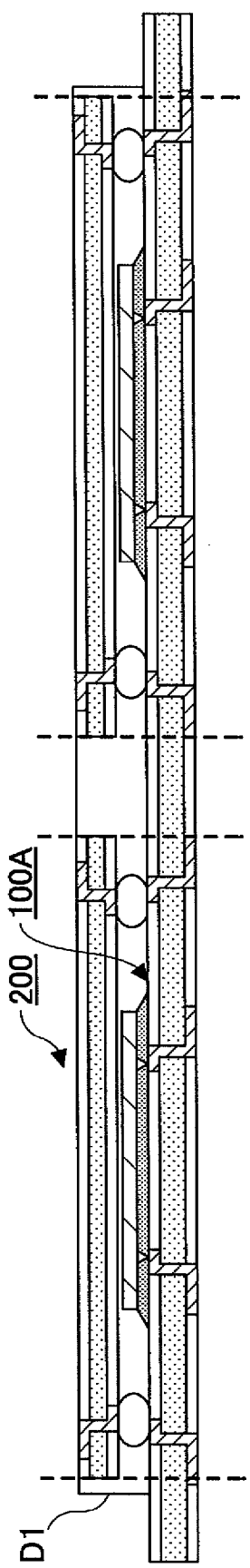
FIG. 44G illustrates another process step of the different insulation layer forming method.

Next, in a process step shown in FIG. 44E, the molding resin is pressed and introduced through the mold gate OP toward and between the wiring substrate 100A and the wiring substrate 200 and hardened. Then, the wiring substrates are taken out from the molds (FIG. 44F). Moreover, in a process step shown in FIG. 44G, the wiring substrates are severed (for example, along dotted lines in FIG. 44G) by a dicing process so as to obtain individual chip embedded substrates.

EXAMPLE 27

Figure 45:
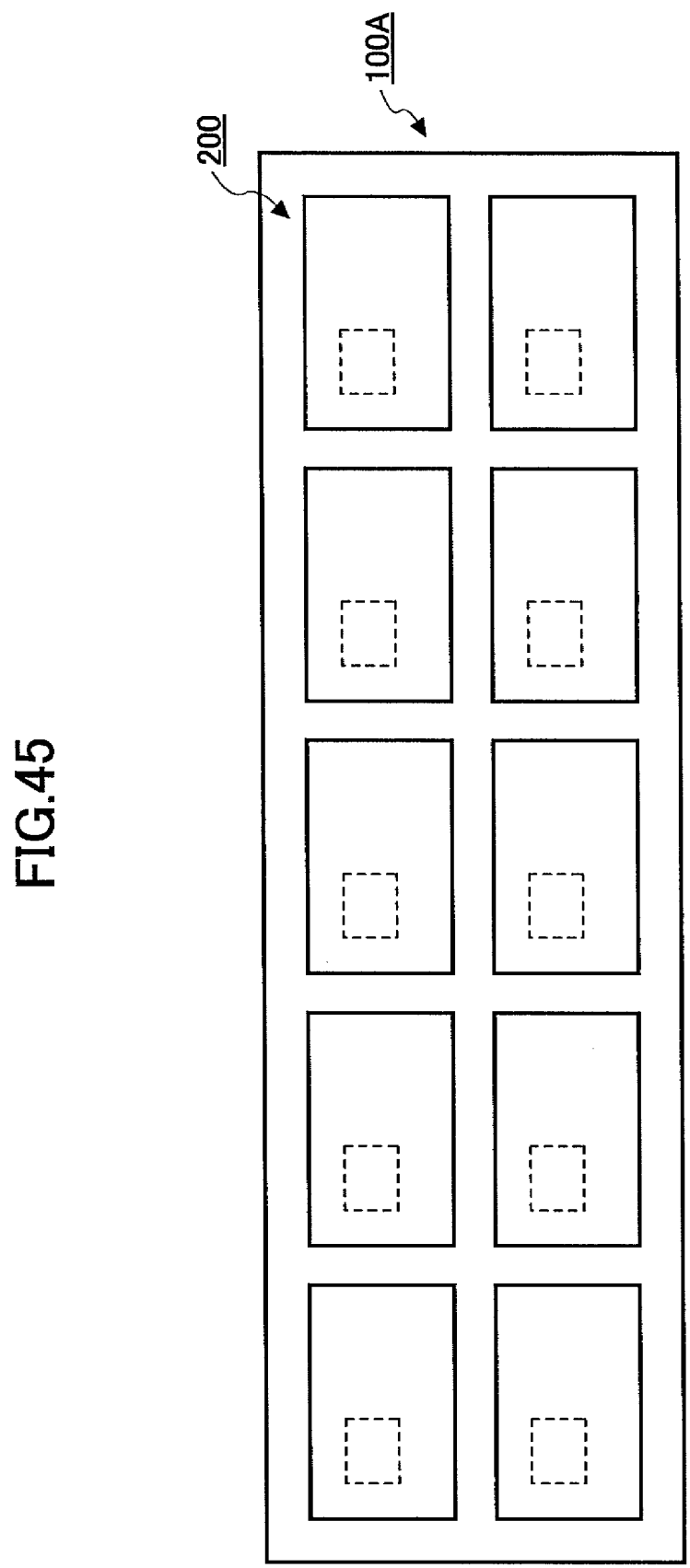
FIG. 45 illustrates one process step of a production method of a chip embedded substrate according to a twenty-seventh example.

When producing the chip embedded substrates, various large substrates can be used, as explained above. FIG. 45 illustrates such an example, where plural wiring substrates 200 whose dimension corresponds to the chip embedded substrates to be produced are disposed on the wiring substrate 100A, which is a large substrate in this example. In FIG. 45, dotted lines represent the semiconductor chips that are mounted. In this example, the wiring substrate 100A is severed by the dicing process and thus individual chip embedded substrates are obtained.

In addition, a large wiring substrate having the wiring substrates 100A and a large wiring substrate having the wiring substrates 200 may be joined with each other and the joined wiring substrates may be severed by the dicing process, thereby obtaining individual chip embedded substrates.

When large substrates are joined with each other, a large displacement may be caused, especially, in and near periphery portions of the substrates. On the other hand, when individual wiring substrates are placed on the large wiring substrate 100A, it may take a long time to place the wiring substrates 200.

Figure 46:
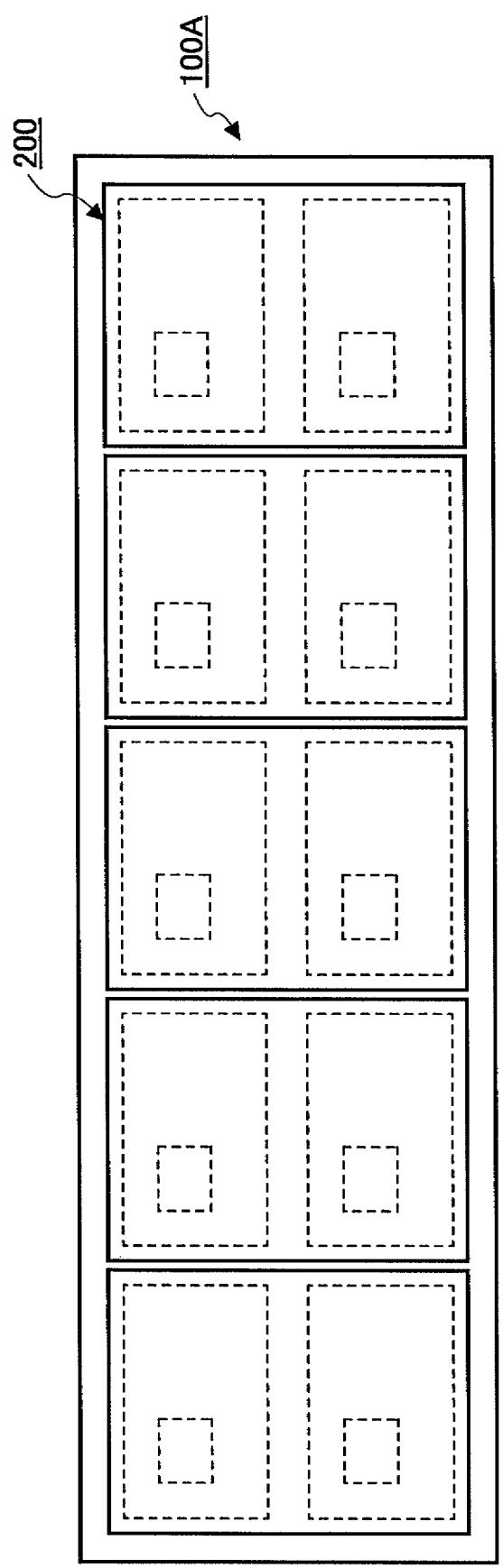
FIG. 46 illustrates another process step of the production method of the chip embedded substrate according to the twenty-seventh example.

Thus, the wiring substrates 200 having a size that allows, for example, two chip embedded substrates to be produced may be placed on the large wiring substrate 100A, thereby obtaining individual chip embedded substrates, as shown in FIG. 46. In this case, the wiring substrate 100A and the wiring substrate 200 are separated by the dicing process so as to produce the chip embedded substrates. By the way, the semiconductor chips that are mounted and one chip embedded substrate are shown by dotted lines.

In the method shown in FIG. 46, displacement between the substrates can be reduced compared with a situation where the large substrates are joined with each other. Besides, the wiring substrates can be placed in a shorter period of time compared with a situation where every individual substrate is placed on the large substrate.

By the way, the size of the wiring substrates to be placed is not limited to a size corresponding to the two chip embedded substrates but may be variously changed. For example, the wiring substrates to be placed may have a size that allows four or six chip embedded substrates to be produced.

Although the present invention has been described in reference to various examples, the present invention is not limited to particular examples above. Namely, various modifications and alterations may be made within the scope of the claims.

INDUSTRIAL APPLICABILITY

According to the present invention, a chip embedded substrate that enables high production yields and high reliability in electrical connection of the semiconductor chips to the multilayered wirings, and a production method of producing the same can be provided.

This international patent application is based on Japanese Priority Applications No. 2005-360519 and No. 2006-117618, filed on Dec. 14, 2005 and Apr. 21, 2006, respectively, with the Japanese Patent Office, the entire contents of which are hereby incorporated by reference.

The invention claimed is:

1. An electronic part embedded substrate comprising:
a first substrate;
a second substrate provided on the first substrate;
an electronic part provided between the first substrate and the second substrate;
an electrically connecting member configured to electrically connect the first substrate to the second substrate, wherein the electrically connecting member is provided between the first substrate and the second substrate; and
a sealing member configured to completely fill a space between the first substrate and the second substrate to seal the electronic part and the electrically connecting member,
wherein the second substrate includes an outermost insulation layer that forms a front surface of the electronic part embedded substrate and an outer connection part embedded in the outermost insulation layer,
a front surface of the outer connection part is exposed from a front surface of the outermost insulation layer,
a side surface and a back surface of the outer connection part are covered by the outermost insulation layer,
a via hole is provided on the back surface of the outer connection part so as to expose the back surface of the outer connection part on the back surface of the outermost insulation layer,
a wiring portion is provided on the back surface of the outmost insulation layer so that the wiring portion is connected with the back surface of the outer connection part through the via hole, and
the wiring portion is connected with another wiring portion included in the first substrate through the electrically connecting member.

2. The electronic part embedded substrate according to claim 1,
wherein the electrically connecting member includes a conductive post.

3. The electronic part embedded substrate according to claim 2,
wherein the electrically connecting member further includes a solder.

4. The electronic part embedded substrate according to claim 1,
wherein the electrically connecting member includes a solder ball.

5. The electronic part embedded substrate according to claim 4,
wherein the electrically connecting member includes a solder ball, which houses a spacer.

6. The electronic part embedded substrate according to claim 1,
wherein the electrically connecting member includes a bump, which is formed of a bonding wire.

7. The electronic part embedded substrate according to claim 1,
wherein the sealing member is made of an anisotropic conductive material and the electrically connecting member is made of the same anisotropic conductive material.

8. The electronic part embedded substrate according to claim 1,
wherein another insulation layer and the wiring portion are laminated to form multiple layers on the back surface of the outermost insulation layer of the second substrate.

9. An electronic part embedded substrate comprising:
a first substrate;
a second substrate provided on the first substrate;
an electronic part provided between the first substrate and the second substrate;
an electrically connecting member configured to electrically connect the first substrate to the second substrate; and a sealing member configured to fill a space between the first substrate and the second substrate to seal the electronic part, wherein the second substrate includes an outermost insulation layer that forms a front surface of the electronic part embedded substrate and an outer connection part embedded in the outermost insulation layer, a front surface of the outer connection part is exposed from a front surface of the outermost insulation layer, a side surface and a back surface of the outer connection part are covered by the outermost insulation layer, a via hole is provided on the back surface of the outer connection part so as to expose the back surface of the outer connection part on the back surface of the outermost insulation layer, a wiring portion is provided on the back surface of the outmost insulation layer so that the wiring portion is connected with the back surface of the outer connection part through the via hole, and wherein the first substrate includes another outermost insulation layer that forms a back surface of the electronic part embedded substrate and another outer connection part embedded in the another outermost insulation layer, a back surface of the another outer connection part is exposed from a back surface of the another outermost insulation layer, a side surface and a front surface of the another outer connection part are covered by the another outermost insulation layer, another via hole is provided on the front surface of the another outer connection part so as to expose the front surface of the another outer connection part on the front surface of the another outermost insulation layer, another wiring portion is provided on the front surface of the another outmost insulation layer so that the another wiring portion is connected with the front surface of the another outer connection part through the another via hole, and the another wiring portion is connected with the wiring portion included in the second substrate through the electrically connecting member.

10. The electronic part embedded substrate according to claim 9, wherein another insulation layer and the another wiring portion are laminated to form multiple layers on the front surface of the another outermost insulation layer of the first substrate.

11. The electronic part embedded substrate according to claim 1, wherein the sealing member is formed of a molding resin.

12. The electronic part embedded substrate according to claim 9, wherein the electrically connecting member includes a conductive post.

13. The electronic part embedded substrate according to claim 12, wherein the electrically connecting member further includes a solder.

14. The electronic part embedded substrate according to claim 9, wherein the electrically connecting member includes a solder ball.

15. The electronic part embedded substrate according to claim 14, wherein the electrically connecting member includes a solder ball, which houses a spacer.

16. The electronic part embedded substrate according to claim 9, wherein the electrically connecting member includes a bump, which is formed of a bonding wire.

17. The electronic part embedded substrate according to claim 9, wherein the sealing member is made of an anisotropic conductive material and the electrically connecting member is made of the same anisotropic conductive material.

18. The electronic part embedded substrate according to claim 9, wherein another insulation layer and the wiring portion are laminated to form multiple layers on the back surface of the outermost insulation layer of the second substrate.

19. The electronic part embedded substrate according to claim 9, wherein the sealing member is formed of a molding resin.

* * * * *